(12) United States Patent
Saito et al.

(10) Patent No.: US 7,200,037 B2
(45) Date of Patent: Apr. 3, 2007

(54) SPIN-INJECTION FET

(75) Inventors: Yoshiaki Saito, Kawasaki (JP);
Hideyuki Sugiyama, Yokohama (JP);
Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/255,101

(22) Filed: Oct. 21, 2005

(65) Prior Publication Data
US 2006/0220161 A1    Oct. 5, 2006

(30) Foreign Application Priority Data
Mar. 31, 2005    (JP)    ............... 2005-101531

(51) Int. Cl.
*G11C 11/00* (2006.01)
(52) U.S. Cl. ..................... 365/158; 365/171
(58) Field of Classification Search ............... 365/158, 365/171
See application file for complete search history.

(56) References Cited

U.S. PATENT DOCUMENTS

| | | | |
|---|---|---|---|
| 6,538,921 B2 * | 3/2003 | Daughton et al. | ........ 365/171 |
| 6,611,405 B1 | 8/2003 | Inomata et al. | |
| 6,751,074 B2 | 6/2004 | Inomata et al. | |
| 6,987,653 B2 | 1/2006 | Inomata et al. | |
| 7,020,013 B2 * | 3/2006 | Johnson | ........ 365/158 |
| 2005/0057960 A1 | 3/2005 | Saito et al. | |
| 2005/0185347 A1 | 8/2005 | Inomata et al. | |

OTHER PUBLICATIONS

U.S. Appl. No. 11/255,101, filed Oct. 21, 2005, Saito et al.
U.S. Appl. No. 11/367,483, filed Mar. 6, 2006, Inomata et al.
Satoshi Sugahara, et al. "A Spin Metal-Oxide-Semiconductor Field-Effect Transistor Using Half-Metallic-Ferromagnet Contacts for the Source and Drain"; Applied Physics Letters; vol. 84; No. 13; Mar. 29, 2004; pp. 2307-2309.
U.S. Appl. No. 11/242,906, filed Oct. 5, 2005, Yoshiaki Saito, et al.
U.S. Appl. No. 11/149,267, filed Jun. 10, 2005, Yoshiaki Saito, et al.

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

An spin-injection FET includes a first ferromagnetic body whose magnetization direction is fixed, a second ferromagnetic body whose magnetization direction is changed by spin-injection current, a gate electrode which is formed on a channel between the first and second ferromagnetic bodies, a first driver/sinker which controls a direction of the spin-injection current to determine the magnetization direction of the second ferromagnetic body, the spin-injection current being passed through the channel, a wiring through which assist current is passed, the assist current generating a magnetic field in a magnetization easy axis direction of the second ferromagnetic body, and a second driver/sinker which controls the direction of the assist current passed through the conductive line.

22 Claims, 68 Drawing Sheets

⊗, ⊙ : Magnetization direction

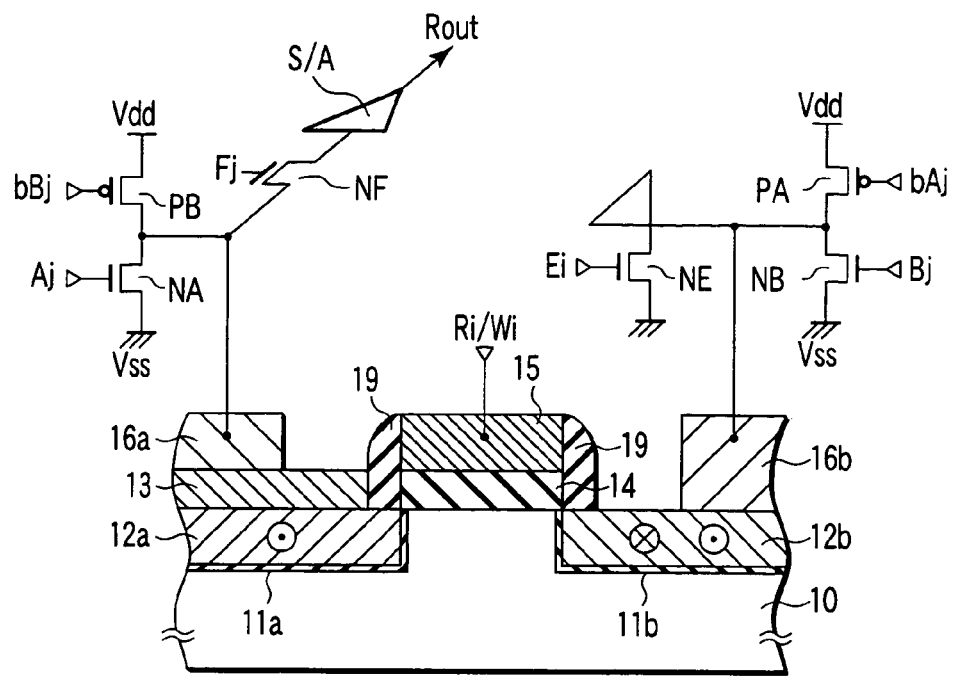
FIG. 14 ⊗,⊙:Magnetization direction
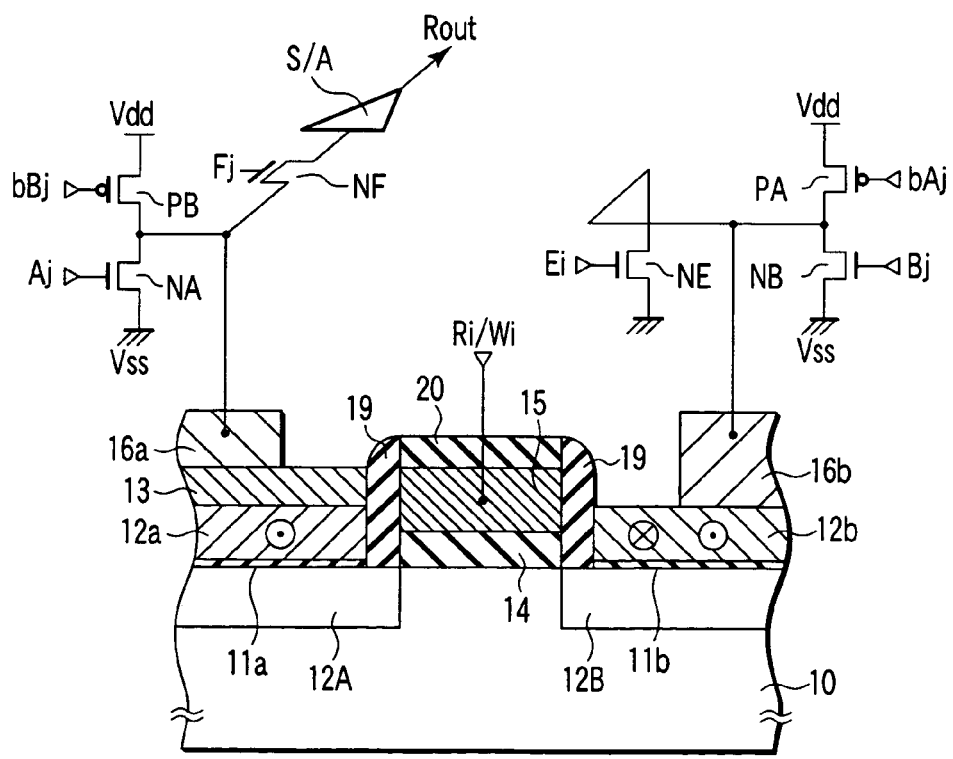
FIG. 16 ⊗,⊙:Magnetization direction

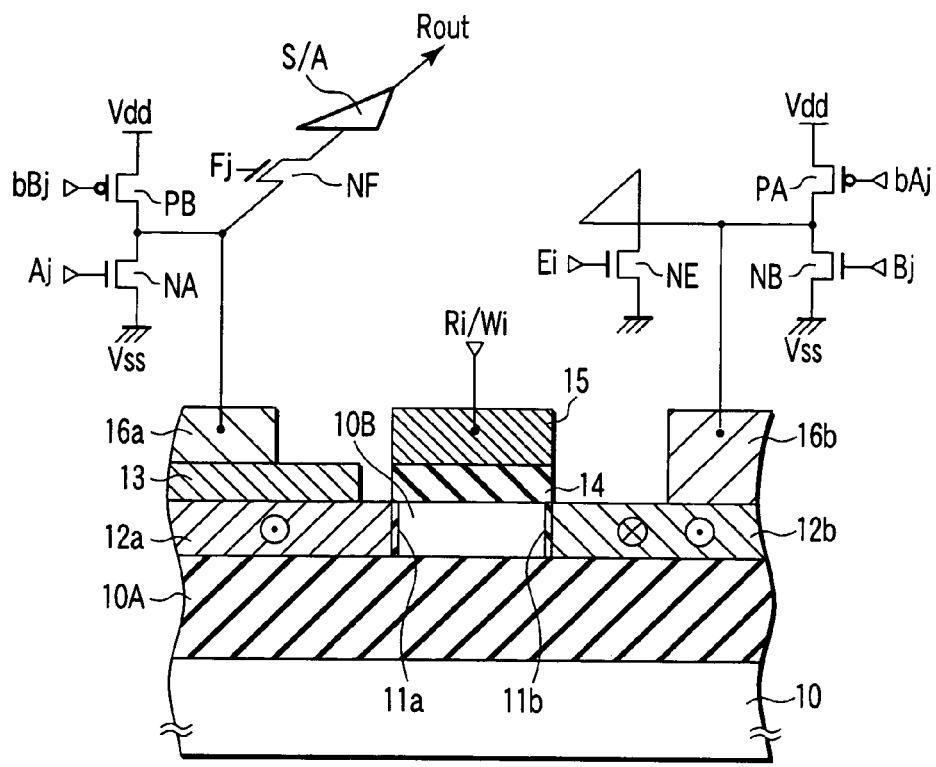
⊗, ⊙ : Magnetization direction
F I G. 18
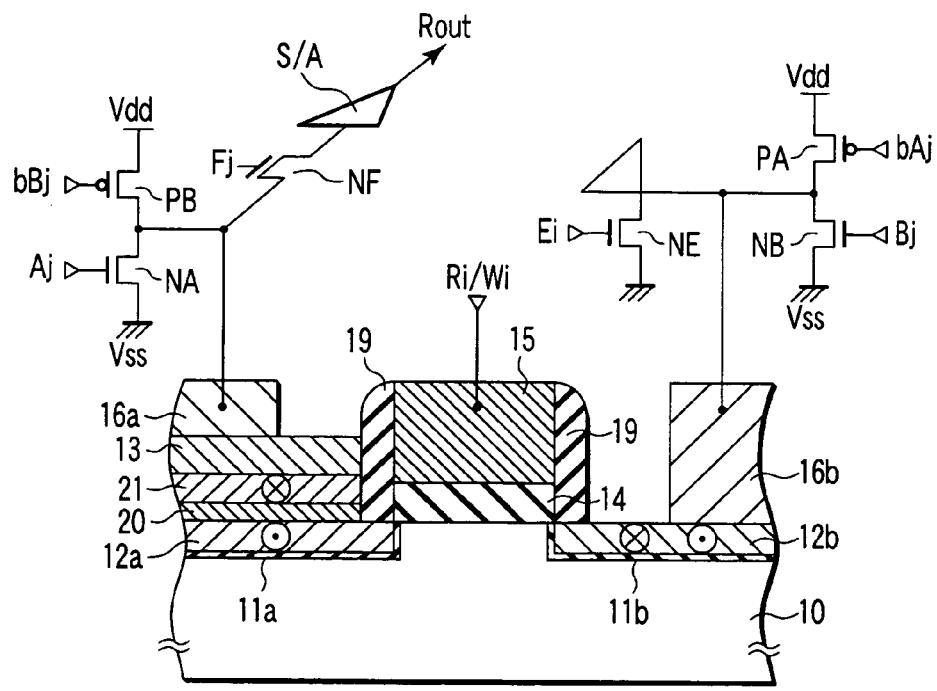
⊗, ⊙ : Magnetization direction
F I G. 20

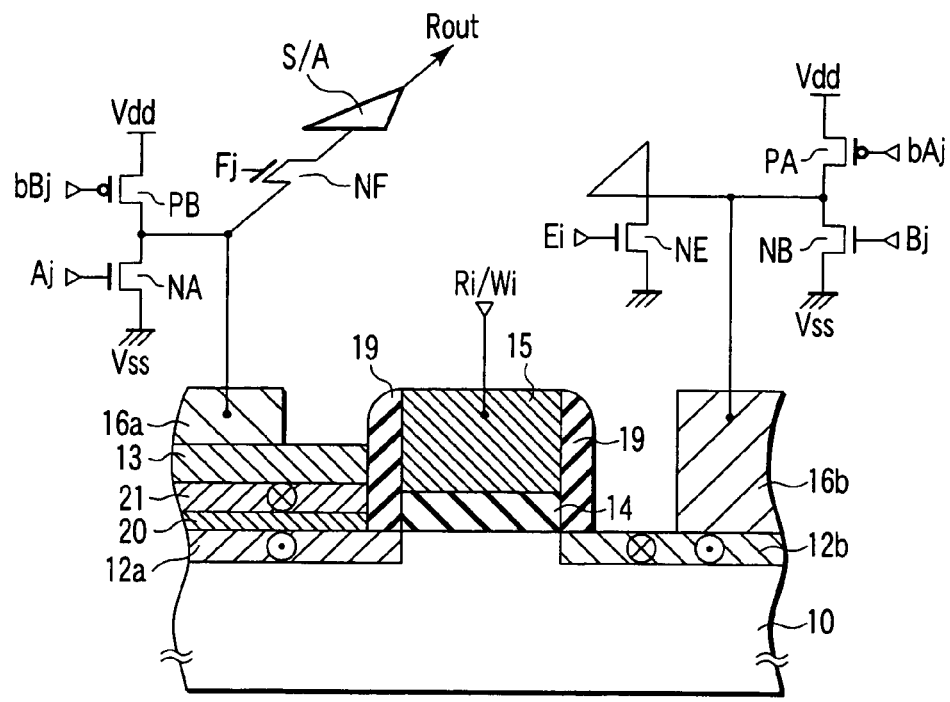
⊗, ⊙ : Magnetization direction
F I G. 22
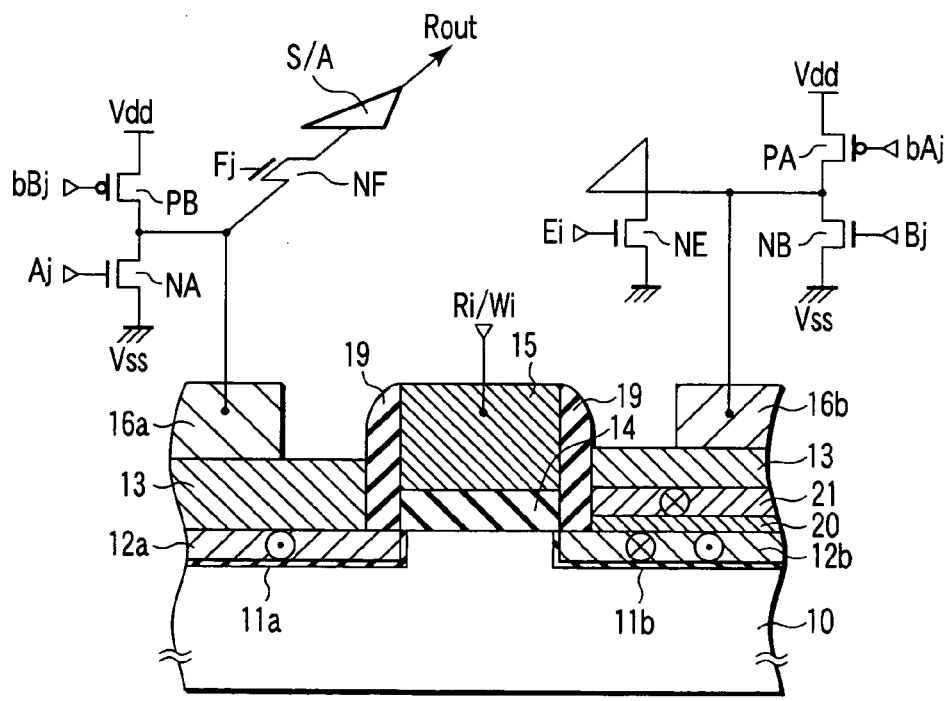
⊗, ⊙ : Magnetization direction
F I G. 24

⊗, ⊙ : Magnetization direction

⊗, ⊙ : Magnetization direction

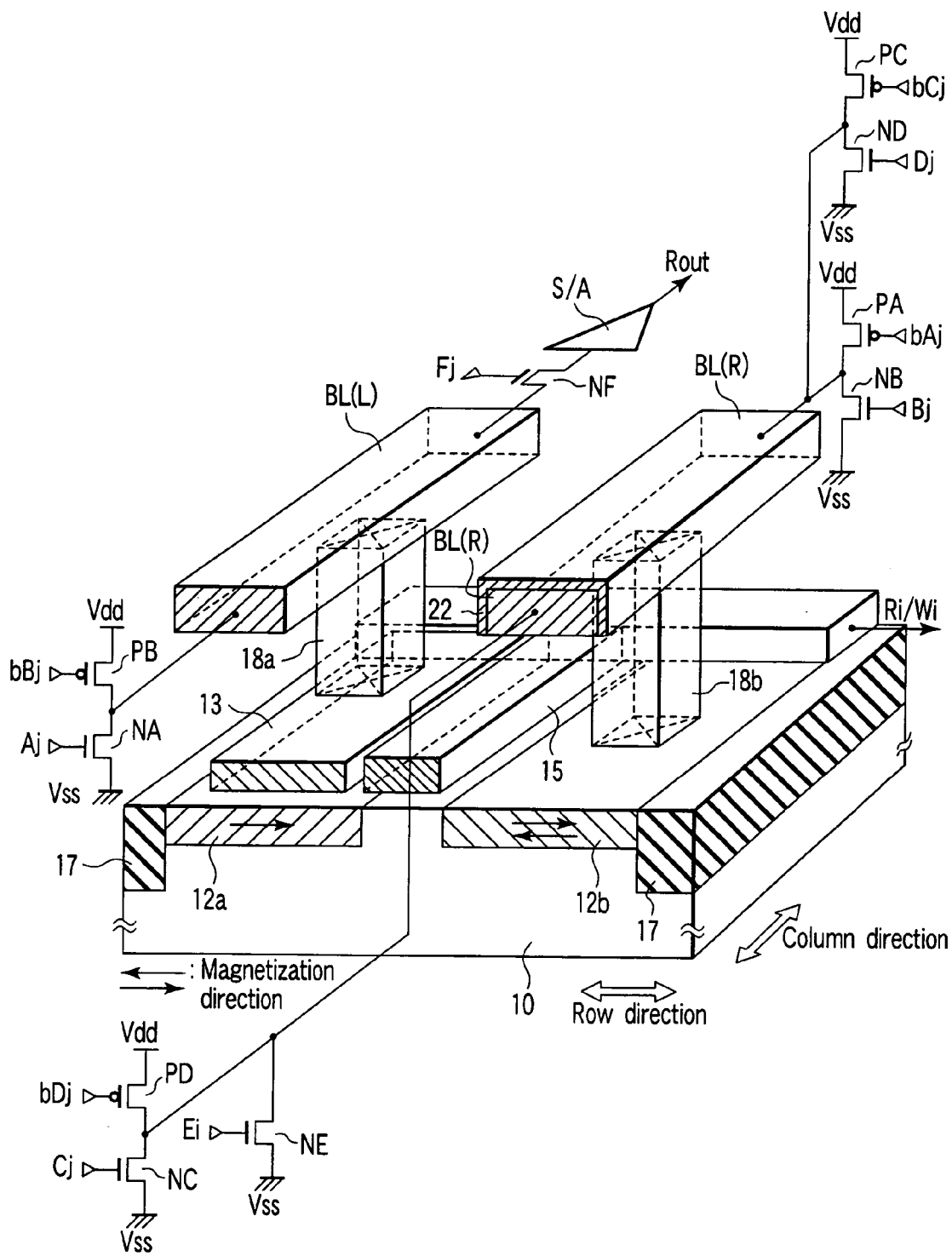
F I G. 37

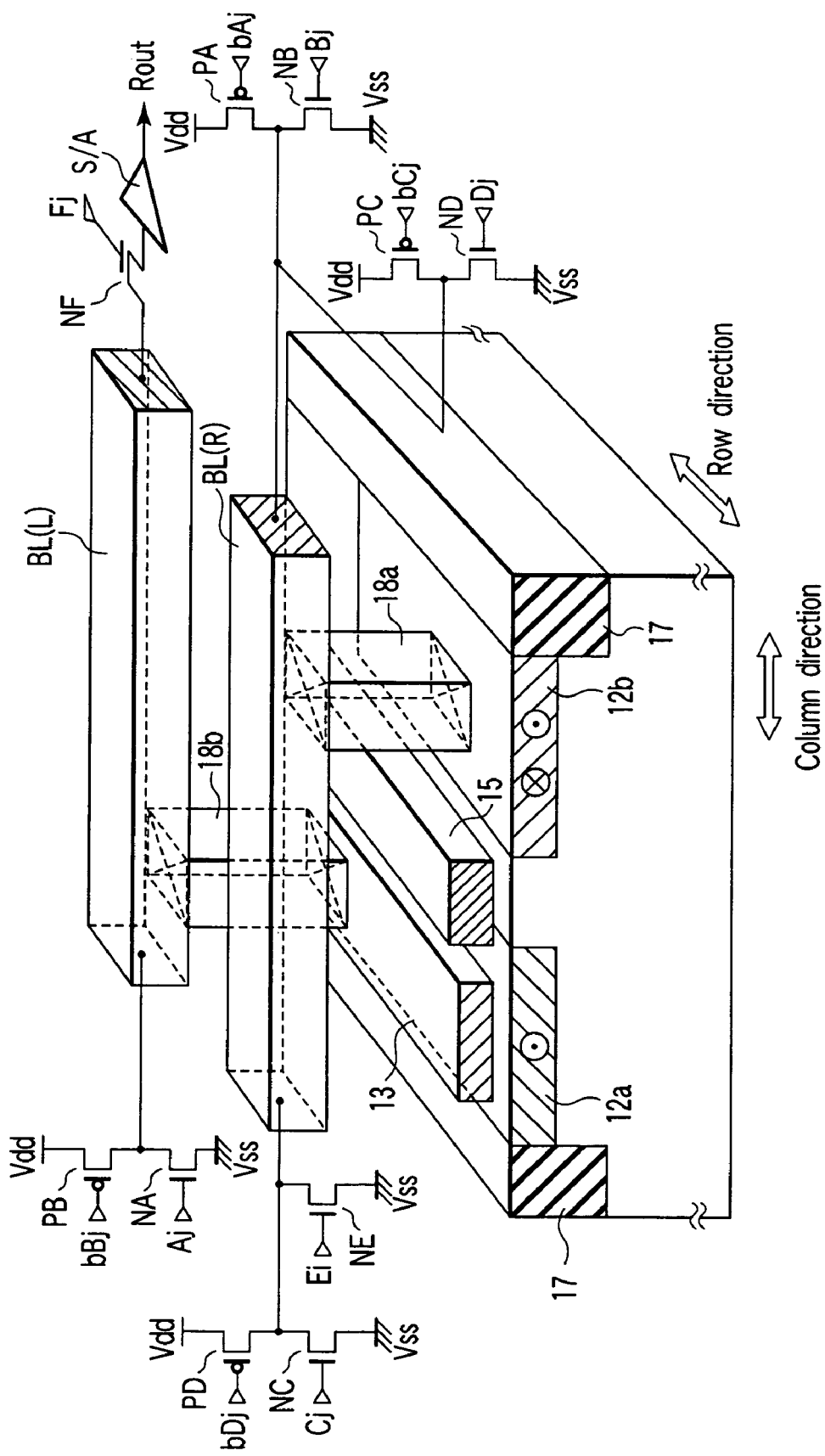
F I G. 39

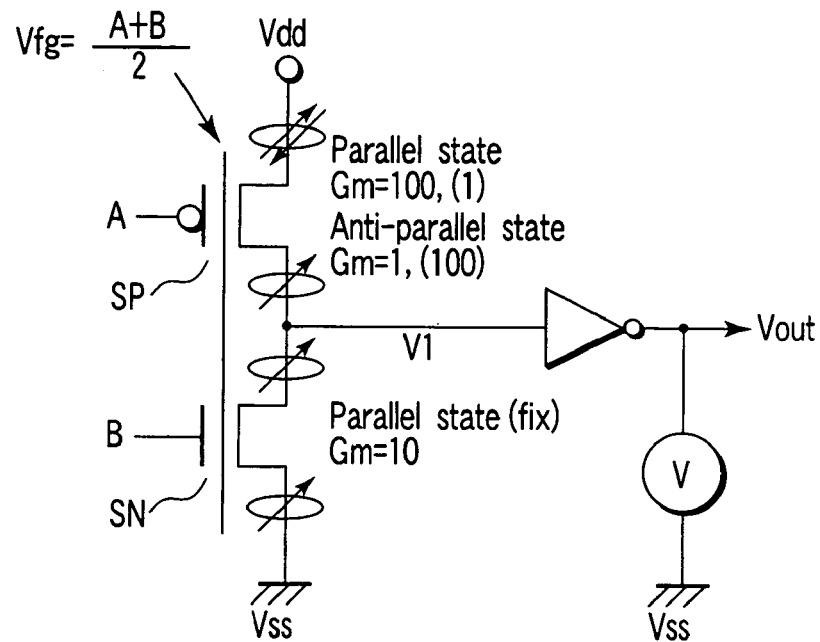
F I G. 67
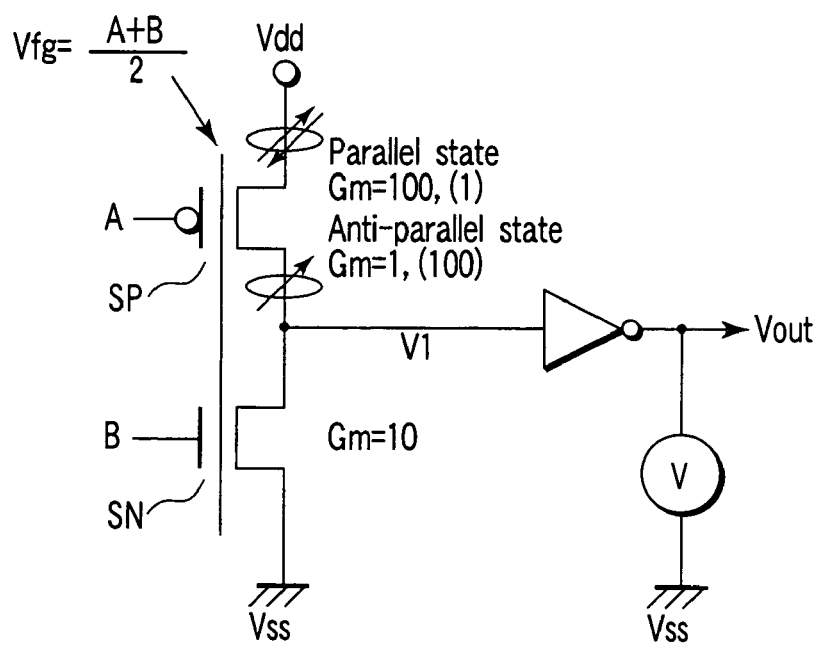
F I G. 68

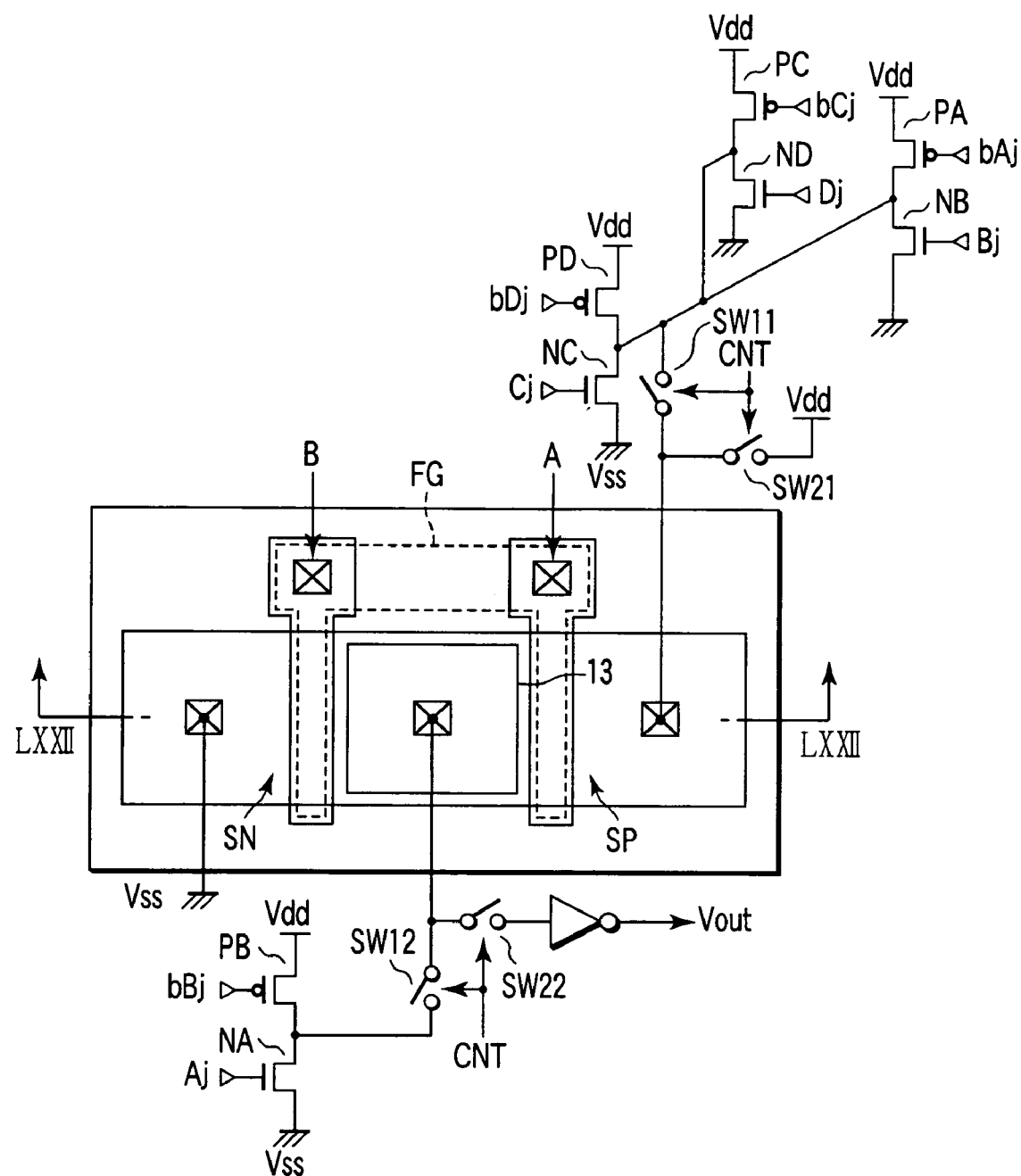
F I G. 71

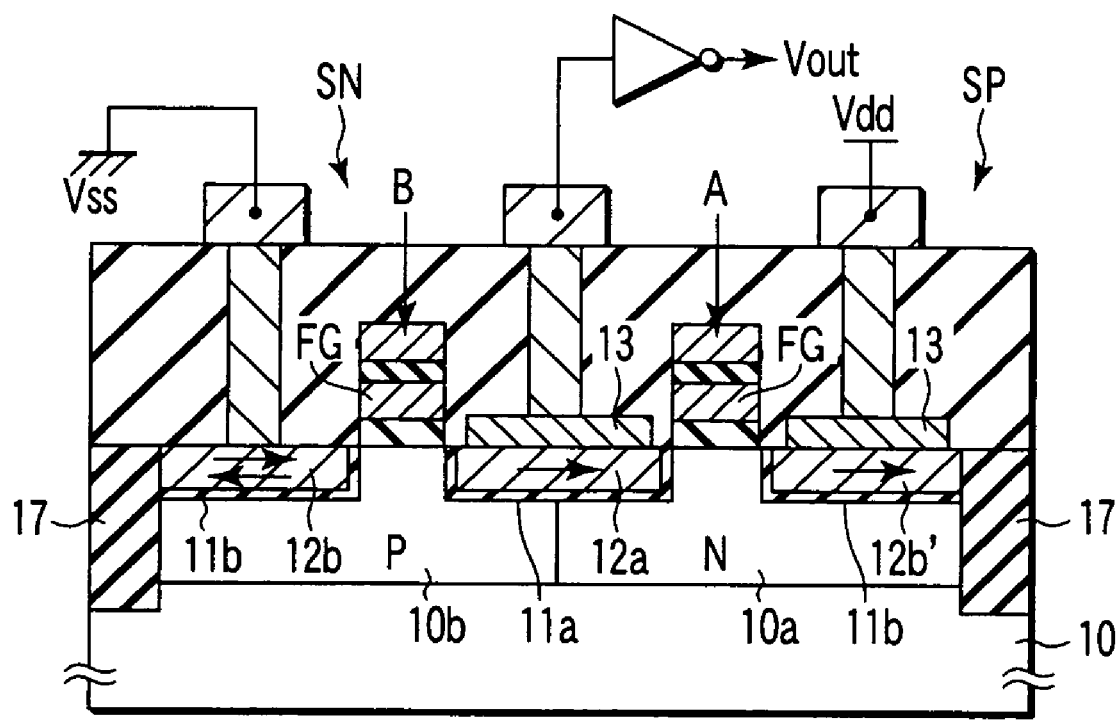
F I G. 78

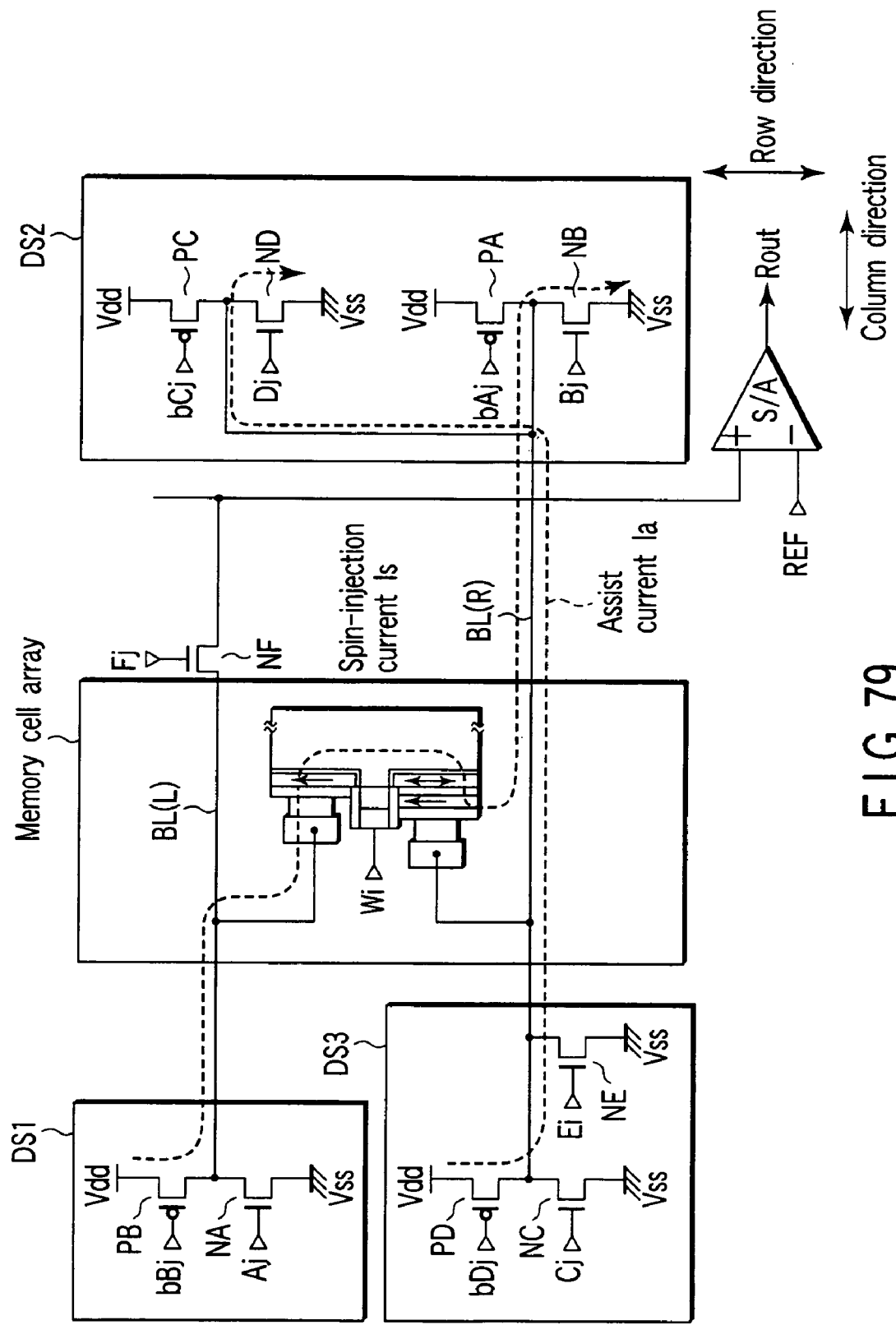
F I G. 79

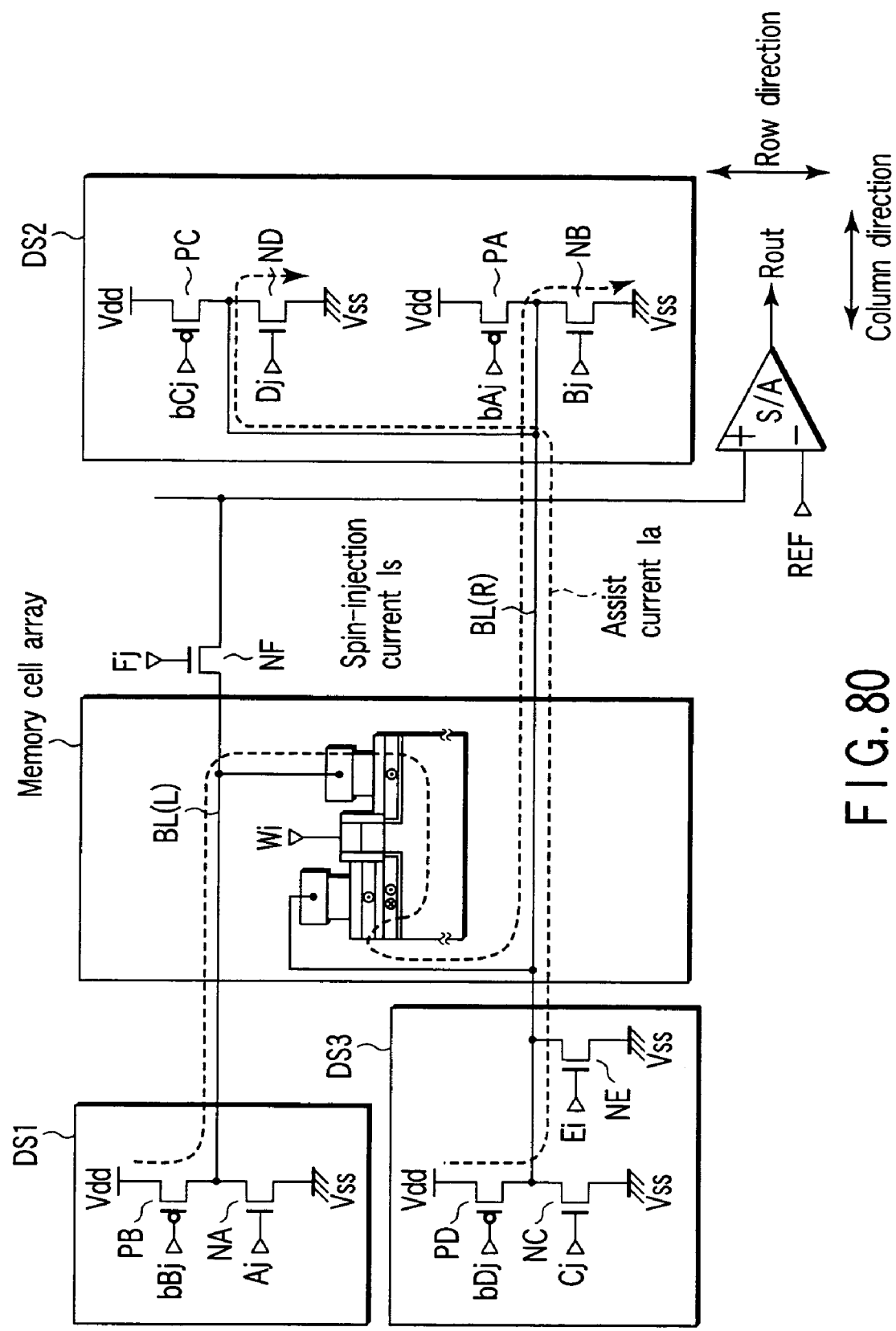
F I G. 80

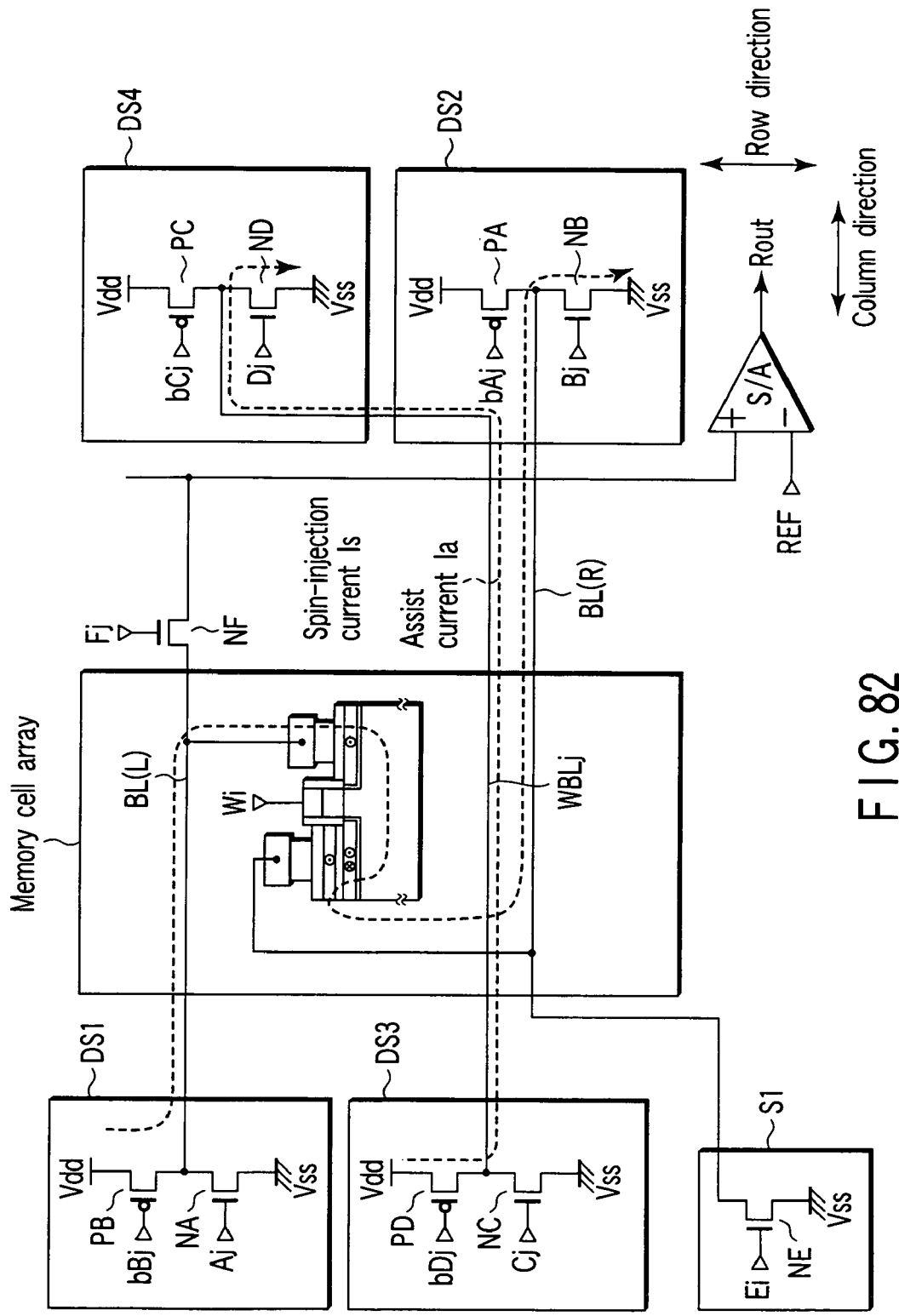
F I G. 82

DATA1 : Write data = "1" ⇒ "H"
Write data = "0" ⇒ "L"

DATA1 : Write data = "0" ⇒ "H"
Write data = "1" ⇒ "L"

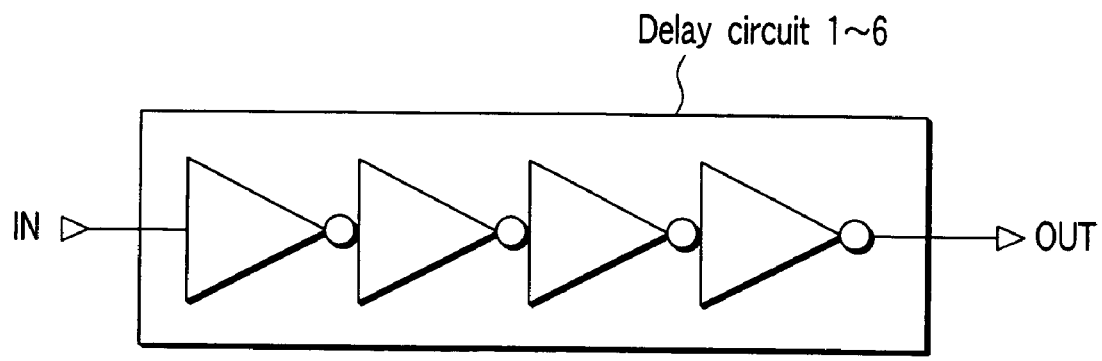
F I G. 101
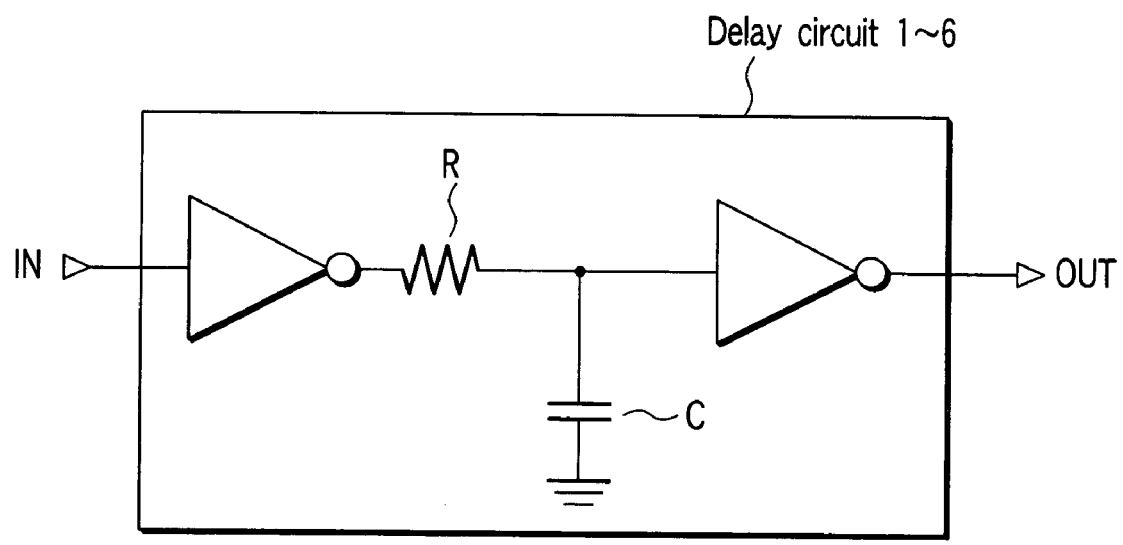
F I G. 102

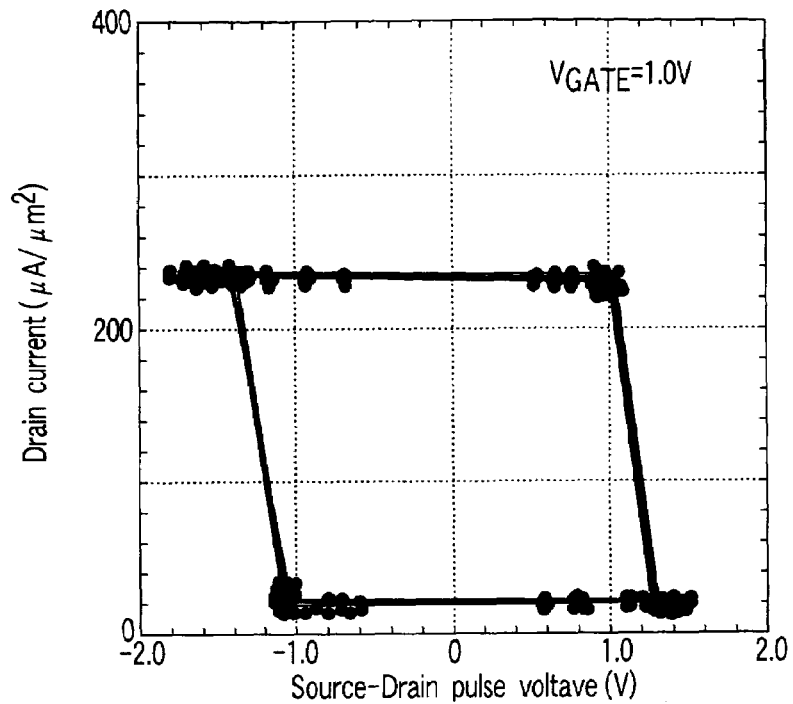
F I G. 103
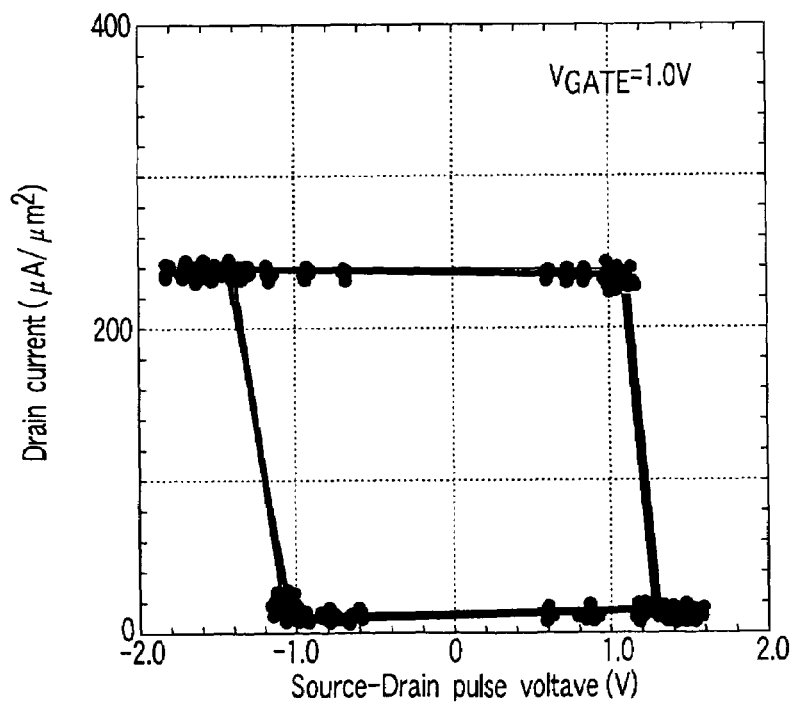
F I G. 104

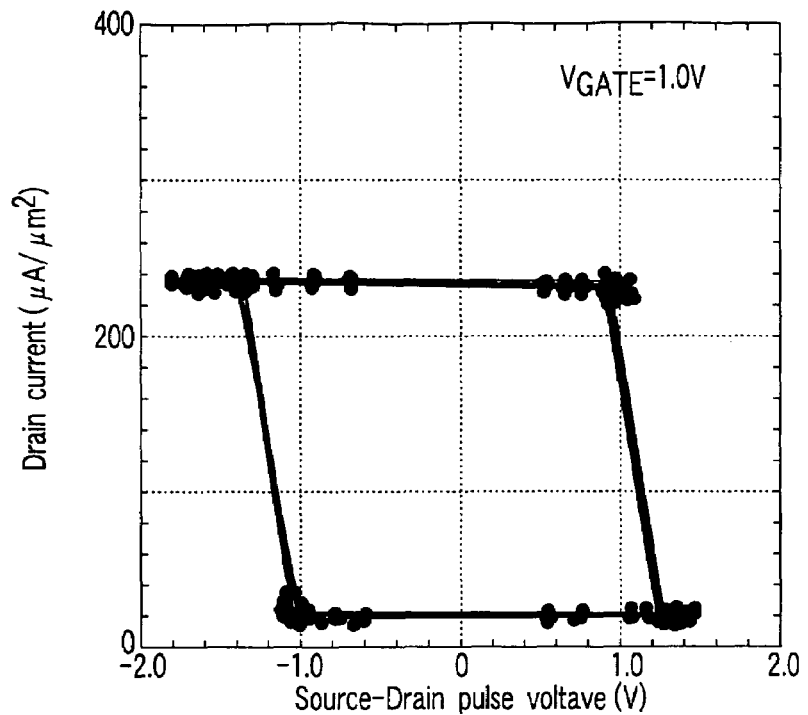
F I G. 105
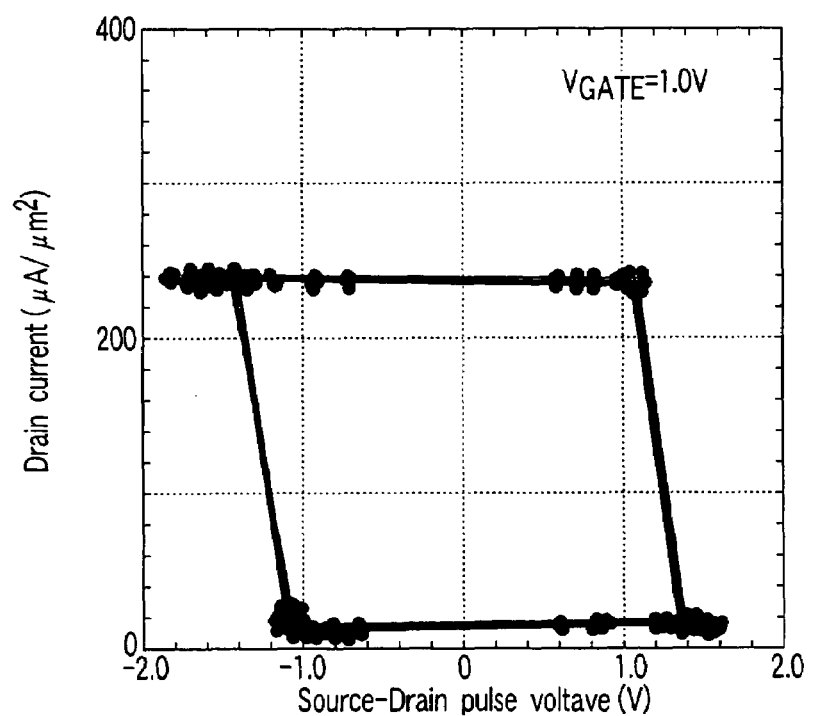
F I G. 106

SPIN-INJECTION FET

CROSS-REFERENCE TO RELATED APPLICATIONS

This application is based upon and claims the benefit of priority from prior Japanese Patent Application No. 2005-101531, filed Mar. 31, 2005, the entire contents of which are incorporated herein by reference.

BACKGROUND OF THE INVENTION

1. Field of the Invention

The present invention relates to a spin-injection FET (spin-injection transistor) in which a magnetoresistive effect is utilized.

2. Description of the Related Art

Recently, in addition to magnetic heads and magnetic sensors, a magnetoresistive element in which a magnetic film is utilized is used for advanced-technology devices such as a magnetic random access memory (MRAM), which is of a solid-state magnetic memory and a re-configurable logic circuit.

The spin-injection FET is one mode when the magnetoresistive element is applied to the advanced-technology devices. The spin-injection FET has the feature in that current passed through a channel is changed according to a magnetization state of the magnetoresistive element even if a gate voltage is constant. Further, magnetization reversal caused by spin-polarized electrons is utilized in the spin-injection FET.

For example, the spin-injection FET is used as a memory cell in which data is stored in the magnetic random access memory, and the spin-injection FET is used as an element for realizing one logic gate in the re-configurable logic circuit.

However, in the conventional spin-injection FET, a ferromagnetic body which is of a free layer is in direct contact with a semiconductor substrate and spin-injection current for the magnetization reversal is still as large as about 107 A/cm², which may result in problems such as generation of thermal disturbance caused by temperature rise in writing and element breakage by the spin-injection current.

BRIEF SUMMARY OF THE INVENTION

A spin-injection field effect transistor according to an aspect of the present invention comprises: a first ferromagnetic body whose magnetization direction is fixed; a second ferromagnetic body whose magnetization direction is changed by spin-injection current; a channel which is located between the first and second ferromagnetic bodies; a gate electrode which is formed on the channel through a gate insulating layer; a first driver/sinker which controls a direction of the spin-injection current to determine the magnetization direction of the second ferromagnetic body, the spin-injection current being passed through the channel and a second driver/sinker which controls a direction of the assist current being passed through the channel.

BRIEF DESCRIPTION OF THE SEVERAL VIEWS OF THE DRAWING

FIG. 14 is a view showing a spin-injection FET according to a second embodiment;

FIG. 16 is a view showing a spin-injection FET which is a basis of a third embodiment;

FIG. 18 is a view showing a spin-injection FET which is a basis of a fourth embodiment;

FIG. 20 is a view showing a spin-injection FET according to a fifth embodiment;

FIG. 22 is a view showing the spin-injection FET according to the fifth embodiment;

FIG. 24 is a view showing a spin-injection FET according to a sixth embodiment;

FIG. 37 is a view showing the spin-injection FET according to the ninth embodiment;

FIG. 39 is a view showing the spin-injection FET according to the tenth embodiment;

FIG. 67 is a view showing a first example of a re-configurable logic circuit;

FIG. 68 is a view showing the first example of the re-configurable logic circuit;

FIG. 71 is a view showing an example of a driver/sinker;

FIG. 78 is a view showing an example of the device structure;

FIG. 79 is a view showing a first example of a magnetic random access memory;

FIG. 80 is a view showing the first example of the magnetic random access memory;

FIG. 82 is a view showing the second example of the magnetic random access memory;

FIG. 101 is a view showing an example of the delay circuit;

FIG. 102 is a view showing an example of the delay circuit;

FIG. 103 is a view showing characteristics of a spin-injection FET according to an embodiment of the invention;

FIG. 104 is a view showing characteristics of a spin-injection FET according to an embodiment of the invention;

FIG. 105 is a view showing characteristics of a spin-injection FET according to an embodiment of the invention; and FIG. 106 is a view showing characteristics of a spin-injection FET according to an embodiment of the invention.

DETAILED DESCRIPTION OF THE INVENTION

A spin-injection FET (field effect transistor) of an aspect of the present invention will be described below in detail with reference to the accompanying drawing.

1. Structure

First, a structure of a spin-injection FET according to an embodiment of the invention will be described.

For the spin-injection FET, some structures are already proposed. For example, there is known the spin-injection FET in which two source/drain electrodes are formed by ferromagnetic bodies.

In the example, the ferromagnetic body constituting one of the source/drain electrodes becomes a pinned layer in which a magnetization direction is fixed, and the ferromagnetic body constituting the other source/drain electrode becomes a free layer in which the magnetization direction is changed. However, a spin-injection current path used for magnetization reversal in the free layer is not defined.

In the following descriptions, the structure of the spin-injection FET including the spin-injection current path will be described.

(1) Overall

Figure 1:
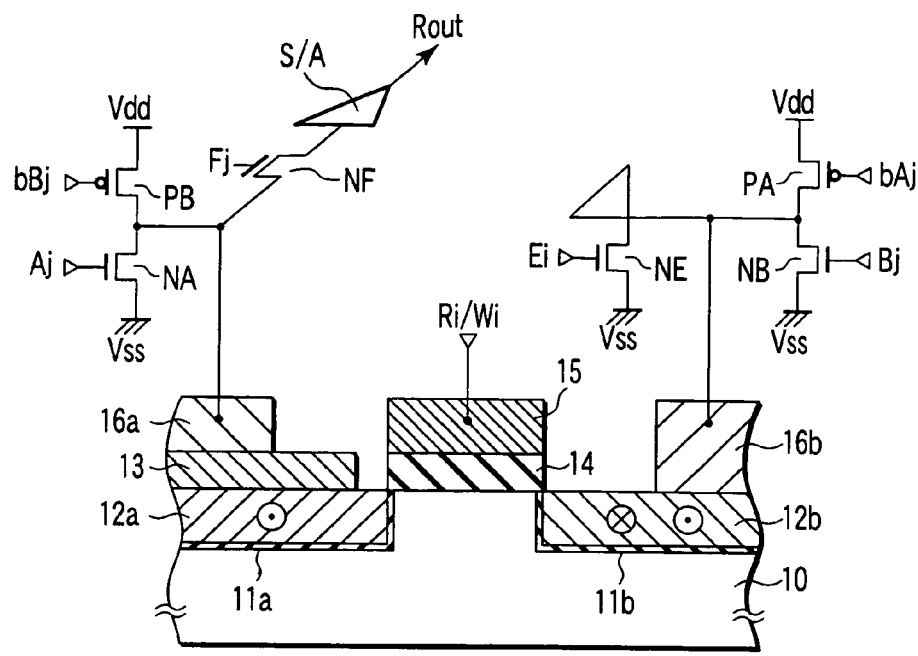
FIG. 1 is a view showing a spin-injection FET which is a basis of an embodiment of the invention.

FIG. 1 shows the structure of a spin-injection FET according to an embodiment of the invention.

The spin-injection FET includes ferromagnetic bodies $12a$ and $12b$, tunnel barrier layers $11a$ and $11b$, a gate electrode 15, and an anti-ferromagnetic body (pinned layer) 13. The ferromagnetic bodies $12a$ and $12b$ are of the source/drain electrodes embedded in recesses in a semiconductor substrate 10. The tunnel barrier layers $11a$ and $11b$ are located between the semiconductor substrate 10 and the ferromagnetic bodies $12a$ and $12b$ respectively. The gate electrode 15 is arranged on a channel between the ferromagnetic bodies $12a$ and $12b$ through a gate insulating layer 14. The anti-ferromagnetic body (pinned layer) 13 is located on the ferromagnetic body $12a$.

The ferromagnetic bodies $12a$ and $12b$ have the magnetization easy axis directions perpendicular to the paper plane.

The ferromagnetic body $12a$ becomes the pinned layer whose magnetization direction is fixed by the anti-ferromagnetic body 13. An electrode $16a$ is arranged on the anti-ferromagnetic body 13. The electrode $16a$ is connected to a sense amplifier S/A through an N-channel MIS transistor NF which is of a column selection switch for selecting a jth column.

The electrode $16a$ is also connected to a P-channel MIS transistor PB and an N-channel MIS transistor NA which are of the driver/sinker for controlling generation/cutoff of spin-injection current.

The ferromagnetic body $12b$ becomes the free layer whose magnetization direction is changed by the spin-injection current. An electrode $16b$ is arranged on the ferromagnetic body $12b$. The electrode $16b$ is connected to a P-channel MIS transistor PA and an N-channel MIS transistor NB which are of the driver/sinker for controlling the generation/cutoff of the spin-injection current.

The electrode $16b$ is also connected to a ground point Vss through an N-channel MIS transistor NE.

A control signal Ri/Wi for selecting an ith row is supplied to the gate electrode 15 in readout/writing.

The first feature of the spin-injection FET according to the embodiment of the invention is in that the tunnel barrier layers $11a$ and $11b$ are formed between the semiconductor substrate 10 and the ferromagnetic bodies $12a$ and $12b$ respectively.

In the case of the spin-injection FET in which Schottky barriers are formed instead of the tunnel barrier layers while the tunnel barrier layers $11a$ and $11b$ do not exist between the semiconductor substrate 10 and the ferromagnetic bodies $12a$ and $12b$ respectively, it is necessary that an intrinsic semiconductor is used as the semiconductor substrate 10.

In the spin-injection FET according to the embodiment of the invention, since the tunnel barrier layers $11a$ and $11b$ are formed between the semiconductor substrate 10 and the ferromagnetic bodies $12a$ and $12b$ respectively, the semiconductor substrate 10 is not limited to the intrinsic semiconductor.

However, in the embodiment of the invention, one of or both the tunnel barrier layers $11a$ and $11b$ can be neglected.

The invention has the second feature in that the spin-injection current which reverses a magnetization state of the ferromagnetic body $12b$ is passed through a channel of the spin-injection FET.

In this case, the spin-injection current is passed through the spin-injection FET in the writing and readout current is passed through the spin-injection FET in the readout. Both the spin-injection current and the readout current are set at values not more than 1 mA, and the value of the spin-injection current is larger than that of the readout current.

Therefore, in the spin-injection FET according to the embodiment of the invention, a thickness of the gate insulating layer 14 and the value of the control signal Wi/Ri given to the gate electrode 15 are controlled in order to correspond to both the spin-injection current and the readout current.

(2) Material, Dimensions, and the Like

Examples of materials used for the spin-injection FET of FIG. 1 will be described.

The spin-injection FET has the tunnel barrier layers $11a$ and $11b$ between the semiconductor substrate 10 and the ferromagnetic bodies $12a$ and $12b$ respectively. Therefore, semiconductor substrate 10 can be selected from the intrinsic semiconductor such as Si and Ge, a compound semiconductor such as GaAs and ZnSe, and a highly conductive semiconductor in which an impurity is doped in the intrinsic semiconductor or the compound semiconductor.

There is no limitation for the material of the ferromagnetic bodies $12a$ and $12b$. For example the ferromagnetic bodies $12a$ and $12b$ can be formed by the following materials:

i. NiFe alloy, CoFe alloy, and CoFeNi alloy, ii. (Co,Fe,Ni)—(Si,B) alloy and (Co,Fe,Ni)—(Si,B)—(P, Al,Mo,Nb,Mn) alloy, iii. Amorphous materials such as Co—(Zr,Hf,Nb,Ta,Ti), iv. Heusler alloy (half metal) such as $Co_2(Cr_xFe_{1-x})Al$, $Co_2MnAl$, and $Co_2MnSi$, and v. dilute magnetic semiconductor such as SiMn and GeMn.

The ferromagnetic body (pinned layer) $12a$ may be formed by either a single layer or multi layers. The thickness of the ferromagnetic body $12a$ is set in the range of 0.1 nm to 100 nm. In order not to change the ferromagnetic body $12a$ to a superparamagnetic body, it is preferable that the thickness of the ferromagnetic body $12a$ is not lower than 0.4 nm.

The ferromagnetic body 12a is caused to have magnetic anisotropy in one direction by induced magnetic anisotropy or geometric magnetic anisotropy. In the embodiment of FIG. 1, the ferromagnetic body 12a has the magnetic anisotropy in the direction perpendicular to the paper plane.

The anti-ferromagnetic body (pinned layer) 13 fixes the magnetization direction of the ferromagnetic body 12a. In the embodiment of FIG. 1, the magnetization direction of the ferromagnetic body 12a is fixed in the direction from the backside to the surfaceside of the paper plane. The materials such as FeMn, PtMn, PtCrMn, NiMn, IrMn, NiO, and $Fe_2O_3$ can be used as the anti-ferromagnetic body 13. The ferromagnetic body (pinned layer) 12a may be formed by either a single layer or multi layers.

The ferromagnetic body (free layer) 12b may be formed by either the single layer or the multi layers. The thickness of the ferromagnetic body 12b is equal or substantially equal to the thickness of the ferromagnetic body 12a, and the thickness of the ferromagnetic body 12b is set in the range of 0.1 nm to 100 nm. In order not to change the ferromagnetic body 12b to a superparamagnetic body, it is preferable that the thickness of the ferromagnetic body 12b is not lower than 0.4 nm.

The ferromagnetic body 12b may be formed in a two-layer structure of soft magnetic layer/ferromagnetic layer or a three-layer structure of ferromagnetic layer/soft magnetic layer/ferromagnetic layer.

The ferromagnetic body 12b is also caused to have the magnetic anisotropy in one direction by the induced magnetic anisotropy or the geometric magnetic anisotropy. In the embodiment of FIG. 1, the ferromagnetic body 12b has the magnetic anisotropy in the direction perpendicular to the paper plane.

The spin-injection current can change the magnetization direction of the ferromagnetic body 12b. In the embodiment of FIG. 1, the magnetization direction of the ferromagnetic body 12b after writing is set in the direction from the backside to the surface of the paper plane.

In the case where the magnetization direction of the ferromagnetic body 12b after writing is set in the direction from the backside to the surface of the paper plane, the magnetization direction of the ferromagnetic body 12b is similar to the magnetization direction of the ferromagnetic body 12a. This state is referred to as so-called parallel state.

In the case where the magnetization direction of the ferromagnetic body 12b after writing is set in the direction from the surface to the backside of the paper plane, the magnetization direction of the ferromagnetic body 12b is directed to the reverse direction of the magnetization direction of the ferromagnetic body 12a. This state is referred to as anti-parallel state.

Non-magnetic elements such as Ag, Cu, Au, Al, Mg, Si, Bi, Ta, B, C, O, N, Pd, Pt, Zr, Ir, W, Mo, Ru, Re, Os, Nb, and B may be added to the ferromagnetic bodies 12a and 12b. These non-magnetic elements adjust various physical properties of the ferromagnetic bodies 12a and 12b such as magnetic properties, crystallinity, mechanical properties, and chemical properties.

The tunnel barrier layers 11a and 11b is formed by, e.g., oxide or nitride of elements such as Si, Ge, Al, Ga, Mg, Ti, and Ta. The gate insulating layer 14 is formed by insulating materials $SiO_2$ and SiN.

The gate electrode 14 and the electrodes 16a and 16b are formed by conductive polysilicon containing the impurity or metal materials such as Al and Cu.

(3) Action

The action of the spin-injection FET of FIG. 1 will be described.

i. Writing

In writing, control signals Ei and Fj are set at "L" and the N-channel MIS transistors NE and NF are turned off.

Figure 2:
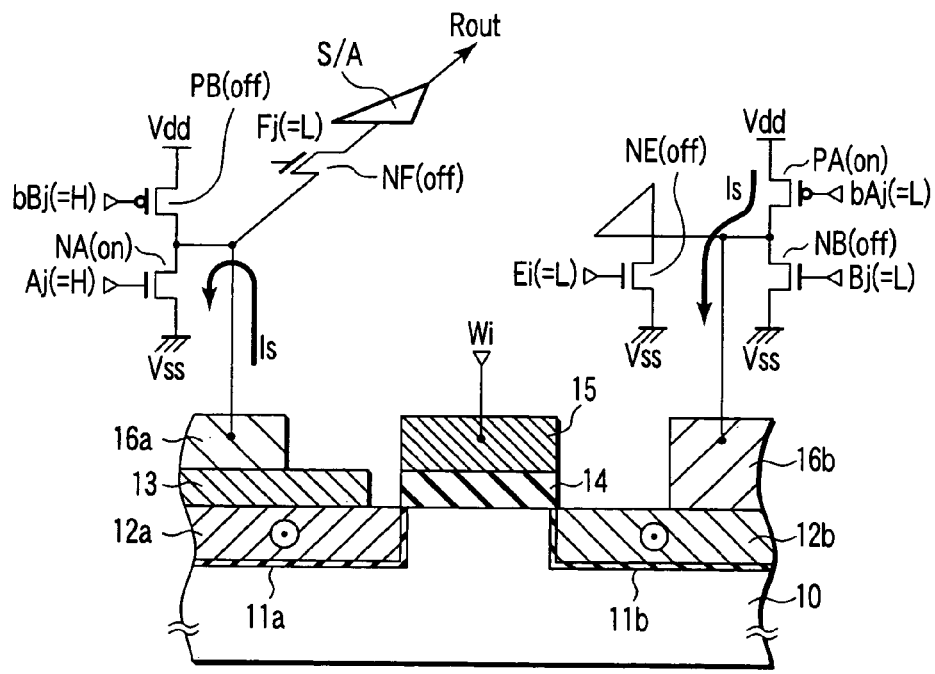
FIG. 2 is a view showing a flow of a spin-injection current.

First, in order to set the magnetization states of the ferromagnetic bodies 12a and 12b in parallel, as shown in FIG. 2, control signals Aj and bBj are set at "H" and control signals bAj and Bj are set at "L". When the semiconductor substrate 10 is a P-type semiconductor, the control signal Wi is set at "H" to form an N channel in surface of the semiconductor substrate 10 between the ferromagnetic bodies 12a and 12b. When the semiconductor substrate 10 is an N-type semiconductor, the control signal Wi is set at "L" to form a P channel in the surface of the semiconductor substrate 10 between the ferromagnetic bodies 12a and 12b.

At this point, the P-channel MIS transistor PA and the N-channel MIS transistor NA are turned on, and spin-injection current Is is passed through the spin-injection FET from the ferromagnetic body 12b toward the ferromagnetic body 12a.

The spin-polarized electron which is directed to the same direction as the magnetization direction of the ferromagnetic body 12a enters the ferromagnetic body 12b through the channel of the spin-injection FET, and the spin-polarized electron imparts spin torque to the ferromagnetic body 12b.

As a result, the magnetization direction of the ferromagnetic body 12b is directed to the same direction (parallel) as the magnetization direction of the ferromagnetic body 12a.

Figure 4:
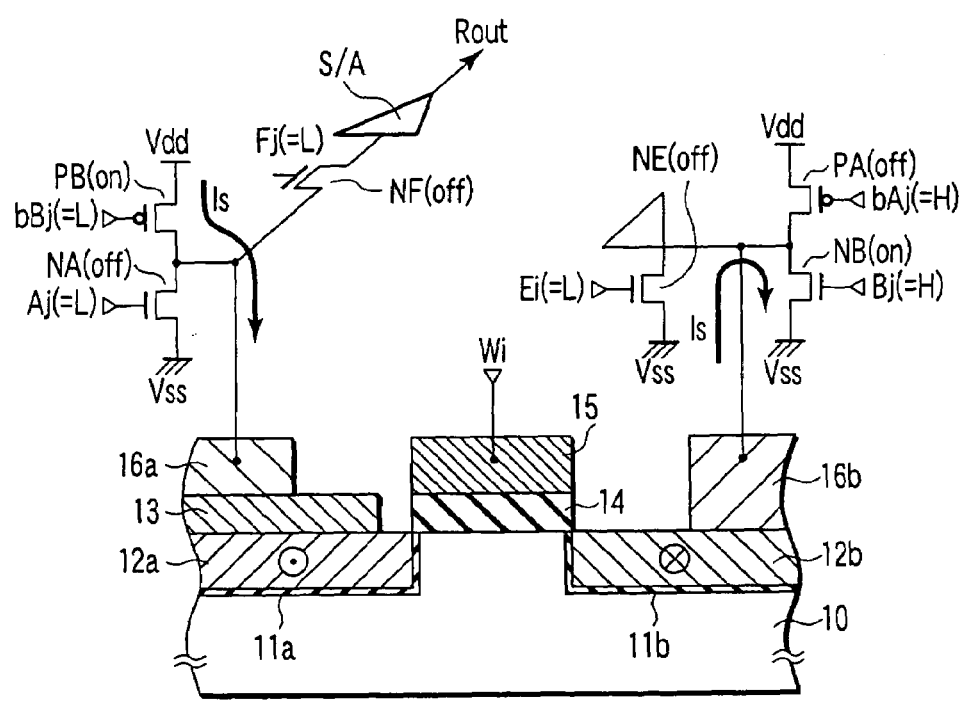
FIG. 4 is a view showing the flow of the spin-injection current.

Then, in order to set the magnetization states of the ferromagnetic bodies 12a and 12b in anti-parallel, as shown in FIG. 4, the control signals Bj and bAj are set at "H" and the control signals bBj and Aj are set at "L". When the semiconductor substrate 10 is the P-type semiconductor, the control signal Wi is set at "H" to form the N channel in surface of the semiconductor substrate 10 between the ferromagnetic bodies 12a and 12b. When the semiconductor substrate 10 is the N-type semiconductor, the control signal Wi is set at "L" to form the P channel in the surface of the semiconductor substrate 10 between the ferromagnetic bodies 12a and 12b.

At this point, the P-channel MIS transistor PB and the N-channel MIS transistor NB are turned on, and the spin-injection current Is is passed through the spin-injection FET from the ferromagnetic body 12a toward the ferromagnetic body 12b.

The spin-polarized electron which is directed to the reverse direction of the magnetization direction of the ferromagnetic body 12a is reflected at the ferromagnetic body 12a to enter the ferromagnetic body 12b, and the spin-polarized electron imparts the spin torque to the ferromagnetic body 12b.

As a result, the magnetization direction of the ferromagnetic body 12b is directed to the reverse direction (anti-parallel) of the magnetization direction of the ferromagnetic body 12a.

ii. Readout

Figure 6:
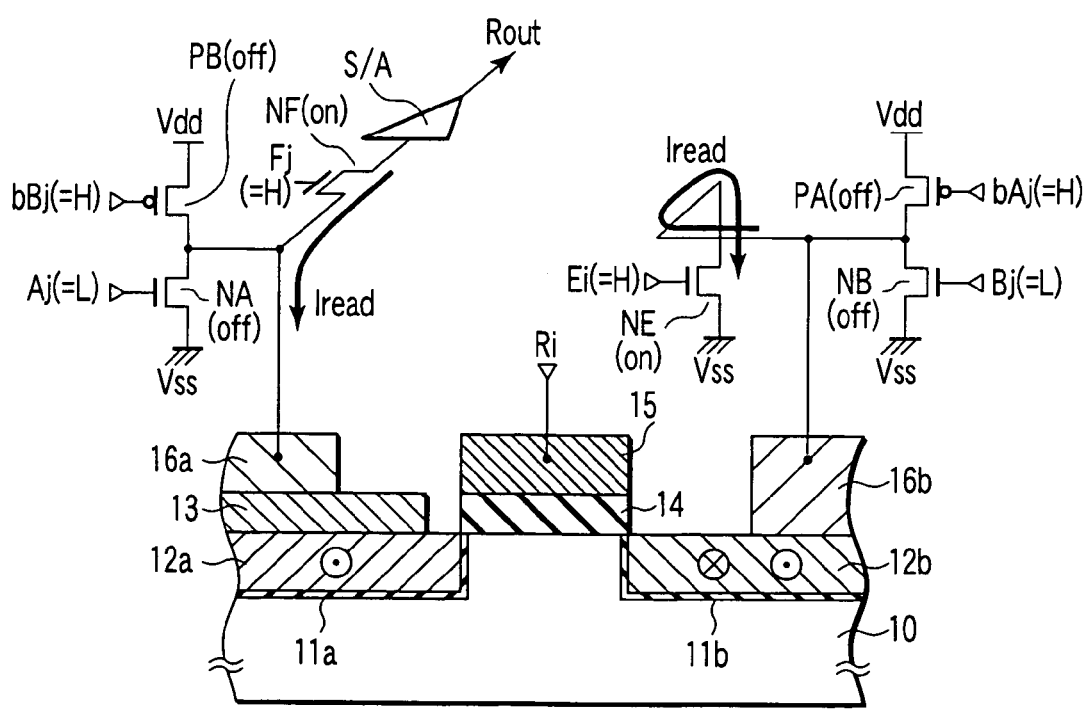
FIG. 6 is a view showing the flow of readout current.

In the readout, as shown in FIG. 6, the control signals bAj and bBj are set at "H", the control signals Aj and Bj are set at "L", and the P-channel MIS transistors PA and PB and the N-channel MIS transistors NA and NB are turned off.

The control signals Ei and Fj are set at "H" and the N-channel MIS transistors NE and NF are turned on.

When the semiconductor substrate 10 is the P-type semiconductor, the control signal Ri is set at "H" to form the N channel in surface of the semiconductor substrate 10 between the ferromagnetic bodies 12a and 12b. When the semiconductor substrate 10 is the N-type semiconductor, the control signal Ri is set at "L" to form the P channel on the surface of the semiconductor substrate 10 between the ferromagnetic bodies 12a and 12b.

At this point, readout current Iread is passed from the sense amplifier S/A toward the ground point Vss via the spin-injection FET.

Figure 3:
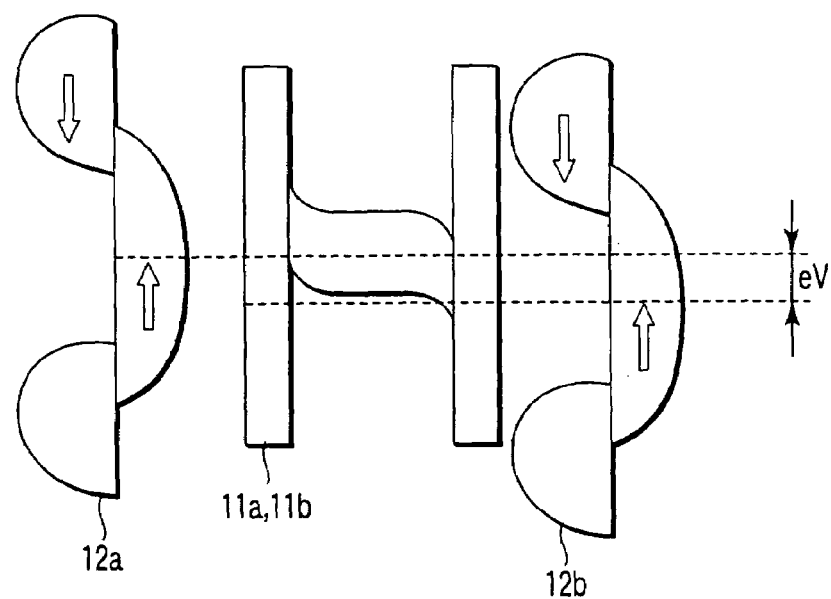
FIG. 3 is a view showing an energy band in writing.

Here, when the ferromagnetic bodies 12a and 12b constituting the spin-injection FET are in a parallel state, as can be seen the energy band of FIG. 3, electron transition is easy to occur from the ferromagnetic body 12b to the ferromagnetic body 12a, so that conductance of the spin-injection FET is increased.

Specifically, when the voltage is applied between the electrodes 16a and 16b, the electrons in the ferromagnetic body 12b are excited to the conduction band, and the electrons pass through energy barriers of the tunnel barrier layers 11a and 11b to be moved to the conduction band of the ferromagnetic body 12a.

At this point, the energy band of the upwardly spin-polarized electrons, i.e. up-spin electrons of the ferromagnetic body 12a coincides substantially with the energy band of the up-spin electrons of the ferromagnetic body 12b, and the energy band of the downwardly spin-polarized electrons, i.e. down-spin electrons of ferromagnetic body 12a coincides substantially with the energy band of the down-spin electrons of the ferromagnetic body 12b.

As a result, both the up-spin electrons and the down-spin electrons are easily moved from the ferromagnetic body 12b to the ferromagnetic body 12a.

Figure 5:
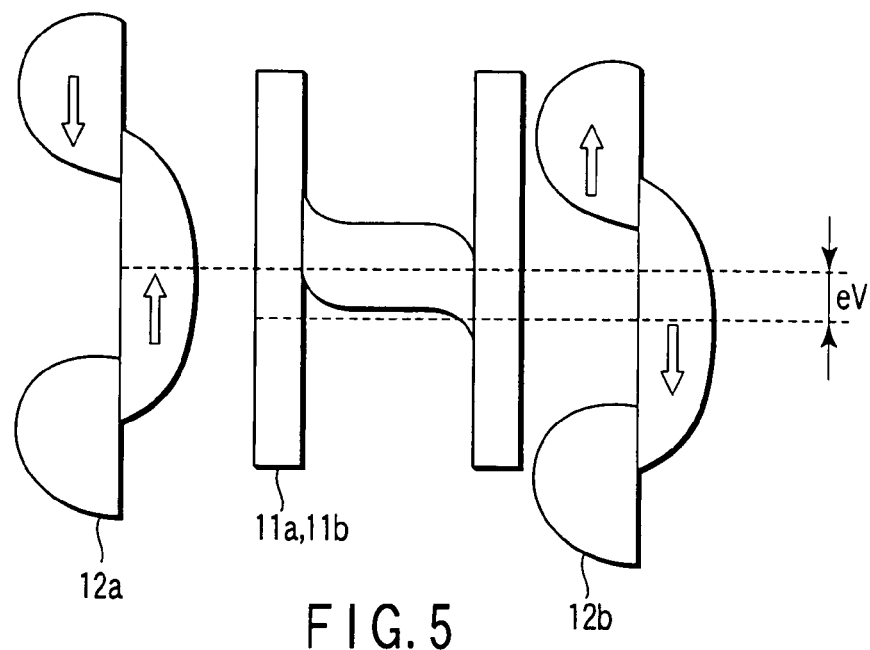
FIG. 5 is a view showing the energy band in writing.

On the other hand, when the ferromagnetic bodies 12a and 12b constituting the spin-injection FET are in the anti-parallel state, as can be seen the energy band of FIG. 5, the electron transition from the ferromagnetic body 12b to the ferromagnetic body 12a becomes difficult, so that the conductance of the spin-injection FET is decreased.

Specifically, when the voltage is applied between the electrodes 16a and 16b, the electrons in the ferromagnetic body 12b are excited to the conduction band, and the electrons pass through the energy barriers of the tunnel barrier layers 11a and 11b to be moved to the conduction band of the ferromagnetic body 12a.

However, the energy band of the up-spin electrons of the ferromagnetic body 12a does not coincide with the energy band of the up-spin electrons of the ferromagnetic body 12b with each other, and the energy band of the down-spin electrons of the ferromagnetic body 12a does not coincide with the energy band of the down-spin of the ferromagnetic body 12b with each other.

As a result, it is difficult that both the up-spin electrons and the down-spin electrons are moved from the ferromagnetic body 12b to the ferromagnetic body 12a.

Thus, the conductance of the spin-injection FET, i.e. the current passed through the spin-injection FET during turn-on is changed depending on the parallel state or the anti-parallel state of the ferromagnetic bodies 12a and 12b, i.e. the state of magnetoresistive elements. Therefore, for example, when the change in conductance is read by the sense amplifier S/A, the state of the spin-injection FET can be distinguished.

The energy bands of FIGS. 3 and 5 show the case in which the half metal material such as the Heusler alloy is used as the ferromagnetic bodies 12a and 12b.

(4) Summary

In the structure of the spin-injection FET according to the embodiment of the invention, the state of the spin-injection FET can be changed and the state of the spin-injection FET can be read by passing the spin-injection current through the spin-injection FET.

Accordingly, specifically the spin-injection FET proposed in the invention can be applied to the advanced-technology devices such as the magnetic random access memory and the re-configurable logic circuit.

It is assumed that the spin-injection FET of FIG. 1 is applied to the magnetic random access memory. When the spin-injection FET proposed in the invention is applied to the re-configurable logic circuit, the sense amplifier S/A and the N-channel MIS transistors NE and NF can be neglected in FIG. 1.

2. Thermal Disturbance

The thermal disturbance problem in the spin-injection FET will be described below.

In the spin-injection FET, the spin polarized electron is used for the magnetization reversal of the ferromagnetic body which is of the free layer. The spin-injection current which creates the spin polarized electron causes the temperature rise of the magnetoresistive element in writing, which generates the thermal disturbance such as a fluctuation in spin-injection current value necessary to the magnetization reversal and a fluctuation in magnetoresistive rate-of-change (MR ratio) of the magnetoresistive element.

Figure 7:
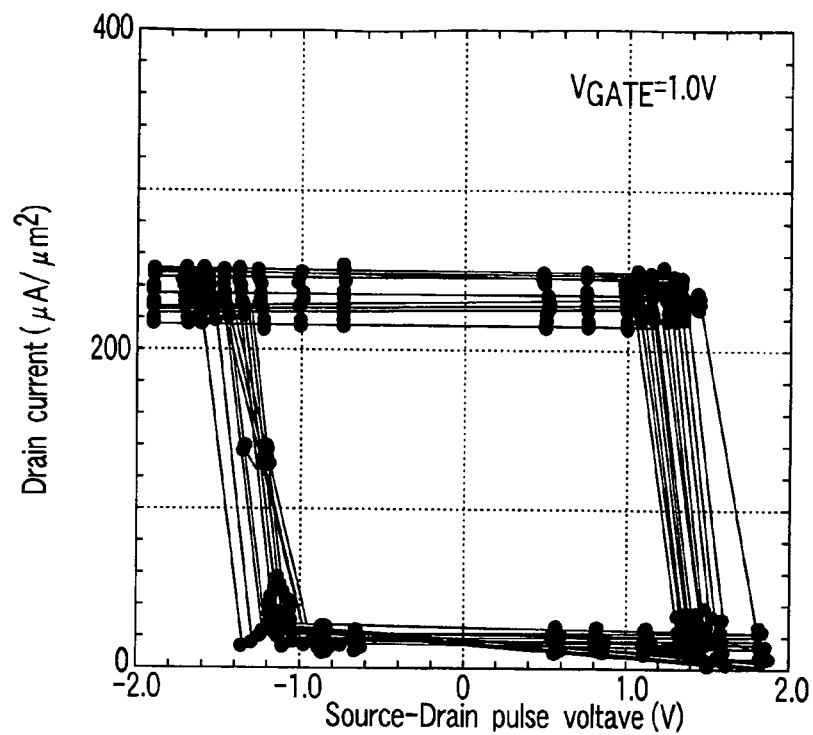
FIG. 7 is a view showing an example of thermal disturbance of the spin-injection FET.

FIG. 7 shows an example of the thermal disturbance of the spin-injection FET.

The gate voltage is set at constant (1.5V), the spin-injection current having a pulse width of 50 ns is passed through the spin-injection FET, and the writing is performed.

When source-drain pulse voltage is positive, the spin-injection current Is shown in FIG. 2 is passed through the spin-injection FET. At this point, the fluctuation in spin-injection current necessary to the switching (magnetization reversal) is generated although the magnetoresistive element becomes the parallel state.

When source-Drain pulse voltage is negative, the spin-injection current Is shown in FIG. 4 is passed through the spin-injection FET. At this point, the fluctuation in spin-injection current necessary to the switching (magnetization reversal) is generated although the magnetoresistive element becomes the anti-parallel state.

Drain current of the spin-injection FET is measured when gate voltage $V_{gate}$ is set at 1.0V.

The drain current has a large value of more than 200 $\mu A/\mu m^2$ when the magnetoresistive element is in the parallel state. The fluctuation in drain current is generated by heat generation in writing. Similarly the drain current has a small value more than 50 $\mu A/\mu m^2$ when the magnetoresistive element is in the anti-parallel state. The fluctuation in drain current is generated by the heat generation in writing.

Figure 8:
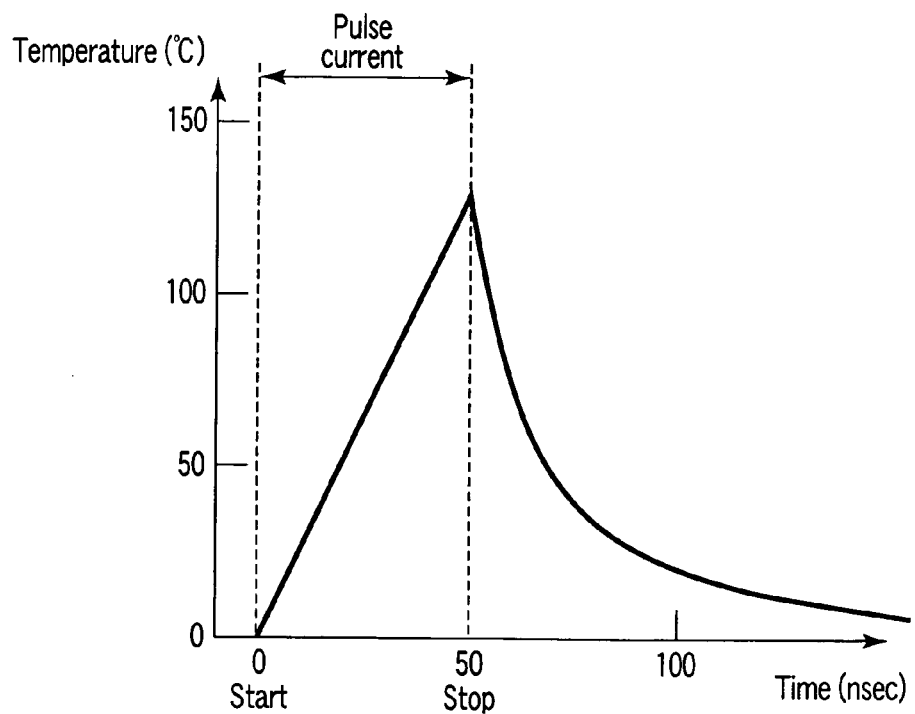
FIG. 8 is a view showing temperature rise in writing.

FIG. 8 shows the temperature rise of the magnetoresistive element when the spin-injection current having the pulse width of 50 ns is passed through the spin-injection FET.

The temperature of the magnetoresistive element continues to rise at constant rate while the spin-injection current is given to the magnetoresistive element. The temperature reaches 130° C. at the maximum. It takes tens nanoseconds, e.g. more than 50 ns in this embodiment for the magnetoresistive element to be sufficiently cooled down even after the spin-injection current is cut off.

3. Embodiments

The following embodiments propose the spin-injection FET, in which the thermal disturbance problem can be solved, the thermal stability is excellent, and the element breakage is never generated.

In writing, the spin-injection FET proposed in the embodiments has a mechanism which generates a magnetic field in the magnetization easy axis direction of the free layer in order to assist the magnetization reversal while having a mechanism which performs the magnetization reversal (switching) by the spin-injection current.

The combination of both the writing by the spin-injection current and the writing by the current magnetic field (magnetic filed generated by assist current) can provide the spin-injection FET, in which the thermal disturbance can be suppressed in writing, the spin-injection current can be decreased, the thermal stability is excellent, and the element breakage is never generated.

That is, in the spin-injection method, the free layer is largely affected by the thermal fluctuation because the magnetization reversal is performed by encouraging electron spin precession. However, the assist magnetic field suppresses the thermal disturbance by the electron spin in the free layer until the temperature of the magnetoresistive element rises due to the spin polarized electron sufficiently falls down.

Accordingly, when the assist magnetic field is generated during the writing in which the spin-injection current is used, the electron spin precession can be suppressed to decrease a fluctuation in characteristics of the magnetoresistive element by the thermal disturbance.

Because the spin-injection current can be decreased, the problems such as tunnel barrier breakage can also be prevented.

The assist magnetic field in the magnetization easy axis direction of the magnetoresistive element does not mainly perform the magnetization reversal but suppress the thermal disturbance by the electron spin in the free layer during the writing, so that assist currents not more than 1 mA are enough for the generation of the assist magnetic field.

(1) First Embodiment

A. Overall

Figure 9:
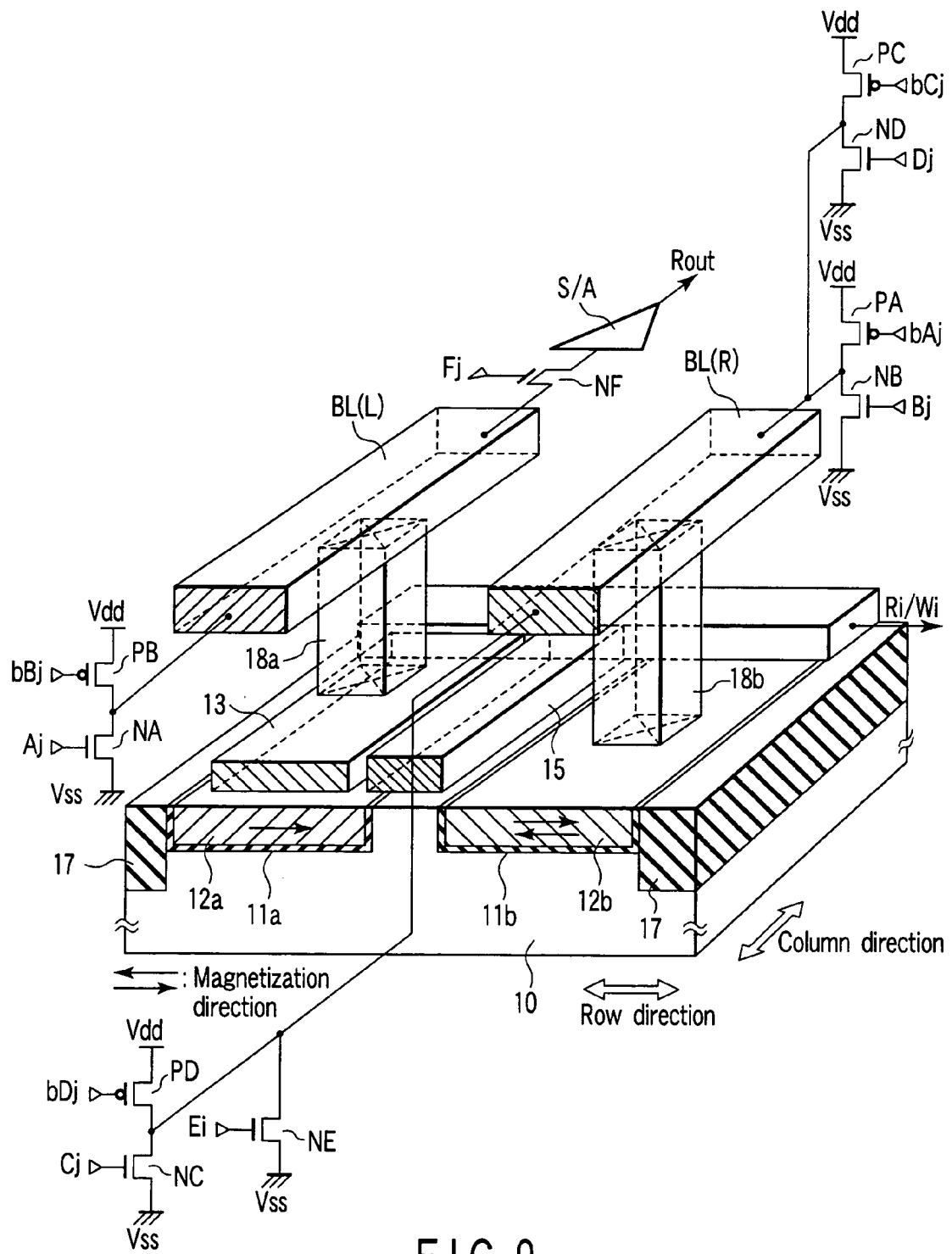
FIG. 9 is a view showing a spin-injection FET according to a first embodiment.

FIG. 9 shows a structure of a spin-injection FET according to a first embodiment.

An element separation insulating layer 17 having, e.g. an STI (Shallow Trench Isolation) structure is formed in the semiconductor substrate 10. The spin-injection FET is formed in an area surrounded by the element separation insulating layer 17.

The spin-injection FET includes the ferromagnetic bodies 12a and 12b, the tunnel barrier layers 11a and 11b, the gate electrode 15, and the anti-ferromagnetic body 13. The ferromagnetic bodies 12a and 12b are of the source/drain electrodes embedded in the recesses in the semiconductor substrate 10. The tunnel barrier layers 11a and 11b are located between the semiconductor substrate 10 and the ferromagnetic bodies 12a and 12b respectively. The gate electrode 15 is arranged on the channel between the ferromagnetic bodies 12a and 12b through the gate insulating layer. The anti-ferromagnetic body 13 is located on the ferromagnetic body 12a.

The magnetization easy axis directions of the ferromagnetic bodies 12a and 12b are set in a row direction. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

A memory cell array is formed by arranging such plural spin-injection FETs in a collective manner.

The gate electrode 15 of the spin-injection FET is connected to a word line extending in the row direction of the memory cell array. The control signal Ri/Wi for selecting the ith row is supplied to the word line in readout/writing.

A bit line BL(L) extends in a column direction of the memory cell array, and the bit line BL(L) is connected to the anti-ferromagnetic body 13 through a contact plug 18a.

One end of the bit line BL(L) is connected to the sense amplifier S/A through the N-channel MIS transistor NF which is of the column selection switch for selecting the jth column. The control signal Fj for selecting the jth column is inputted to the gate of the N-channel MIS transistor NF.

The other end of the bit line BL(L) is connected to the P-channel MIS transistor PB and the N-channel MIS transistor NA which are of the driver/sinker for controlling the generation/cutoff of the spin-injection current. The control signal bBj is inputted to the gate of the P-channel MIS transistor PB, and the control signal Aj is inputted to the gate of the N-channel MIS transistor NA.

A bit line BL(R) extends in the column direction of the memory cell array, and the bit line BL(R) is connected to the ferromagnetic body 12b through a contact plug 18b.

The bit line BL(R) is arranged near the ferromagnetic body 12b which is of the free layer. In the first embodiment, the bit line BL(R) is arranged above the ferromagnetic body 12b. Both the spin-injection current and the assist current are passed through the bit line BL(R). The spin-injection current generates spin-injection magnetization reversal in the writing, and the assist current generates the assist magnetic field in the magnetization easy axis direction of the free layer.

One end of the bit line BL(R) is connected to the P-channel MIS transistor PA and the N-channel MIS transistor NB which are of the driver/sinker for controlling the generation/cutoff of the spin-injection current. The control signal bAj is inputted to the gate of the P-channel MIS transistor PA, and the control signal Bj is inputted to the gate of the N-channel MIS transistor NB.

Further, one end of the bit line BL(R) is connected to a P-channel MIS transistor PC and an N-channel MIS transistor ND which are of the driver/sinker for controlling the generation/cutoff of the assist current generating the assist magnetic field. A control signal bCj is inputted to the gate of the P-channel MIS transistor PC, and a control signal Dj is inputted to the gate of the N-channel MIS transistor ND.

The other end of the bit line BL(R) is connected to a P-channel MIS transistor PD and an N-channel MIS transistor NC which are of the driver/sinker for controlling the generation/cutoff of the assist current generating the assist magnetic field. A control signal bDj is inputted to the gate of the P-channel MIS transistor PD, and a control signal Cj is inputted to the gate of the N-channel MIS transistor NC.

Further, the other end of the bit line BL(R) is connected to the ground point Vss through the N-channel MIS transistor NE. A control signal Ei is inputted to the gate of the N-channel MIS transistor NE.

According to the spin-injection FET of the first embodiment, in the writing, the driver/sinker supplies the spin-injection current necessary to the magnetization reversal (switching). At the same time, the driver/sinker supplies the assist current which generates the assist magnetic field in the magnetization easy axis direction of the free layer to suppress the thermal disturbance.

Accordingly, the spin-injection FET, in which the thermal stability is excellent, the fluctuation in characteristics of the element is eliminated, and the element breakage problem is solved, can be provided.

In the first embodiment, the spin-injection FET is the tunnel barrier type FET having the tunnel barrier layers 11a and 11b. However, it is also possible to neglect one of or both the tunnel barrier layers 11a and 11b.

Figure 10:
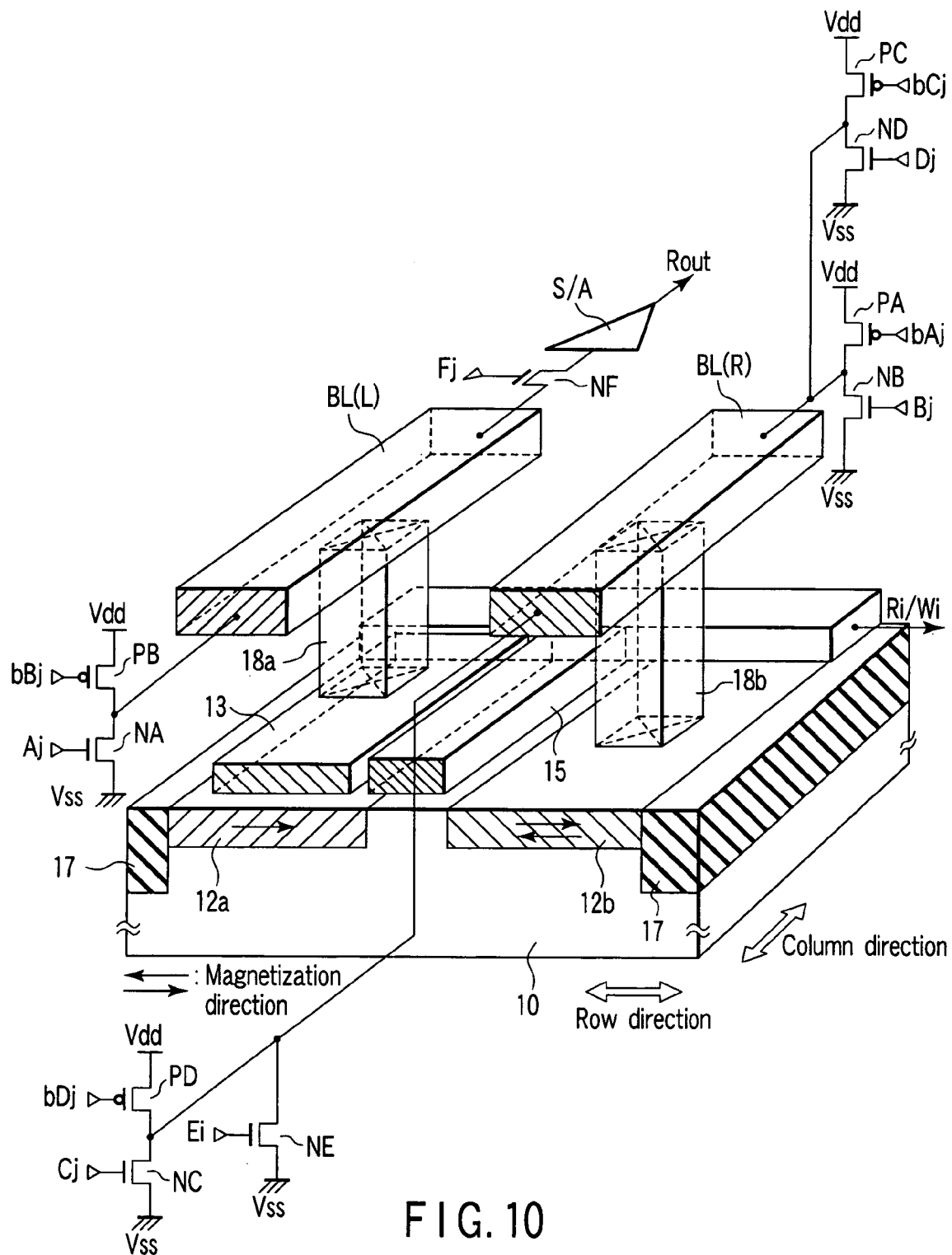
FIG. 10 is a view showing the spin-injection FET according to the first embodiment.

For example, it is possible that both the tunnel barrier layers 11a and 11b in the spin-injection FET of FIG. 9 are neglected to form the Schottky barrier type spin-injection FET shown in FIG. 10.

B. Material, Dimensions, and the Like

The materials, the dimensions, and the like which are described in the structure can directly be applied to those of the first embodiment.

C. Action

The action of the spin-injection FET of FIG. 9 will be described.

The action of the spin-injection FET of FIG. 10 is similar to the action of the spin-injection FET of FIG. 9.

It is assumed that the ferromagnetic bodies (source/drain) 12a and 12b of the spin-injection FET have the magnetic anisotropy in the row direction of the memory cell. That is, the magnetization easy axis direction of the ferromagnetic bodies 12a and 12b is the row direction and the magnetization hard axis direction is the column direction.

i. Writing

In writing, the control signals Ei and Fj are set at "L" and the N-channel MIS transistors NE and NF are turned off.

Figure 11:
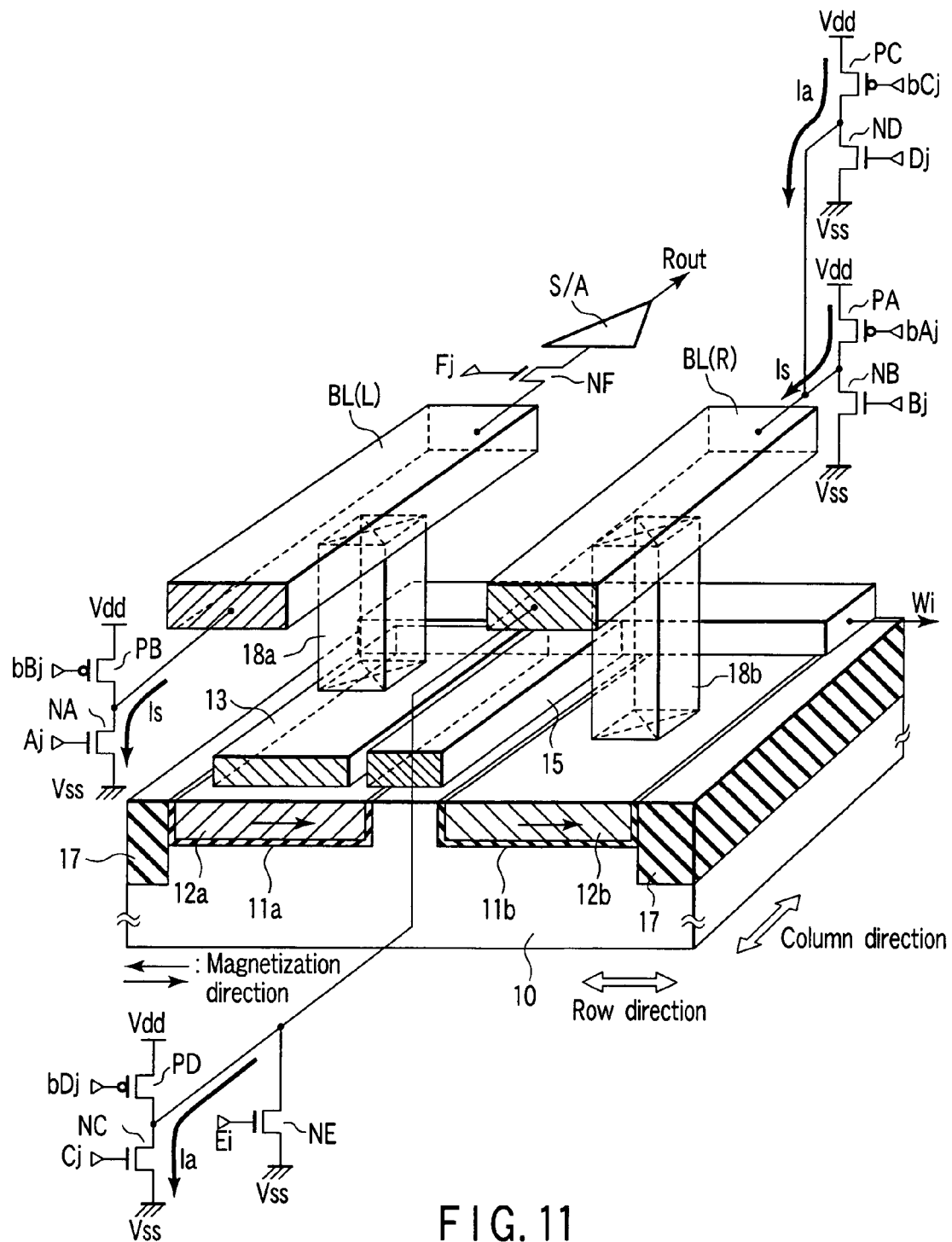
FIG. 11 is a view showing flows of the spin-injection current and assist current.

First, in order to set the magnetization states of the ferromagnetic bodies 12a and 12b in parallel, as shown in FIG. 11, the control signals Aj and bBj are set at "H" and the control signals bAj and Bj are set at "L". When the semiconductor substrate 10 is a P-type semiconductor, the control signal Wi is set at "H" to form the N channel in surface of the semiconductor substrate 10 between the ferromagnetic bodies 12a and 12b. When the semiconductor substrate 10 is an N-type semiconductor, the control signal Wi is set at "L" to form the P channel in the surface of the semiconductor substrate 10 between the ferromagnetic bodies 12a and 12b.

At this point, the P-channel MIS transistor PA and the N-channel MIS transistor NA are turned on, and the spin-injection current Is is passed through the spin-injection FET from the ferromagnetic body 12b toward the ferromagnetic body 12a.

The spin-polarized electron which is directed to the same direction as the magnetization direction of the ferromagnetic body 12a enters the ferromagnetic body 12b through the channel of the spin-injection FET, and the spin-polarized electron imparts the spin torque to the ferromagnetic body 12b.

As a result, the magnetization direction of the ferromagnetic body 12b is directed to the same direction (parallel) as the magnetization direction of the ferromagnetic body 12a.

In the first embodiment of the invention, at the same time when the spin-injection current Is is passed through the spin-injection FET, or before or after the spin-injection current Is is passed through, an assist current Ia is passed through the bit line BL(R) arranged near the ferromagnetic body 12b which is of the free layer, and the assist magnetic filed generated by the assist current Ia is utilized to prevent the thermal disturbance of the ferromagnetic body 12a.

That is, the control signals Cj and bDj are set at "H" and the control signals bCj and Dj are set at "L". At this point, the P-channel MIS transistor PC and the N-channel MIS transistor NC are turned on, and the assist current Ia is passed through the bit line BL(R). The assist current Ia causes the assist magnetic field in the same direction as the magnetization direction of the ferromagnetic body 12b which is of the pinned layer to affect the ferromagnetic body 12b which is of the free layer.

As a result, the electron spin precession in the ferromagnetic body 12b is suppressed in the writing, which prevents the generation of the thermal disturbance.

Tens nanoseconds are required until the magnetoresistive element is sufficiently cooled down even after the spin-injection current Is is cut off. Accordingly, it is preferable that the assist current Ia is passed through after the spin-injection current Is is cut off.

For example, the control signal bAj is changed from "L" to "H" and the P-channel MIS transistor PA is turned off, and then the control signal Aj is changed from "H" to "L" and the N-channel MIS transistor NA is turned off to cut off the spin-injection current Is. Then, after a predetermined time elapses, the control signal bCj is changed from "L" to "H" and the P-channel MIS transistor PC is turned off, and the control signal Cj is changed from "H" to "L" and the N-channel MIS transistor NC is turned off to cut off the assist current Ia.

Figure 12:
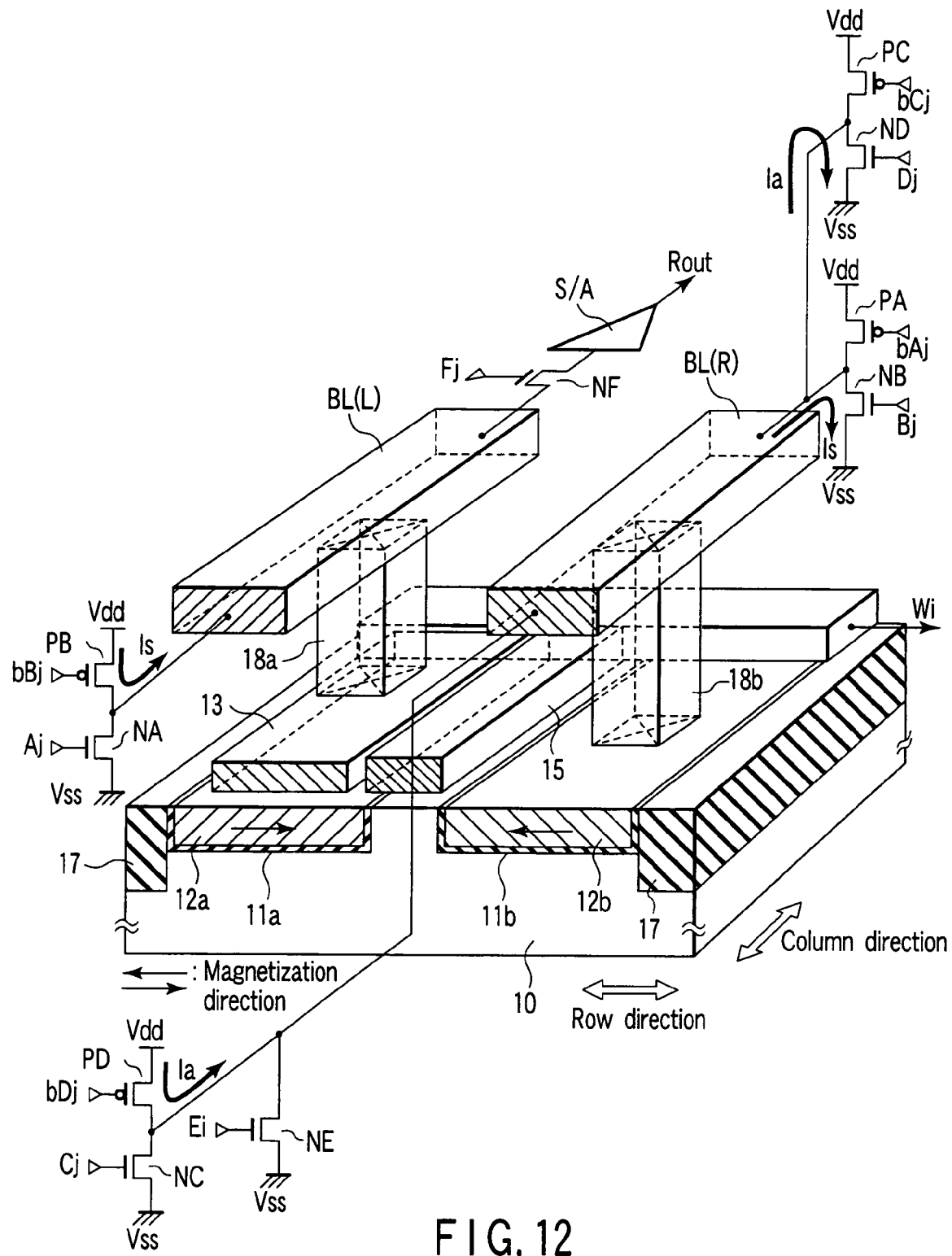
FIG. 12 is a view showing the flows of the spin-injection current and the assist current.

Then, in order to set the magnetization states of the ferromagnetic bodies 12a and 12b in anti-parallel, as shown in FIG. 12, the control signals Bj and bAj are set at "H" and the control signals bBj and Aj are set at "L". When the semiconductor substrate 10 is the P-type semiconductor, the control signal Wi is set at "H" to form the N channel in surface of the semiconductor substrate 10 between the ferromagnetic bodies 12a and 12b. When the semiconductor substrate 10 is the N-type semiconductor, the control signal Wi is set at "L" to form the P channel in the surface of the semiconductor substrate 10 between the ferromagnetic bodies 12a and 12b.

At this point, the P-channel MIS transistor PB and the N-channel MIS transistor NB are turned on, and the spin-injection current Is is passed through the spin-injection FET from the ferromagnetic body 12a toward the ferromagnetic body 12b.

The spin-polarized electron which is directed to the reverse direction of the magnetization direction of the ferromagnetic body 12a is reflected at the ferromagnetic body 12a to enter the ferromagnetic body 12b, and the spin-polarized electron imparts the spin torque to the ferromagnetic body 12b.

As a result, the magnetization direction of the ferromagnetic body 12b is directed to the reverse direction (anti-parallel) of the magnetization direction of the ferromagnetic body 12a.

In the first embodiment of the invention, at the same time when the spin-injection current Is is passed through the spin-injection FET, or before or after the spin-injection current Is is passed through, the assist current Ia is passed through the bit line BL(R) arranged near the ferromagnetic body 12b which is of the free layer, and the assist magnetic filed generated by the assist current Ia is utilized to prevent the thermal disturbance of the ferromagnetic body 12a.

That is, the control signals Dj and bCj are set at "H" and the control signals bDj and Cj are set at "L". At this point, the P-channel MIS transistor PD and the N-channel MIS transistor ND are turned on, and the assist current Ia is passed through the bit line BL(R). The assist current Ia causes the assist magnetic field directed to the magnetization direction of the ferromagnetic body 12b which is of the pinned layer to affect the ferromagnetic body 12b which is of the free layer.

As a result, the electron spin precession in the ferromagnetic body 12b is suppressed in the writing, which prevents the generation of the thermal disturbance.

Tens nanoseconds are required until the magnetoresistive element is sufficiently cooled down even after the spin-injection current Is is cut off. Accordingly, it is preferable that the assist current Ia is passed through after the spin-injection current Is is cut off.

For example, the control signal bBj is changed from "L" to "H" and the P-channel MIS transistor PB is turned off, and then the control signal Bj is changed from "H" to "L" and the N-channel MIS transistor NB is turned off to cut off the spin-injection current Is. Then, after a predetermined time elapses, the control signal bDj is changed from "L" to "H" and the P-channel MIS transistor PD is turned off, and the control signal Dj is changed from "H" to "L" and the N-channel MIS transistor ND is turned off to cut off the assist current Ia.

ii. Readout

Figure 13:
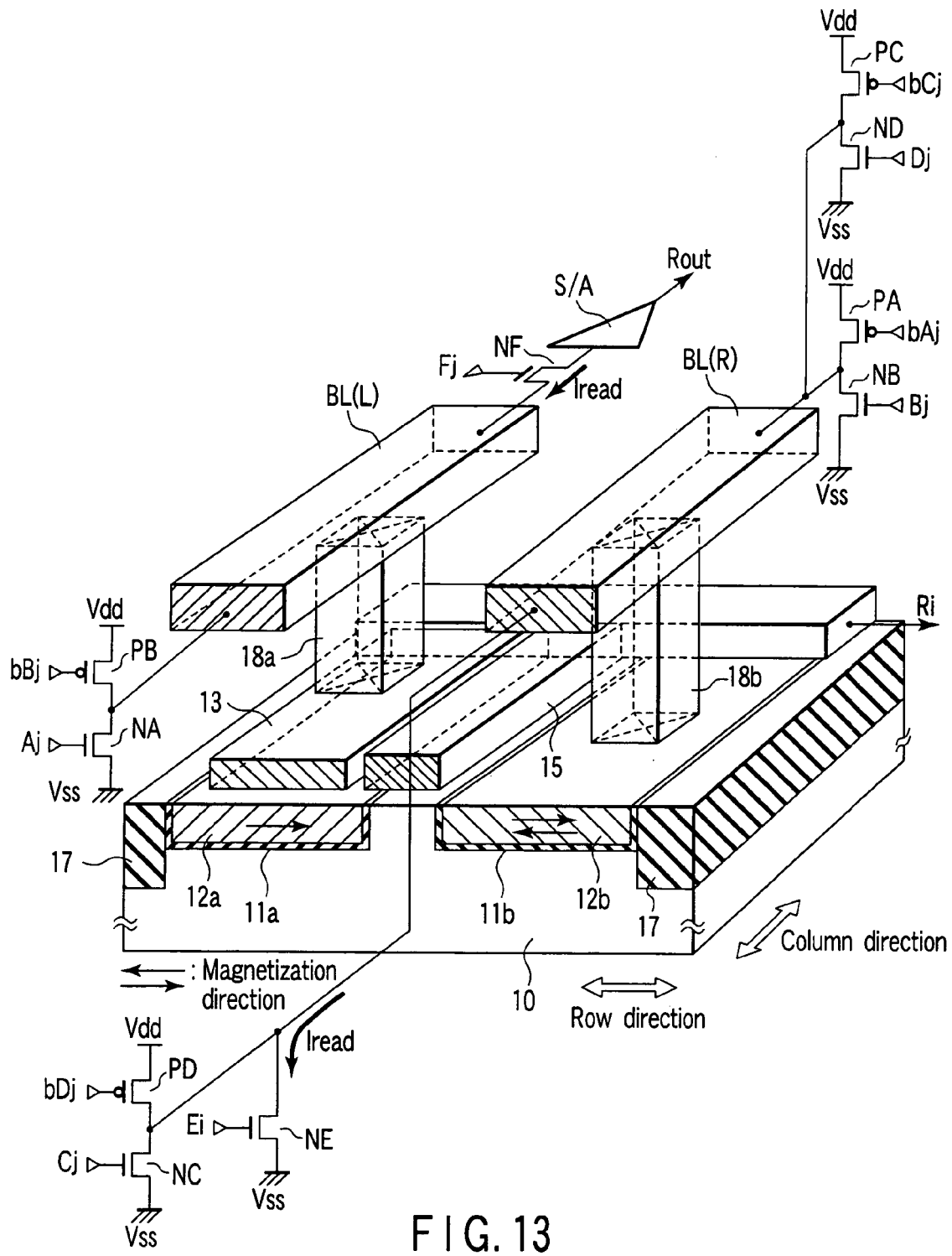
FIG. 13 is a view showing the flow of the readout current.

In the readout, as shown in FIG. 13, the control signals bAj and bBj are set at "H", the control signals Aj and Bj are set at "L", and the P-channel MIS transistors PA and PB and the N-channel MIS transistors NA and NB are turned off.

The control signals Ei and Fj are set at "H" and the N-channel MIS transistors NE and NF are turned on.

When the semiconductor substrate 10 is the P-type semiconductor, the control signal Ri is set at "H" to form the N channel in surface of the semiconductor substrate 10 between the ferromagnetic bodies 12a and 12b. When the semiconductor substrate 10 is the N-type semiconductor, the control signal Ri is set at "L" to form the P channel in the surface of the semiconductor substrate 10 between the ferromagnetic bodies 12a and 12b.

At this point, the readout current Iread is passed from the sense amplifier S/A toward the ground point Vss via the spin-injection FET.

When the ferromagnetic bodies 12a and 12b constituting the spin-injection FET are in the parallel state, the electron transition is easy to occur from the ferromagnetic body 12b to the ferromagnetic body 12a, so that the conductance of the spin-injection FET is increased.

On the other hand, when the ferromagnetic bodies 12a and 12b constituting the spin-injection FET are in the anti-parallel state, the electron transition from the ferromagnetic body 12b to the ferromagnetic body 12a becomes difficult, so that the conductance of the spin-injection FET is decreased.

Thus, the conductance of the spin-injection FET, i.e. the current passed through the spin-injection FET during turn-on is changed depending on the parallel state or the anti-parallel state of the ferromagnetic bodies 12a and 12b, i.e. the magnetoresistive elements. Therefore, for example, when the change in conductance is read by the sense amplifier S/A, the state of the spin-injection FET can be distinguished.

D. Summary

The spin-injection FET according to the first embodiment adopts both the magnetization reversal method by the spin-injection current and the magnetic field assist method in which the assist magnetic field (current magnetic field) is utilized to suppress the thermal fluctuation of the electron spin in the free layer during the magnetization reversal.

Accordingly, the thermal stability is excellent, the fluctuation in characteristics of the elements is eliminated, and the spin-injection current can be decreased, so that the spin-injection FET in which the element breakage problem can be solved can be proposed.

It is assumed that the spin-injection FETs of FIGS. 9 and 10 are applied to the magnetic random access memory. When the spin-injection FET of the first embodiment is applied to the re-configurable logic circuit, the sense amplifiers S/A and the N-channel MIS transistors NE and NF can be neglected in FIGS. 9 and 10.

(2) Second Embodiment

A second embodiment is one of improvements of the first embodiment.

The spin-injection FET of the second embodiment includes all the features of the spin-injection FET of the first embodiment.

Figure 15:
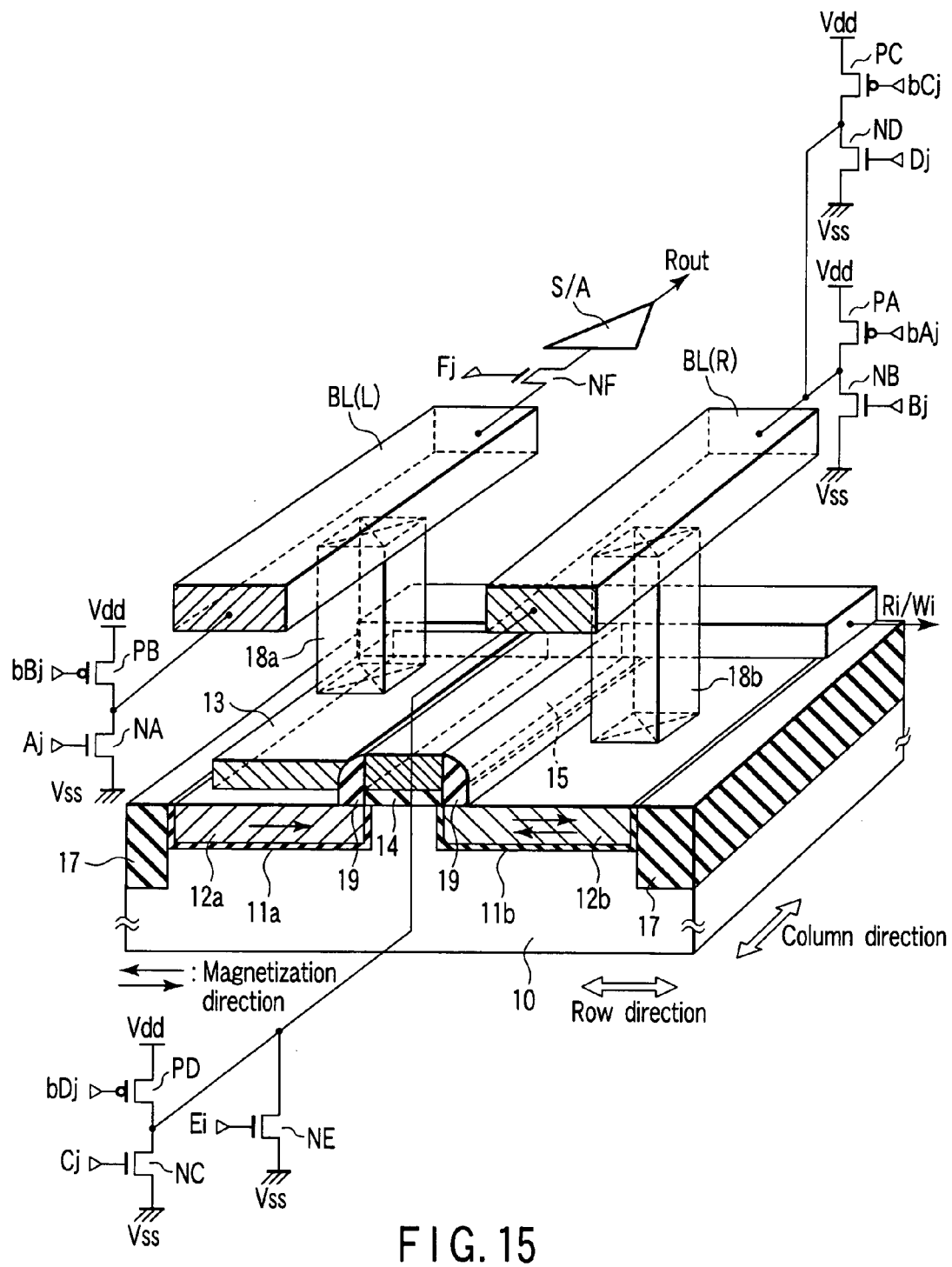
FIG. 15 is a view showing the spin-injection FET according to the second embodiment.

As shown in FIGS. 14 and 15, in the second embodiment, an insulating layer 19 called side wall is formed on the sidewall of the gate electrode 15 in the spin-injection FET. The insulating layer 19 is formed in order to prevent short circuit between the anti-ferromagnetic body 13 and the gate electrode 15 and to form the anti-ferromagnetic body 13 by self alignment.

In the spin-injection FET of the second embodiment, because the materials, the dimensions, the action, and the like are similar to the first embodiment, the descriptions will be neglected.

The spin-injection FET, in which the thermal stability is excellent, the fluctuation in characteristics of the elements is eliminated, and the spin-injection current can be decreased, can also be realized in the second embodiment.

(3) Third Embodiment

A third embodiment is one of modifications of the first embodiment.

The spin-injection FET of the third embodiment differs from the spin-injection FET of the first embodiment in that the ferromagnetic body and tunnel barrier layer which constitute the magnetoresistive element are formed on the semiconductor substrate.

The structure of the spin-injection FET will be described.

FIG. 16 shows a structure based on the third embodiment.

Source/drain diffusion layers 12A and 12B are formed in a surface area of the semiconductor substrate 10. When the spin-injection FET is the P-channel type (semiconductor substrate 10 is N-type), the source/drain diffusion layers 12A and 12B are formed by a P-type impurity layer. When the spin-injection FET is the N-channel type (semiconductor substrate 10 is P-type), the source/drain diffusion layers 12A and 12B are formed by an N-type impurity layer.

The tunnel barrier layer 11a is formed on the source/drain diffusion layer 12A, and the ferromagnetic body 12a is formed on the tunnel barrier layer 11a. The anti-ferromagnetic body 13 is formed on the ferromagnetic body 12a. The ferromagnetic body 12a becomes the pinned layer whose magnetization direction is fixed by the anti-ferromagnetic body 13.

The electrode 16a is arranged on the anti-ferromagnetic body 13. The electrode 16a is connected to the sense amplifier S/A through the N-channel MIS transistor NF which is of the column selection switch for selecting the jth column.

The electrode 16a is also connected to the P-channel MIS transistor PB and the N-channel MIS transistor NA which are of the driver/sinker for controlling the generation/cutoff of the spin-injection current.

The tunnel barrier layer 11b is formed on the source/drain diffusion layer 12B, and the ferromagnetic body 12b is formed on the tunnel barrier layer 11b. The ferromagnetic body 12b becomes the free layer whose magnetization direction is changed by the spin-injection current.

The electrode 16b is arranged on the ferromagnetic body 12b. The electrode 16b is connected to the P-channel MIS transistor PA and an N-channel MIS transistor NB which are of the driver/sinker for controlling the generation/cutoff of the spin-injection current.

The electrode 16b is also connected to a ground point Vss through an N-channel MIS transistor NE.

The gate insulating layer 14 is formed on the channel between the source/drain diffusion layers 12A and 12B, and the gate electrode 15 is formed on the gate insulating layer 14. The control signal Ri/Wi for selecting the ith row is supplied to the gate electrode 15 in readout/writing. A cap insulating layer 20A is formed on the gate electrode 15, and the insulating layer 19 is formed on the sidewall of the cap insulating layer 20A.

One of or both the tunnel barrier layers 11a and 11b located between the source/drain diffusion layers 12A and 12B and the ferromagnetic bodies 12a and 12b can be neglected.

Figure 17:
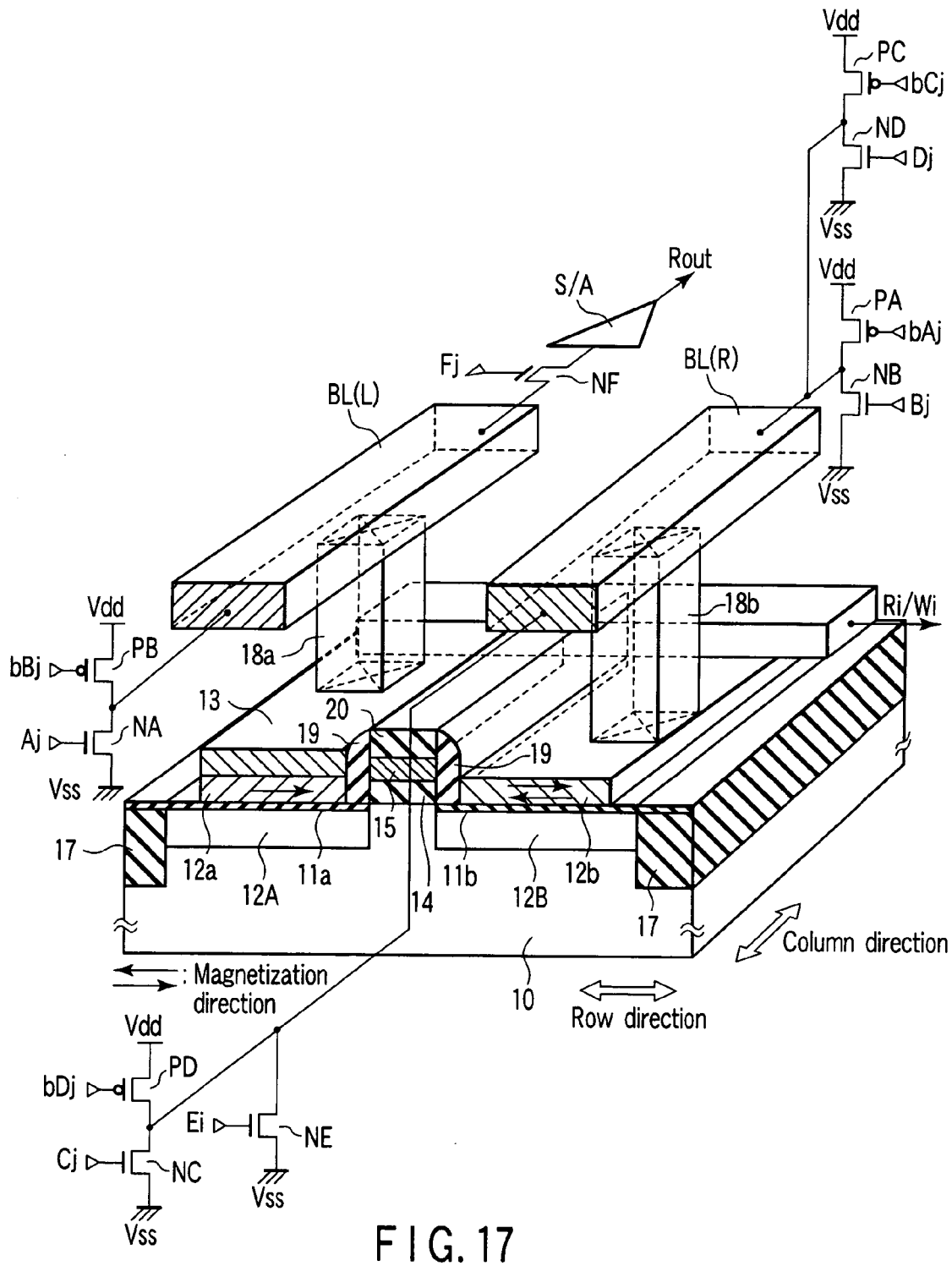
FIG. 17 is a view showing a spin-injection FET according to the third embodiment.

FIG. 17 shows a structure of the spin-injection FET of the third embodiment.

The third embodiment has the feature in that a mechanism for generating the assist magnetic field is added to the structure of FIG. 16.

An element separation insulating layer 17 having, e.g. the STI structure is formed in the semiconductor substrate 10. The spin-injection FET is formed in the area surrounded by the element separation insulating layer 17.

The source/drain diffusion layers 12A and 12B are formed in the surface area of the semiconductor substrate 10. The tunnel barrier layer 11a is formed on the source/drain diffusion layer 12A, and the ferromagnetic body 12a is formed on the tunnel barrier layer 11a. The anti-ferromagnetic body 13 is formed on the ferromagnetic body 12a.

The tunnel barrier layer 11b is formed on the source/drain diffusion layer 12B, and the ferromagnetic body 12b is formed on the tunnel barrier layer 11b.

The magnetization easy axis directions of the ferromagnetic bodies 12a and 12b are set in the row direction. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

The gate insulating layer 14 is formed on the channel between the source/drain diffusion layers 12A and 12B, and the gate electrode 15 is formed on the gate insulating layer 14. The cap insulating layer 20A is formed on the gate electrode 15, and the insulating layer 19 is formed on the sidewall of the cap insulating layer 20A.

The memory cell array is formed by arranging the plural spin-injection FETs in a collective manner.

The gate electrode 15 of the spin-injection FET is connected to the word line extending in the row direction of the memory cell array. The control signal Ri/Wi for selecting the ith row is supplied to the word line in readout/writing.

The bit line BL(L) extends in the column direction of the memory cell array, and the bit line BL(L) is connected to the anti-ferromagnetic body 13 through the contact plug 18a.

One end of the bit line BL(L) is connected to the sense amplifier S/A through the N-channel MIS transistor NF which is of the column selection switch for selecting the jth column. The control signal Fj for selecting the jth column is inputted to the gate of the N-channel MIS transistor NF.

The other end of the bit line BL(L) is connected to the P-channel MIS transistor PB and the N-channel MIS transistor NA which are of the driver/sinker for controlling the generation/cutoff of the spin-injection current. The control signal bBj is inputted to the gate of the P-channel MIS transistor PB, and the control signal Aj is inputted to the gate of the N-channel MIS transistor NA.

The bit line BL(R) extends in the column direction of the memory cell array, and the bit line BL(R) is connected to the ferromagnetic body 12b through the contact plug 18b.

The bit line BL(R) is arranged near the ferromagnetic body 12b which is of the free layer. In the third embodiment, the bit line BL(R) is arranged above the ferromagnetic body 12b. Both the spin-injection current and the assist current are passed through the bit line BL(R). The spin-injection current generates spin-injection magnetization reversal in the writing, and the assist current generates the assist magnetic field in the magnetization easy axis direction of the free layer.

One end of the bit line BL(R) is connected to the P-channel MIS transistor PA and the N-channel MIS transistor NB which are of the driver/sinker for controlling the generation/cutoff of the spin-injection current. The control signal bAj is inputted to the gate of the P-channel MIS transistor PA, and the control signal Bj is inputted to the gate of the N-channel MIS transistor NB.

Further, one end of the bit line BL(R) is connected to the P-channel MIS transistor PC and the N-channel MIS transistor ND which are of the driver/sinker for controlling generation/cutoff of the assist current generating the assist magnetic field. The control signal bCj is inputted to the gate of the P-channel MIS transistor PC, and the control signal Dj is inputted to the gate of the N-channel MIS transistor ND.

The other end of the bit line BL(R) is connected to the P-channel MIS transistor PD and the N-channel MIS transistor NC which are of the driver/sinker for controlling the generation/cutoff of the assist current generating the assist magnetic field. The control signal bDj is inputted to the gate of the P-channel MIS transistor PD, and the control signal Cj is inputted to the gate of the N-channel MIS transistor NC.

Further, the other end of the bit line BL(R) is connected to the ground point Vss through the N-channel MIS transistor NE. The control signal Ei is inputted to the gate of the N-channel MIS transistor NE.

According to the spin-injection FET of the third embodiment, in the writing, the driver/sinker supplies the assist current while supplying the spin-injection current necessary to the magnetization reversal (switching). At the same time, the assist current generates the assist magnetic field in the magnetization easy axis direction of the free layer to suppress the thermal disturbance.

Accordingly, the spin-injection FET, in which the thermal stability is excellent, the fluctuation in characteristics of the element is eliminated, and the element breakage problem is solved, can be provided.

In the third embodiment, the spin-injection FET is the tunnel barrier type FET having the tunnel barrier layers 11a and 11b. However, it is also possible to neglect one of or both the tunnel barrier layers 11a and 11b.

In the third embodiment, it is assumed that the spin-injection FET is applied to the magnetic random access memory. When the spin-injection FET of the third embodiment is applied to the re-configurable logic circuit, the sense amplifier S/A and the N-channel MIS transistors NE and NF can be neglected in FIGS. 16 and 17.

Further, in the third embodiment, the materials, the dimensions, and the like of the spin-injection FET are similar to those of the first embodiment, so that the descriptions will be neglected.

(4) Fourth Embodiment

A fourth embodiment is also one of modifications of the first embodiment.

A spin-injection FET formed on an SOI (Silicon On Insulator) substrate will be described in the fourth embodiment.

FIG. 18 shows the structure based on the fourth embodiment.

An insulating layer 10A is formed on the semiconductor substrate 10, and the spin-injection FET is formed on the insulating layer 10A.

A semiconductor layer 10B is formed between the ferromagnetic bodies 12a and 12b. When the spin-injection FET is the P-channel type, the semiconductor layer 10B is formed in the N-type. When the spin-injection FET is the N-channel type, the semiconductor layer 10B is formed in the P-type.

Bottom surfaces of the ferromagnetic bodies 12a and 12b are in contact with the insulating layer 10A. The tunnel barrier layers 11a and 11b are formed between the semiconductor layer 10B and the ferromagnetic bodies 12a and 12b respectively. The anti-ferromagnetic body 13 is formed on the ferromagnetic body 12a.

The ferromagnetic bodies 12a and 12b have the magnetization easy axis directions perpendicular to the paper plane. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

The electrode 16a is arranged on the anti-ferromagnetic body 13. The electrode 16a is connected to the sense amplifier S/A through the N-channel MIS transistor NF which is of the column selection switch for selecting the jth column.

The electrode 16a is also connected to the P-channel MIS transistor PB and the N-channel MIS transistor NA which are of the driver/sinker for controlling the generation/cutoff of the spin-injection current.

The electrode 16b is arranged on the ferromagnetic body 12b. The electrode 16b is connected to the P-channel MIS transistor PA and the N-channel MIS transistor NB which are of the driver/sinker for controlling the generation/cutoff of the spin-injection current.

The electrode 16b is also connected to the ground point Vss through the N-channel MIS transistor NE.

The gate insulating layer 14 is formed on the channel between the ferromagnetic bodies 12a and 12b, and the gate electrode 15 is formed on the gate insulating layer 14. The control signal Ri/Wi for selecting the ith row is supplied to the gate electrode 15 in the readout/writing.

One of or both the tunnel barrier layers 11a and 11b located between the semiconductor layer 10A and the ferromagnetic bodies 12a and 12b can also be neglected.

Figure 19:
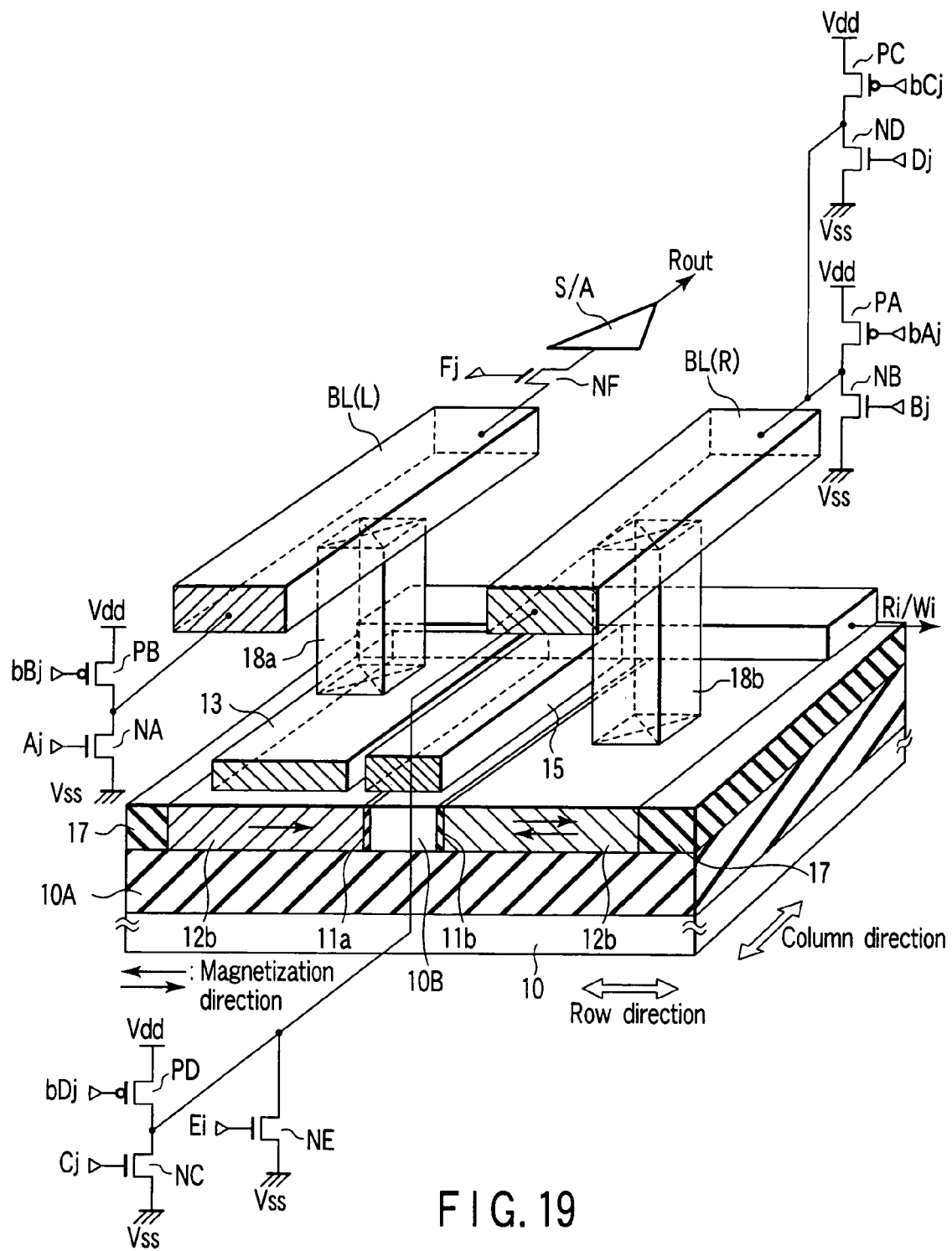
FIG. 19 is a view showing a spin-injection FET according to the fourth embodiment.

FIG. 19 shows a structure of the spin-injection FET of the fourth embodiment.

The fourth embodiment has the feature in that the mechanism for generating the assist magnetic field is added to the structure of FIG. 18.

The insulating layer 10A and the element separation insulating layer 17 having the STI structure are formed in the semiconductor substrate 10. The spin-injection FET is formed in the area surrounded by the insulating layer 10A and the element separation insulating layer 17.

The semiconductor layer 10B is formed between the ferromagnetic bodies 12a and 12b. When the spin-injection FET is the P-channel type, the semiconductor layer 10B is formed in the N-type. When the spin-injection FET is the N-channel type, the semiconductor layer 10B is formed in the P-type.

The bottom surfaces of the ferromagnetic bodies 12a and 12b are in contact with the insulating layer 10A. The tunnel barrier layers 11a and 11b are formed between the semiconductor layer 10B and the ferromagnetic bodies 12a and 12b respectively. The anti-ferromagnetic body 13 is formed on the ferromagnetic body 12a.

The magnetization easy axis directions of the ferromagnetic bodies 12a and 12b are set in the row direction. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

The gate electrode 15 is formed on the channel between the ferromagnetic bodies 12a and 12b through the gate insulating layer. The cap insulating layer may be formed on the gate electrode 15. The insulating layer (sidewall) may be formed on the sidewall of the gate electrode 15.

The memory cell array is formed by arranging the plural spin-injection FETs in a collective manner.

The gate electrode 15 of the spin-injection FET is connected to the word line extending in the row direction of the memory cell array. The control signal Ri/Wi for selecting the ith row is supplied to the word line in the readout/writing.

The bit line BL(L) extends in the column direction of the memory cell array, and the bit line BL(L) is connected to the anti-ferromagnetic body 13 through the contact plug 18a.

One end of the bit line BL(L) is connected to the sense amplifier S/A through the N-channel MIS transistor NF which is of the column selection switch for selecting the jth column. The control signal Fj for selecting the jth column is inputted to the gate of the N-channel MIS transistor NF.

The other end of the bit line BL(L) is connected to the P-channel MIS transistor PB and the N-channel MIS transistor NA which are of the driver/sinker for controlling the generation/cutoff of the spin-injection current. The control signal bBj is inputted to the gate of the P-channel MIS transistor PB, and the control signal Aj is inputted to the gate of the N-channel MIS transistor NA.

The bit line BL(R) extends in the column direction of the memory cell array, and the bit line BL(R) is connected to the ferromagnetic body 12b through the contact plug 18b.

The bit line BL(R) is arranged near the ferromagnetic body 12b which is of the free layer. In the third embodiment, the bit line BL(R) is arranged above the ferromagnetic body 12b. Both the spin-injection current and the assist current are passed through the bit line BL(R) in the writing. The spin-injection current generates spin-injection magnetization reversal, and the assist current generates the assist magnetic field in the magnetization easy axis direction of the free layer.

One end of the bit line BL(R) is connected to the P-channel MIS transistor PA and the N-channel MIS transistor NB which are of the driver/sinker for controlling the generation/cutoff of the spin-injection current. The control signal bAj is inputted to the gate of the P-channel MIS transistor PA, and the control signal Bj is inputted to the gate of the N-channel MIS transistor NB.

Further, one end of the bit line BL(R) is connected to the P-channel MIS transistor PC and the N-channel MIS transistor ND which are of the driver/sinker for controlling generation/cutoff of the assist current generating the assist magnetic field. The control signal bCj is inputted to the gate of the P-channel MIS transistor PC, and the control signal Dj is inputted to the gate of the N-channel MIS transistor ND.

The other end of the bit line BL(R) is connected to the P-channel MIS transistor PD and the N-channel MIS transistor NC which are of the driver/sinker for controlling the generation/cutoff of the assist current generating the assist magnetic field. The control signal bDj is inputted to the gate of the P-channel MIS transistor PD, and the control signal Cj is inputted to the gate of the N-channel MIS transistor NC.

Further, the other end of the bit line BL(R) is connected to the ground point Vss through the N-channel MIS transistor NE. The control signal Ei is inputted to the gate of the N-channel MIS transistor NE.

According to the spin-injection FET of the third embodiment, in the writing, the driver/sinker supplies the assist current while supplying the spin-injection current necessary to the magnetization reversal (switching). The assist current generates the assist magnetic field in the magnetization easy axis direction of the free layer to suppress the thermal disturbance.

Accordingly, the spin-injection FET, in which the thermal stability is excellent, the fluctuation in characteristics of the element is eliminated, and the element breakage problem is solved, can be provided.

In the fourth embodiment, the spin-injection FET is the tunnel barrier type FET having the tunnel barrier layers $11a$ and $11b$. However, it is also possible to neglect one of or both the tunnel barrier layers $11a$ and $11b$.

In the fourth embodiment, it is assumed that the spin-injection FET is applied to the magnetic random access memory. When the spin-injection FET of the fourth embodiment is applied to the re-configurable logic circuit, the sense amplifier S/A and the N-channel MIS transistors NE and NF can be neglected in FIGS. 18 and 19.

Further, in the fourth embodiment, the materials, the dimensions, and the like of the spin-injection FET are similar to those of the first embodiment, so that the descriptions will be neglected.

(5) Fifth Embodiment

A fifth embodiment is one of improved examples of the second embodiment.

A spin-injection FET according to the fifth embodiment includes all the features of the spin-injection FET of the second embodiment.

Figure 21:
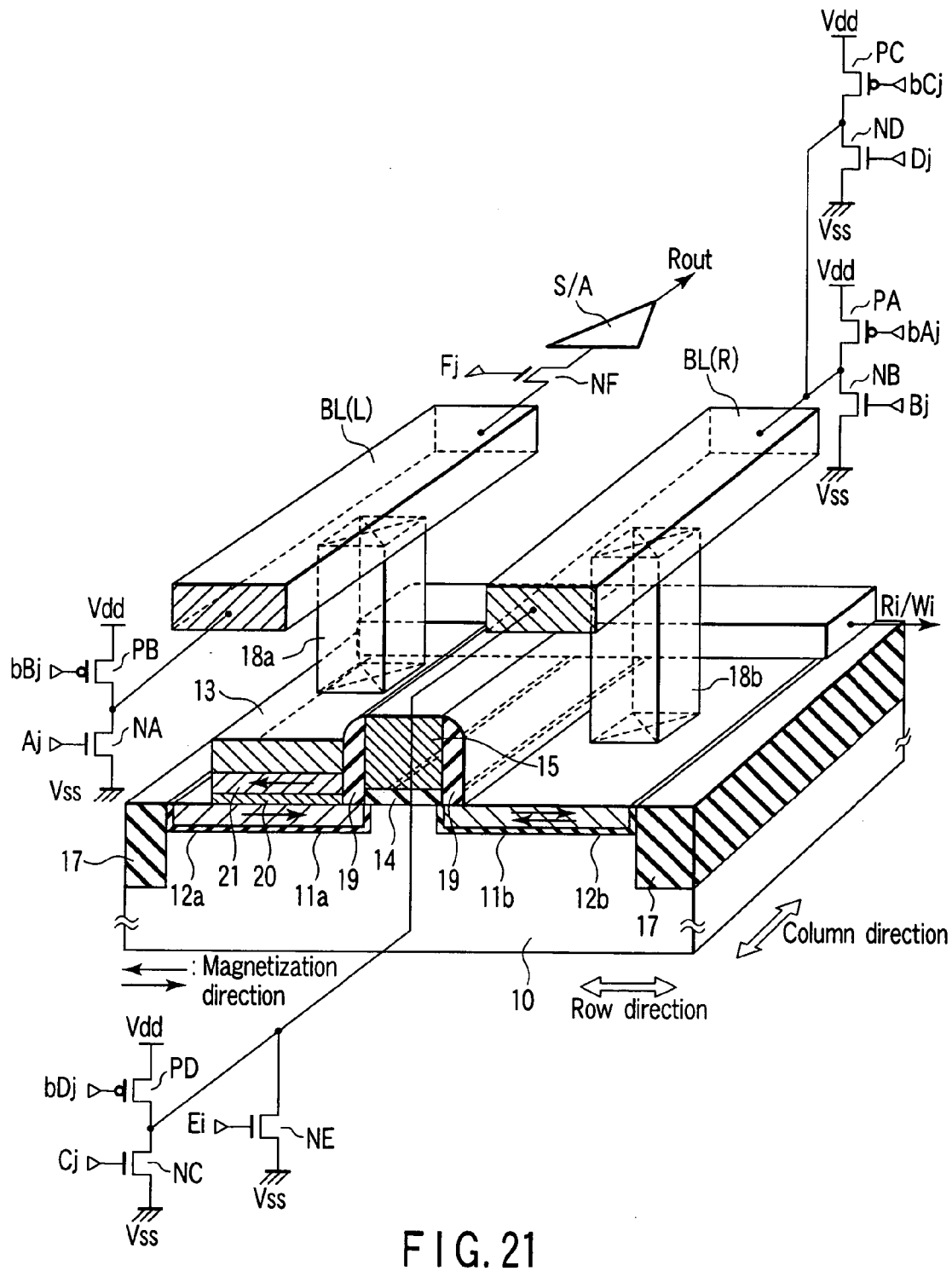
FIG. 21 is a view showing the spin-injection FET according to the fifth embodiment.

In the fifth embodiment, as shown in FIGS. 20 and 21, the pinned layer in which the magnetization direction is fixed has an SAF (Synthetic Anti-ferromagnetic) structure.

That is, a non-magnetic body 20 is formed on the ferromagnetic body $12a$, and a ferromagnetic body 21 is formed on the non-magnetic body 20. The SAF structure is formed by a three-layer structure having ferromagnetic body $12a$/non-magnetic body 20/ferromagnetic body 21.

When the pinned structure of the fifth embodiment is formed, the magnetization directions of the ferromagnetic bodies $12a$ and 21 are strongly fixed in mutually opposite directions by anti-ferromagnetic interaction (anti-ferromagnetic bond). Therefore, the magnetization direction of the pinned layer can be stably in the writing.

The adoption of the SAF structure can set the magnetization directions of the ferromagnetic bodies $12a$ and 21 at angles of 180 degrees in mutually opposite directions without using an annealing process.

In the fifth embodiment, when the electrons are injected from the ferromagnetic body $12a$ to the ferromagnetic body $12b$ in reversing magnetic moments (magnetization) between the ferromagnetic bodies $12a$ and $12b$ from the anti-parallel state to the parallel state, the electrons spin-polarized in the same direction as the magnetization direction of the ferromagnetic body $12a$ pass through the tunnel barrier layers $11a$ and $11b$ to impart the spin torque to the ferromagnetic body $12b$.

Accordingly, when the magnetic moments between the ferromagnetic bodies $12a$ and $12b$ are in the anti-parallel state, since the magnetic moment of the ferromagnetic body $12b$ is reversed, the magnetic moments between the ferromagnetic bodies $12a$ and $12b$ become in a parallel state.

When the electrons are injected from the ferromagnetic body $12b$ to the ferromagnetic body $12a$ in reversing the magnetic moments (magnetization) between the ferromagnetic bodies $12a$ and $12b$ from the parallel state to the anti-parallel state, the electrons spin-polarized in the opposite direction to the magnetization direction of the ferromagnetic body $12a$ are reflected and pass through the tunnel barrier layers $11a$ and $11b$ to impart the spin torque to the ferromagnetic body $12b$.

Accordingly, when the magnetic moments between the ferromagnetic bodies $12a$ and $12b$ are in the parallel state, since the magnetic moment of the ferromagnetic body $12b$ is reversed, the magnetic moments between the ferromagnetic bodies $12a$ and $12b$ become in an anti-parallel state.

Thus, the magnetization direction of the ferromagnetic body $12b$ which is of the free layer can be reversed by changing the passage direction of the spin-injection current, so that the writing of "0" and "1" can be performed by the spin injection.

In the case where the ferromagnetic bodies $12a$ and 21 are made of the ferromagnetic material including Co and Fe (for example, Co rich or Fe rich), the non-magnetic body 20 is made of at least one metal selected from a group of Ru, Ir, and Rh or an alloy including at least one metal thereof. The non-magnetic body 20 may include Ni and B.

Figure 23:
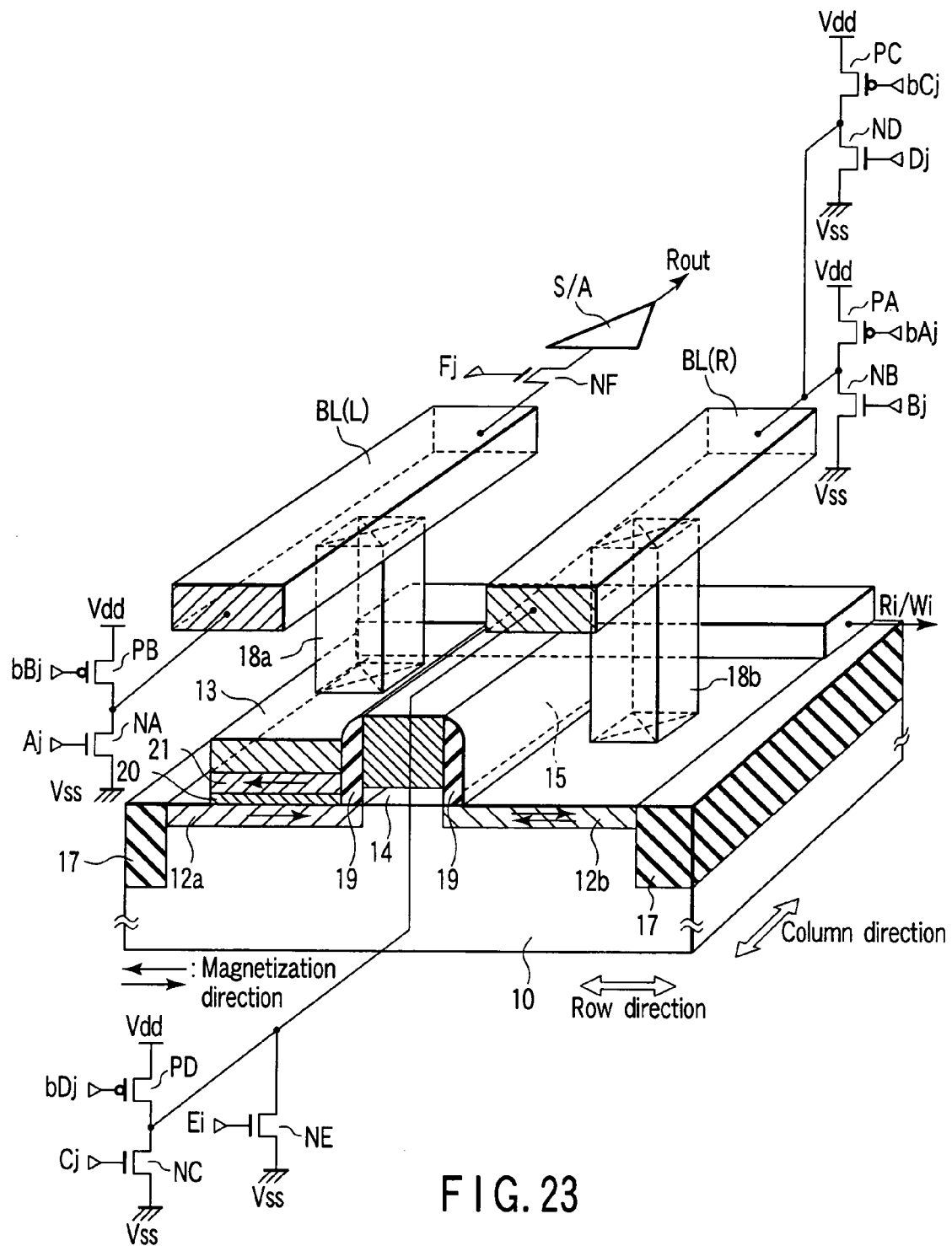
FIG. 23 is a view showing the spin-injection FET according to the fifth embodiment.

The spin-injection FETs of FIGS. 20 and 21 are the tunnel barrier type having the tunnel barrier layers $11a$ and $11b$. As shown in FIGS. 22 and 23, the fifth embodiment can also be applied to the Schottky barrier type.

(6) Sixth Embodiment

A sixth embodiment is also one of improvements of the second embodiment.

A spin-injection FET according to the sixth embodiment includes all the features of the spin-injection FET of the second embodiment.

Figure 25:
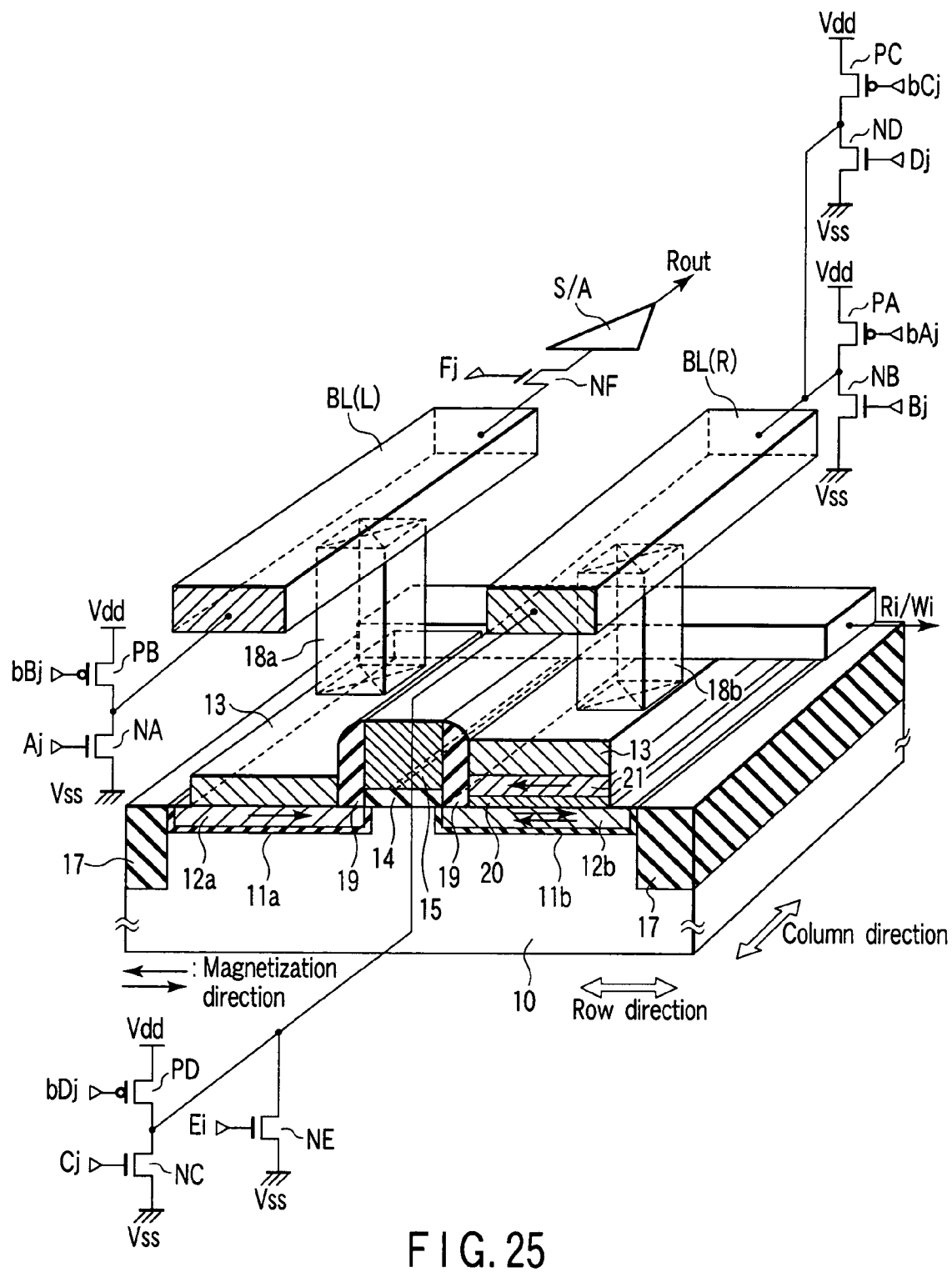
FIG. 25 is a view showing the spin-injection FET according to the sixth embodiment.

In the sixth embodiment, as shown in FIGS. 24 and 25, the pinned layer is also formed on the ferromagnetic body $12b$ which is of the free layer.

That is, the non-magnetic body 20 is formed on the ferromagnetic body $12b$, and the ferromagnetic body 21 is formed on the non-magnetic body 20. The ferromagnetic body 21 is the pinned layer whose magnetization direction is fixed. The anti-ferromagnetic body 13 is formed on the ferromagnetic body 21.

At this point, in the sixth embodiment, the magnetization direction of the ferromagnetic body (pinned layer) $11a$ arranged on one side of the ferromagnetic body $12b$ which is of the free layer and the magnetization direction of the ferromagnetic body (pinned layer) 21 arranged on the other side of the ferromagnetic body 12b are mutually directed to the opposite directions.

From the viewpoint of the device structure, the pinned structure of the sixth embodiment can contribute to current density reduction of the spin-injection current necessary to the magnetization reversal.

In the sixth embodiment, when the electrons are injected from the ferromagnetic body 12a to the ferromagnetic body 12b in reversing the magnetic moments (magnetization) between the ferromagnetic bodies 12a and 12b from the anti-parallel state to the parallel state, the electrons spin-polarized in the same direction as the magnetization direction of the ferromagnetic body 12a pass through the tunnel barrier layers 11a and 11b to impart the spin torque to the ferromagnetic body 12b.

Since the magnetization direction of the ferromagnetic body 21 is directed to the opposite direction to the magnetization direction of the ferromagnetic body 12a, the electrons spin-polarized in the same direction as the magnetization direction of the ferromagnetic body 12a are reflected at the non-magnetic body 20 to impart the spin torque to the ferromagnetic body 12b.

Accordingly, when the magnetic moments between the ferromagnetic bodies 12a and 12b are in the anti-parallel state, since the magnetic moment of the ferromagnetic body 12b is reversed, the magnetic moments between the ferromagnetic bodies 12a and 12b become in a parallel state.

When the electrons are injected from the ferromagnetic body 21 to the ferromagnetic body 12b in reversing the magnetic moments (magnetization) between the ferromagnetic bodies 12a and 12b from the parallel state to the anti-parallel state, the electrons spin-polarized in the same direction as the magnetization direction of the ferromagnetic body 21 impart the spin torque to the ferromagnetic body 12b through the non-magnetic body 20.

When the electrons are moved from the ferromagnetic body 12b toward the ferromagnetic body 12a, while the electrons spin-polarized in the same direction as the magnetization direction of the ferromagnetic body 12a are easily moved to the ferromagnetic body 12a through the tunnel barrier layers 11a and 11b and the channel, the electrons spin-polarized in the opposite direction to the magnetization direction of the ferromagnetic body 12a (electrons spin-polarized in the same direction as the magnetization direction of the ferromagnetic body 21) are reflected to impart the spin torque to the ferromagnetic body 12b.

Accordingly, when the magnetic moments between the ferromagnetic bodies 12a and 12b are in the parallel state, since the magnetic moment of the ferromagnetic body 12b is reversed, the magnetic moments between the ferromagnetic bodies 12a and 12b become in an anti-parallel state.

Thus, the magnetization direction of the ferromagnetic body 12b which is of the free layer can be reversed by changing the passage direction of the spin-injection current, so that the writing of "0" and "1" can be performed by the spin injection.

In order to efficiently reflect the spin polarized electron from the non-magnetic material 20 to further achieve the spin-injection current reduction, it is preferable that the non-magnetic body 20 and the ferromagnetic body 21 are formed by the combination of the following materials.

In the case where the ferromagnetic body 21 is made of the ferromagnetic material including Co (for example, Co rich), the non-magnetic material 20 is made of at least one metal selected from the group of Zr, Hf, Ag, Rh, Cu, and Au, preferably from the group of Zr, Hf, Rh, and Ag or the alloy including at least one metal thereof.

In the case where the ferromagnetic body 21 is made of the ferromagnetic material including Fe (for example, Fe rich), the non-magnetic material 20 is made of at least one metal selected from the group of Rh, Pt, Ir, Al, Ga, Cu, and Au, preferably from the group of Rh, Pt, Ir, Al, and Ga or the alloy including at least one metal thereof.

In the case where the ferromagnetic body 21 is made of the ferromagnetic material including Ni (for example, Ni rich), the non-magnetic material 20 is made of at least one metal selected from the group of Zr, Hf, Au, Ag, and Cu, preferably from the group of Zr, Hf, Au, and Ag or the alloy including at least one metal thereof.

The magnetization directions of the ferromagnetic bodies 12a and 21 are set in mutually opposite directions. Therefore, for example, the anti-ferromagnetic bodies 21 having different Neel temperatures $T_N$ can be added to the ferromagnetic bodies 12a and 21 respectively.

In this case, for example, when the cooling is performed while the magnetic field is applied in one direction after the annealing, one of the magnetization directions of the ferromagnetic bodies 12a and 21 is determined. Then, when the cooling is further performed while the magnetic field is applied in the opposite direction, the other magnetization direction of the ferromagnetic bodies 12a and 21 is determined.

In order to set the magnetization directions of the ferromagnetic bodies 12a and 21 at angles of 180 degrees in mutually opposite directions without using an annealing process, the ferromagnetic bodies 12a and 21 are formed by the SAF structure described in the fifth embodiment, i.e. by the three-layer structure of ferromagnetic body/non-magnetic material/ferromagnetic body.

However, only one of the ferromagnetic bodies 12a and 21 can be formed by the SAF structure.

It is also possible that the SAF structure is a multi-layered structure of ferromagnetic body/non-magnetic material/ferromagnetic body/non-magnetic material/ . . . /ferromagnetic body.

Figure 26:
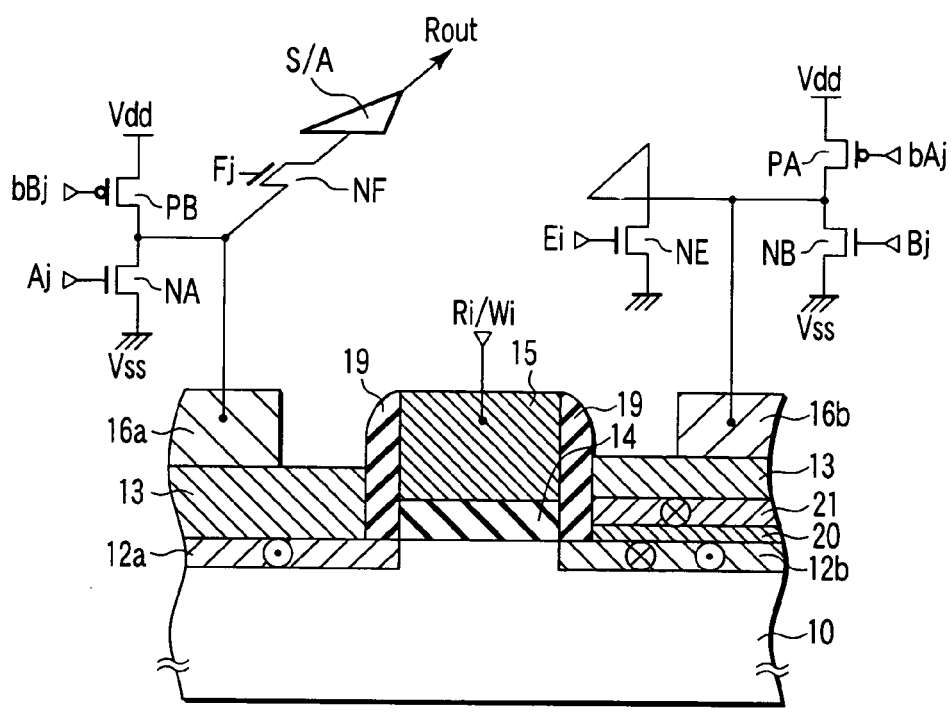
FIG. 26 is a view showing the spin-injection FET according to the sixth embodiment.
Figure 27:
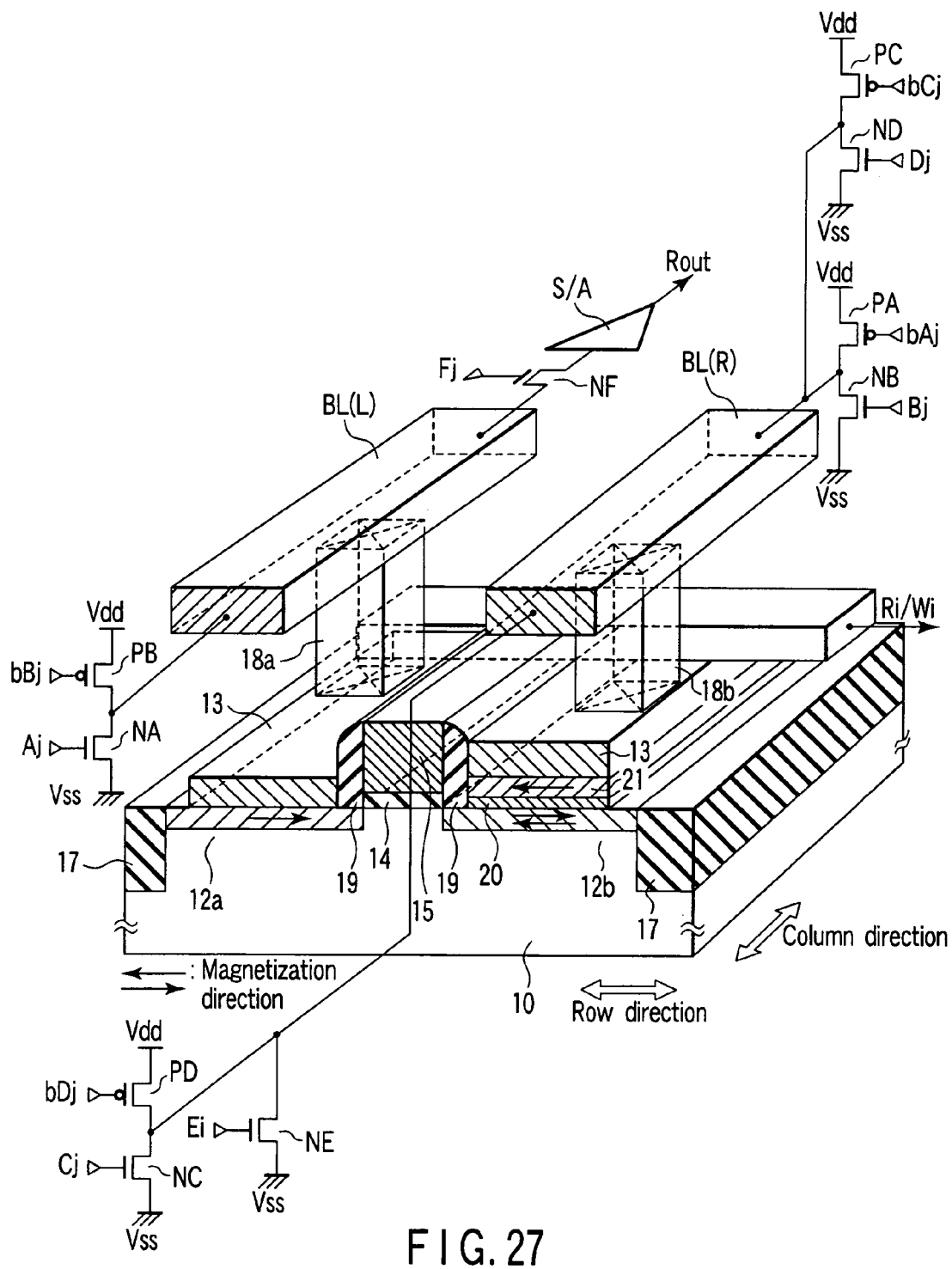
FIG. 27 is a view showing the spin-injection FET according to the sixth embodiment.

The spin-injection FETs of FIGS. 24 and 25 are the tunnel barrier type having the tunnel barrier layers 11a and 11b. As shown in FIGS. 26 and 27, the sixth embodiment can also be applied to the Schottky barrier type.

(7) Seventh Embodiment

A seventh embodiment is one of the modifications of the fifth embodiment.

Figure 28:
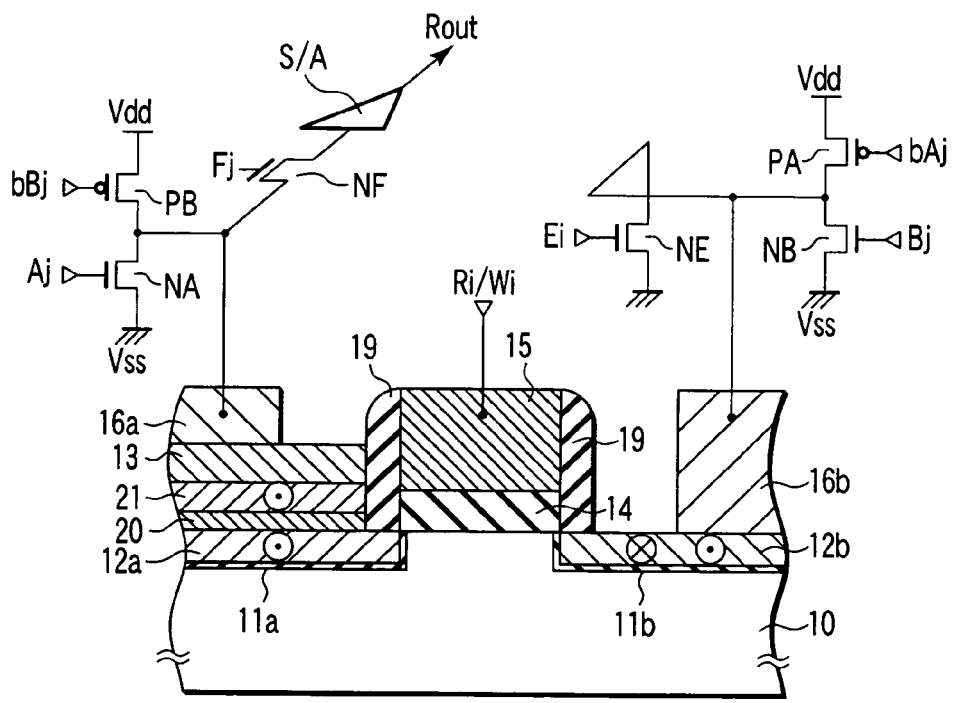
FIG. 28 is a view showing a spin-injection FET according to a seventh embodiment.
Figure 29:
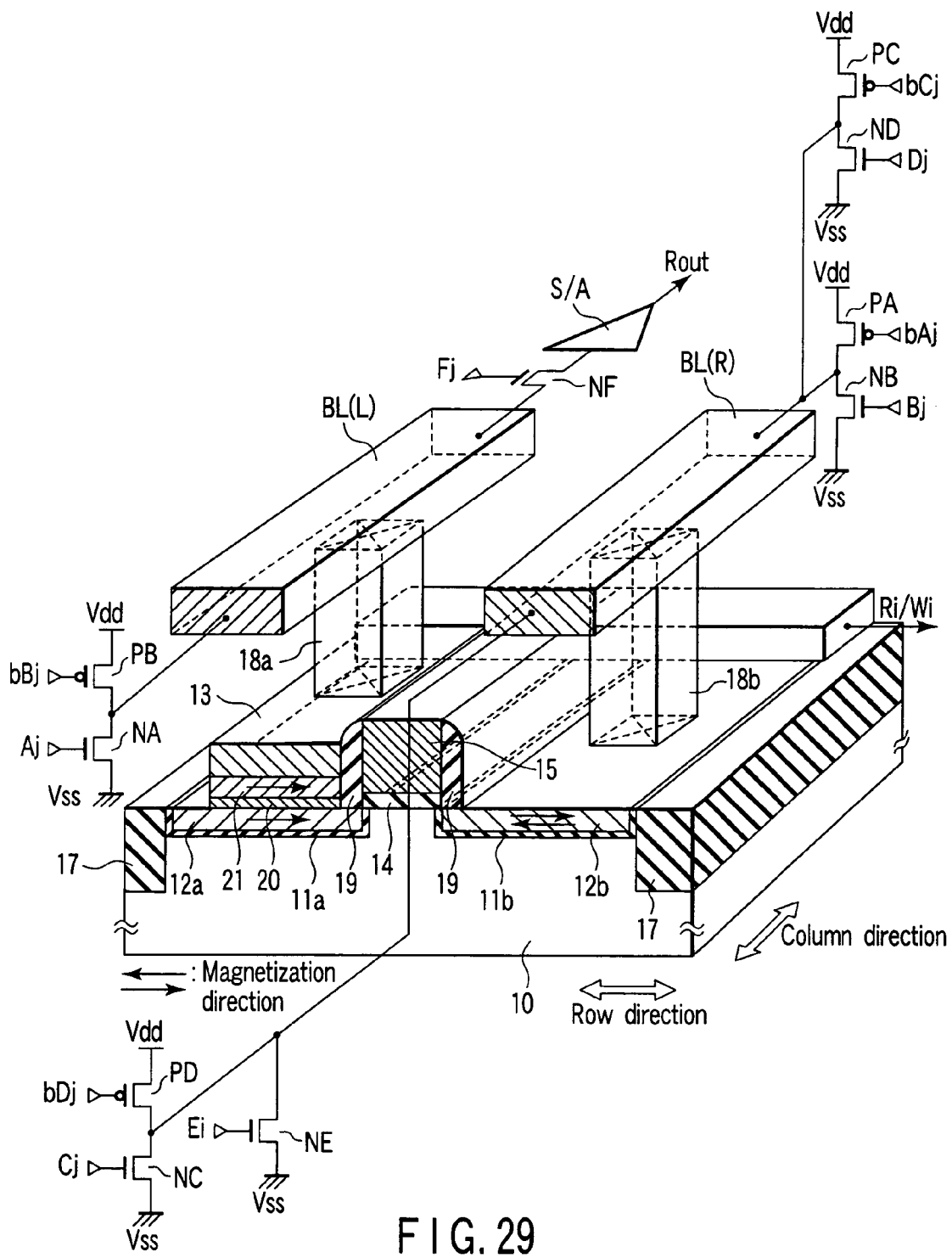
FIG. 29 is a view showing the spin-injection FET according to the seventh embodiment.

While the magnetization directions of the ferromagnetic bodies 12a and 21 are strongly fixed in mutually opposite directions in the fifth embodiment, as shown in FIGS. 28 and 29, the magnetization directions of the ferromagnetic bodies 12a and 21 are strongly fixed in the same direction by the ferromagnetic bond in the seventh embodiment.

Other structures of the seventh embodiment are similar to the fifth embodiment.

In a spin-injection FET according to the seventh embodiment, the magnetization direction of the pinned layer can be stabilized in the writing.

In the seventh embodiment, when the electrons are injected from the ferromagnetic body 12a to the ferromagnetic body 12b in reversing magnetic moments (magnetization) between the ferromagnetic bodies 12a and 12b from the anti-parallel state to the parallel state, the electrons spin-polarized in the same direction as the magnetization direction of the ferromagnetic body 12a pass through the tunnel barrier layers 11a and 11b to impart the spin torque to the ferromagnetic body 12b.

Accordingly, when the magnetic moments between the ferromagnetic bodies 12a and 12b are in the anti-parallel state, since the magnetic moment of the ferromagnetic body 12b is reversed, the magnetic moments between the ferromagnetic bodies 12a and 12b become in a parallel state.

When the electrons are injected from the ferromagnetic body 12b to the ferromagnetic body 12a in reversing the magnetic moments (magnetization) between the ferromagnetic bodies 12a and 12b from the parallel state to the anti-parallel state, the electrons spin-polarized in the opposite direction to the magnetization direction of the ferromagnetic body 12a are reflected and pass through the tunnel barrier layers 11a and 11b to impart the spin torque to the ferromagnetic body 12b.

Accordingly, when the magnetic moments between the ferromagnetic bodies 12a and 12b are in the parallel state, since the magnetic moment of the ferromagnetic body 12b is reversed, the magnetic moments between the ferromagnetic bodies 12a and 12b become in an anti-parallel state.

Thus, the magnetization direction of the ferromagnetic body 12b which is of the free layer can be reversed by changing the passage direction of the spin-injection current, so that the writing of "0" and "1" can be performed by the spin injection.

In the case where the ferromagnetic bodies 12a and 21 are made of the ferromagnetic material including Co and Fe (for example, Co rich or Fe rich), the non-magnetic body 20 is made of at least one metal selected from a group of Pt, Ir, and Ru or an alloy including at least one metal thereof. The non-magnetic body 20 may include Ni and B.

Figure 30:
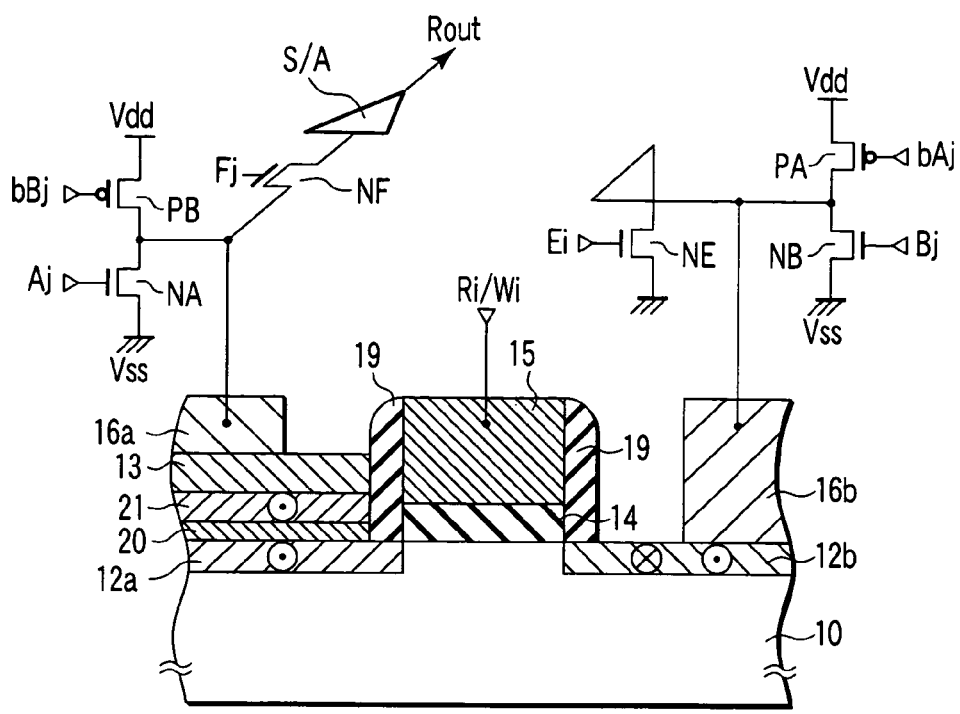
FIG. 30 is a view showing the spin-injection FET according to the seventh embodiment.
Figure 31:
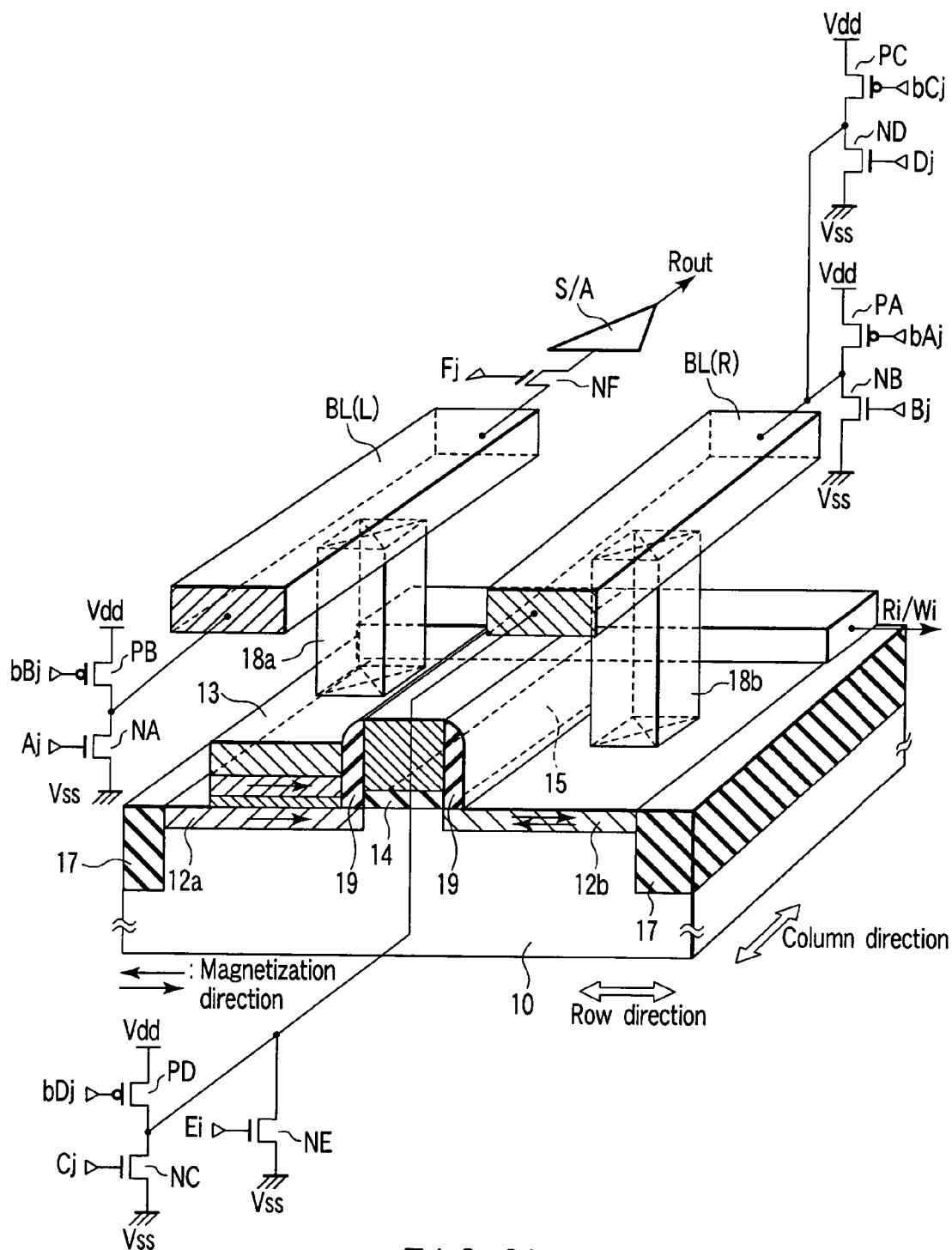
FIG. 31 is a view showing the spin-injection FET according to the seventh embodiment.

The spin-injection FETs of FIGS. 28 and 29 are the tunnel barrier type having the tunnel barrier layers 11a and 11b. As shown in FIGS. 30 and 31, the seventh embodiment can also be applied to the Schottky barrier type.

(8) Eighth Embodiment

An eighth embodiment is one of the modifications of the sixth embodiment.

Figure 32:
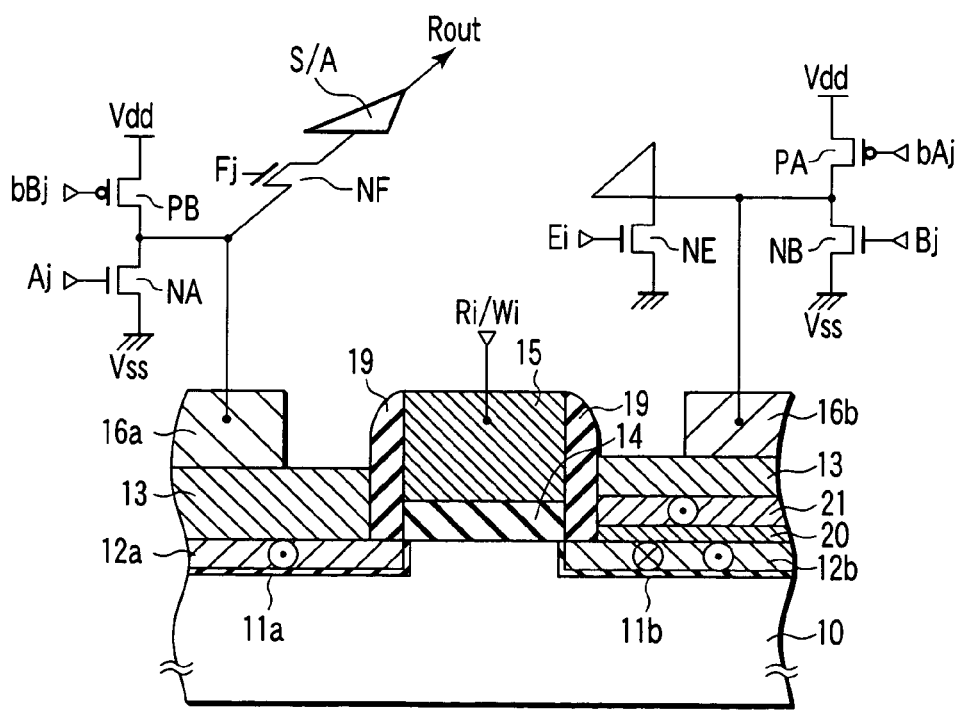
FIG. 32 is a view showing a spin-injection FET according to an eighth embodiment.
Figure 33:
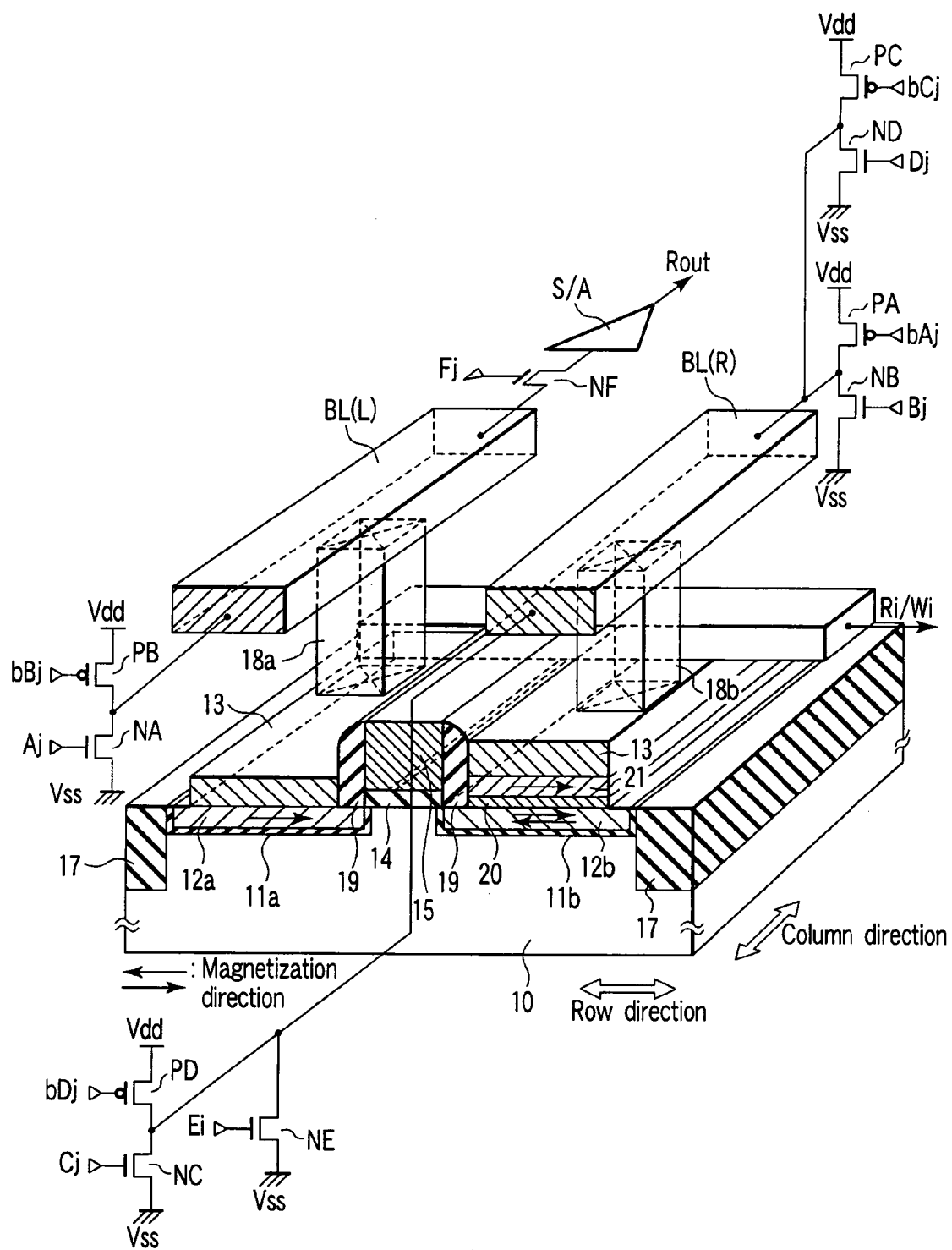
FIG. 33 is a view showing the spin-injection FET according to the eighth embodiment.

While the magnetization directions of the two pinned layers, i.e. the ferromagnetic bodies 12a and 21 are set in mutually opposite directions in the sixth embodiment, as shown in FIGS. 32 and 33, the magnetization directions of the ferromagnetic bodies 12a and 21 are set in the same direction in the eighth embodiment.

Other structures of the eighth embodiment are similar to the sixth embodiment.

From the viewpoint of the device structure, the spin-injection FET of the eighth embodiment can also reduce the current density the spin-injection current necessary to the magnetization reversal.

In the eighth embodiment, when the electrons are injected from the ferromagnetic body 12a to the ferromagnetic body 12b in reversing the magnetic moments (magnetization) between the ferromagnetic bodies 12a and 12b from the anti-parallel state to the parallel state, the electrons spin-polarized in the same direction as the magnetization direction of the ferromagnetic body 12a pass through the tunnel barrier layers 11a and 11b to impart the spin torque to the ferromagnetic body 12b.

the electrons spin-polarized in the same direction as the magnetization direction of the ferromagnetic body 12a are reflected at the non-magnetic body 20 to impart the spin torque to the ferromagnetic body 12b by appropriately selecting the materials for the non-magnetic body 20 and the ferromagnetic body 21.

Accordingly, when the magnetic moments between the ferromagnetic bodies 12a and 12b are in the anti-parallel state, since the magnetic moment of the ferromagnetic body 12b is reversed, the magnetic moments between the ferromagnetic bodies 12a and 12b become in a parallel state.

When the electrons are injected from the ferromagnetic body 21 to the ferromagnetic body 12b in reversing the magnetic moments (magnetization) between the ferromagnetic bodies 12a and 12b from the parallel state to the anti-parallel state, the electrons spin-polarized in the opposite direction to the magnetization direction of the ferromagnetic body 21 impart the spin torque to the ferromagnetic body 12b through the non-magnetic body 20 by appropriately selecting the materials for the non-magnetic body 20 and the ferromagnetic body 21.

When the electrons are moved from the ferromagnetic body 12b toward the ferromagnetic body 12a, while the electrons spin-polarized in the same direction as the magnetization direction of the ferromagnetic body 12a are easily moved to the ferromagnetic body 12a through the tunnel barrier layers 11a and 11b and the channel, the electrons spin-polarized in the opposite direction to the magnetization direction of the ferromagnetic body 12a (electrons spin-polarized in the opposite direction to the magnetization direction of the ferromagnetic body 21) are reflected to impart the spin torque to the ferromagnetic body 12b.

Accordingly, when the magnetic moments between the ferromagnetic bodies 12a and 12b are in the parallel state, since the magnetic moment of the ferromagnetic body 12b is reversed, the magnetic moments between the ferromagnetic bodies 12a and 12b become in an anti-parallel state.

Thus, the magnetization direction of the ferromagnetic body 12b which is of the free layer can be reversed by changing the passage direction of the spin-injection current, so that the writing of "0" and "1" can be performed by the spin injection.

In order to efficiently reflect the spin polarized electron from the non-magnetic material 20 to further achieve the spin-injection current reduction, it is preferable that the non-magnetic body 20 and the ferromagnetic body 21 are formed by the combination of the following materials.

In the case where the ferromagnetic body 21 is made of the ferromagnetic material including Co (for example, Co rich), the non-magnetic material 20 is made of at least one metal selected from the group of Cr, Ir, Os, Ru, and Re, preferably from the group of Cr, Ir, and Os or the alloy including at least one metal thereof.

In the case where the ferromagnetic body 21 is made of the ferromagnetic material including Fe (for example, Fe rich), the non-magnetic material 20 is made of at least one metal selected from the group of, Mn, Cr, V, Mo, Re, Ru, Os, W, and Ti, preferably from the group of Mn, Cr, V, Mo, and Re or the alloy including at least one metal thereof.

In the case where the ferromagnetic body 21 is made of the ferromagnetic material including Ni (for example, Ni rich), the non-magnetic material 20 is made of at least one metal selected from the group of Rh, Ru, Ir, Os, Cr, Re, W, Nb, V, Ta, and Mo, preferably from the group of Rh, Ru, Ir, and Os or the alloy including at least one metal thereof.

Figure 34:
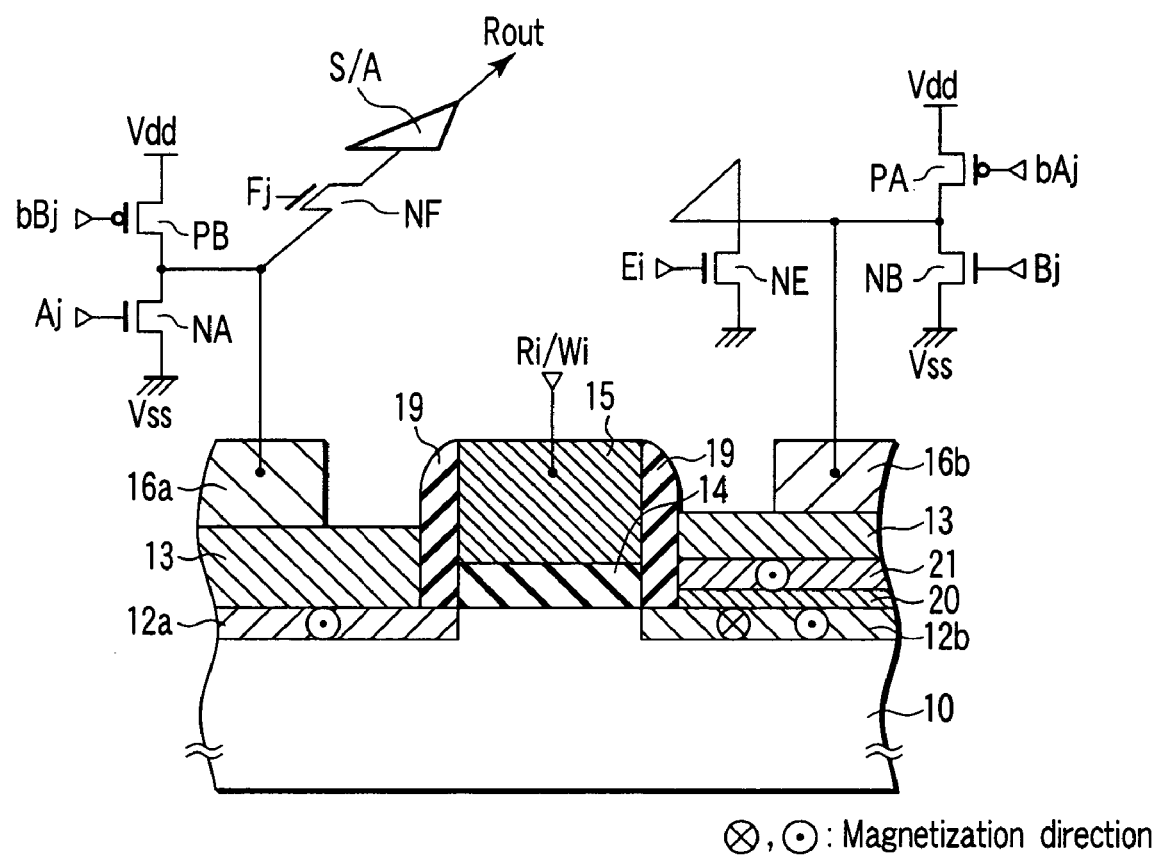
FIG. 34 is a view showing the spin-injection FET according to the eighth embodiment.
Figure 35:
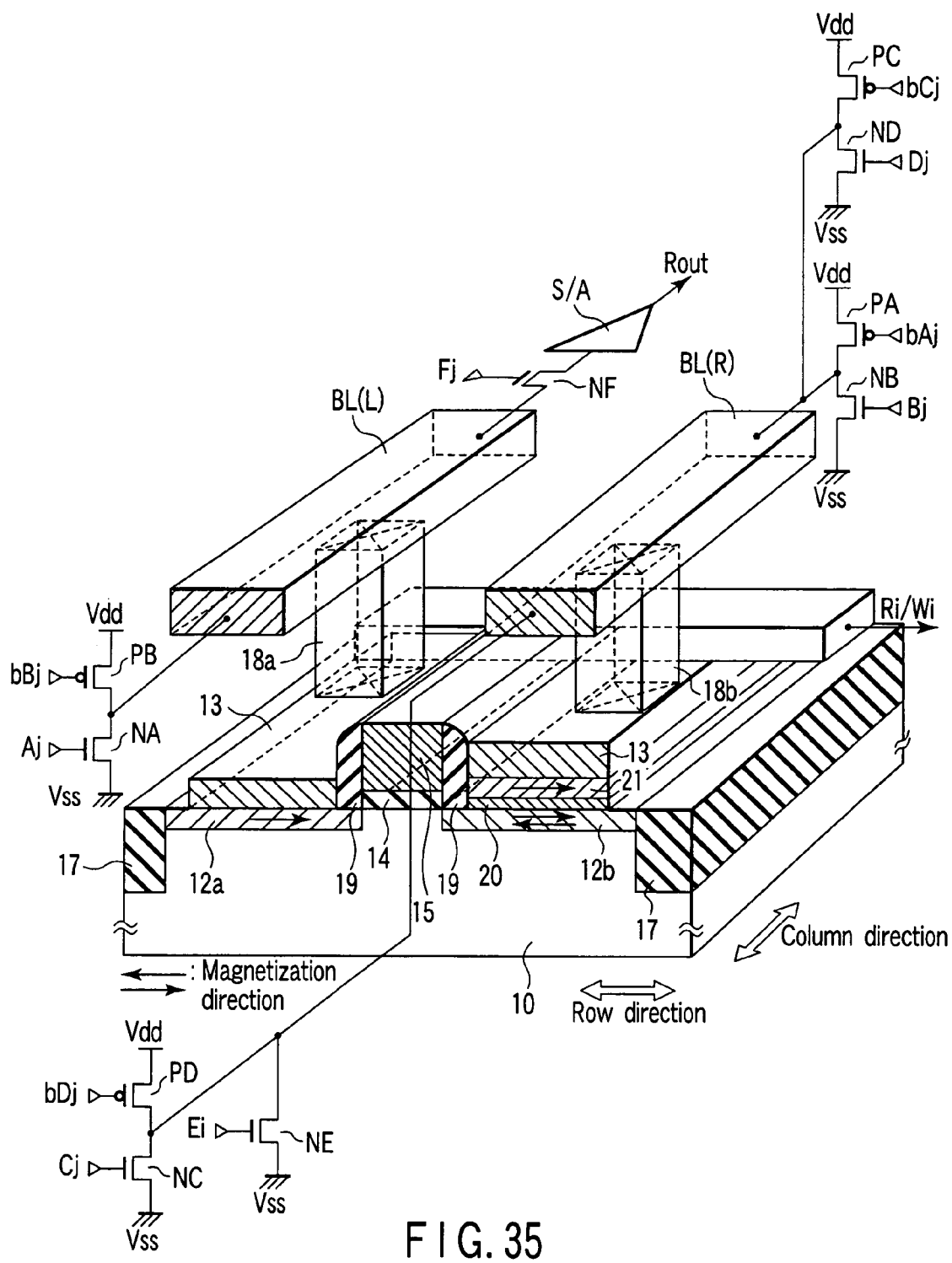
FIG. 35 is a view showing the spin-injection FET according to the eighth embodiment.

The spin-injection FETs of FIGS. 32 and 33 are the tunnel barrier type having the tunnel barrier layers 11a and 11b. As shown in FIGS. 34 and 35, the eighth embodiment can also be applied to the Schottky barrier type.

(9) Ninth Embodiment

A ninth embodiment is one of the improvements of the first embodiment.

In the ninth embodiment, the writing technology according to the embodiment in which the assist magnetic field is used is incorporated with the so-called yoke wiring technology, and thereby the assist magnetic field is efficiently imparted to the ferromagnetic body which is of the free layer and both the assist current reduction and the spin-injection current reduction are achieved.

Figure 36:
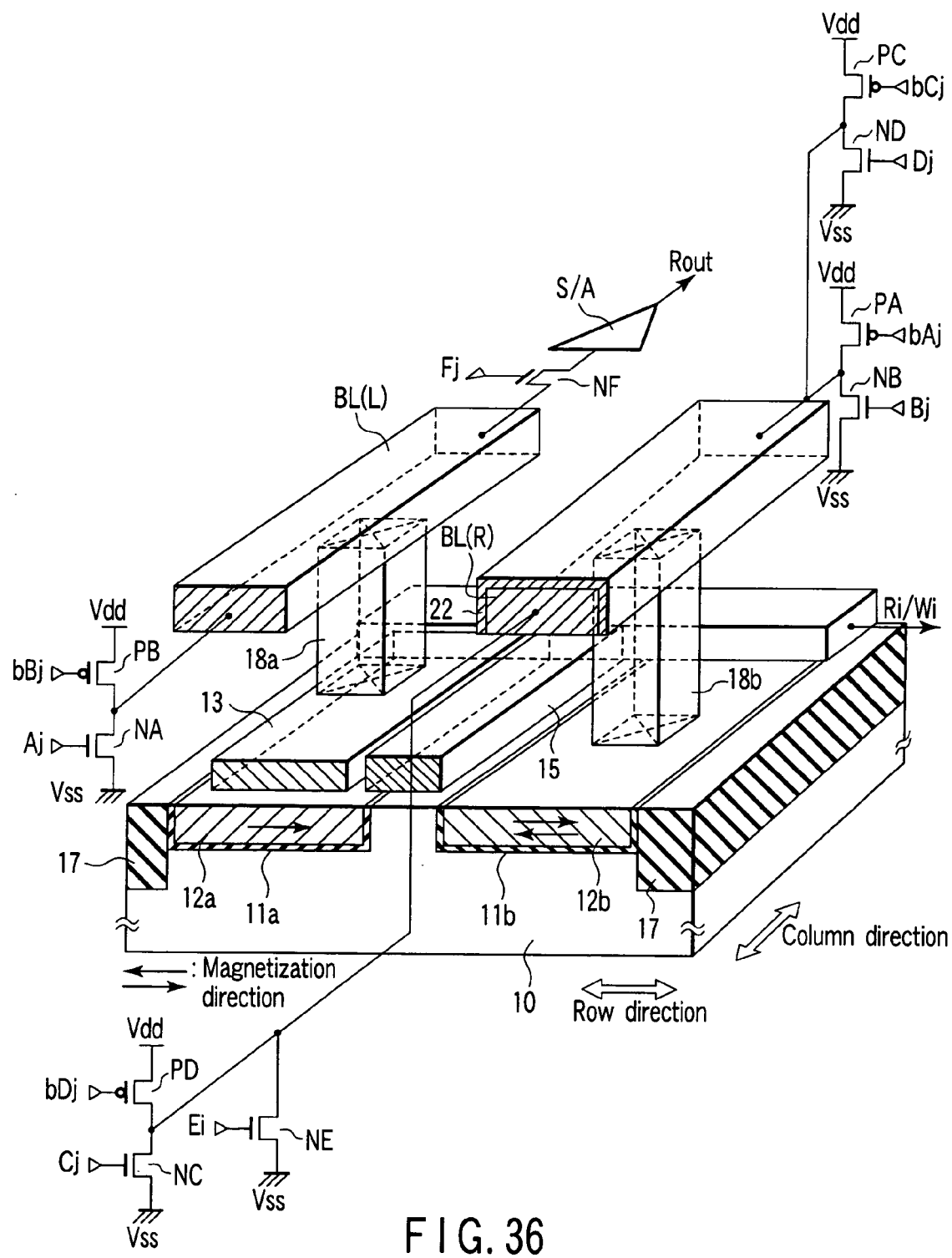
FIG. 36 is a view showing a spin-injection FET according to a ninth embodiment.

Specifically, as shown in FIGS. 36 and 37, the bit line BL(R) for passing the assist current is covered with a soft magnetic material (yoke material) 22, e.g. permalloy. In the ninth embodiment, since the bit line BL(R) is arranged above the ferromagnetic body 12b which is of the free layer, the soft magnetic material 22 is formed such that the upper face and the side surface of the bit line BL(R) are covered therewith.

Other structures of the ninth embodiment are similar to the first embodiment.

The soft magnetic material 22 can also prevent the reverse affection of magnetic leakage because the soft magnetic material 22 plays a role in causing the assist magnetic field, generated by the assist current, to converge to efficiently impart the assist magnetic field to the ferromagnetic body 12b.

According to the yoke wiring technology, the assist current for generating the assist magnetic field can be set at a small value, specifically at values not more than 0.5 mA.

When the spin-injection FET of the ninth embodiment is applied to the re-configurable logic circuit, the sense amplifier S/A and the N-channel MIS transistors NE and NF can be neglected in FIGS. 36 and 37.

Further, in the ninth embodiment, the materials, the dimensions, and the like of the spin-injection FET are similar to those of the first embodiment, so that the descriptions will be neglected.

(10) Tenth Embodiment

A tenth embodiment is one of the modifications of the first embodiment.

The tenth embodiment differs from the first embodiment in the direction of the spin-injection FET.

Figure 38:
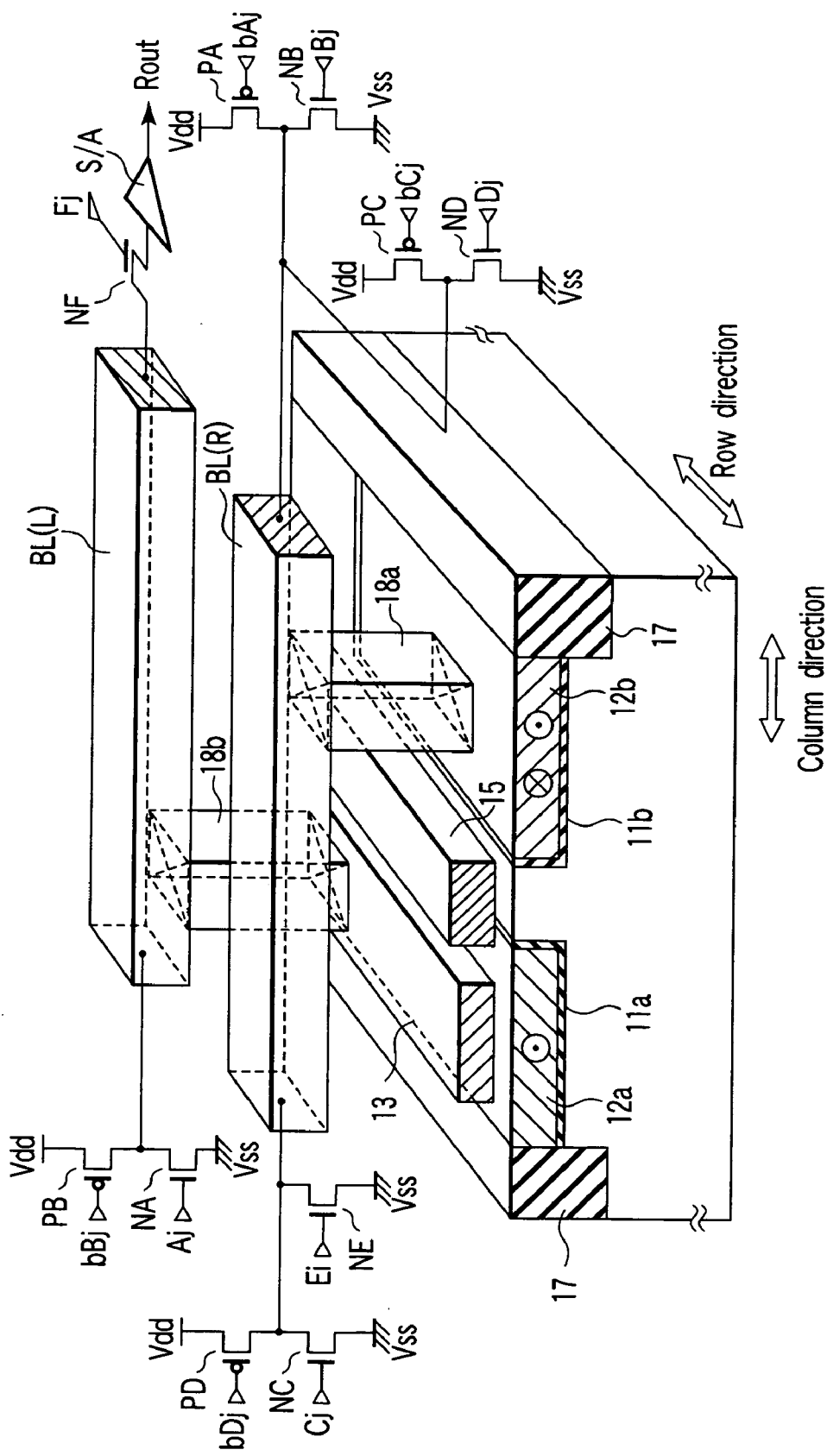
FIG. 38 is a view showing a spin-injection FET according to a tenth embodiment.

FIG. 38 shows a structure of a spin-injection FET according to the tenth embodiment.

The element separation insulating layer 17 having, e.g. the STI structure is formed in the semiconductor substrate 10. The spin-injection FET is formed in the area surrounded by the element separation insulating layer 17.

The spin-injection FET includes the ferromagnetic bodies 12a and 12b, the tunnel barrier layers 11a and 11b, the gate electrode 15, and the anti-ferromagnetic body 13. The ferromagnetic bodies 12a and 12b are of the source/drain electrodes embedded in the recesses in the semiconductor substrate 10. The tunnel barrier layers 11a and 11b are located between the semiconductor substrate 10 and the ferromagnetic bodies 12a and 12b respectively. The gate electrode 15 is arranged on the channel between the ferromagnetic bodies 12a and 12b through the gate insulating layer. The anti-ferromagnetic body 13 is located on the ferromagnetic body 12a.

The magnetization easy axis directions of the ferromagnetic bodies 12a and 12b are set in the row direction. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

The memory cell array is formed by arranging the plural spin-injection FETs in a collective manner.

The gate electrode 15 of the spin-injection FET functions as the word line extending in the row direction of the memory cell array. The control signal Ri/Wi for selecting the ith row is supplied to the word line in the readout/writing.

The bit line BL(L) extends in the column direction of the memory cell array, and the bit line BL(L) is connected to the anti-ferromagnetic body 13 through the contact plug 18a.

One end of the bit line BL(L) is connected to the sense amplifier S/A through the N-channel MIS transistor NF which is of the column selection switch for selecting the jth column. The control signal Fj for selecting the jth column is inputted to the gate of the N-channel MIS transistor NF.

The other end of the bit line BL(L) is connected to the P-channel MIS transistor PB and the N-channel MIS transistor NA which are of the driver/sinker for controlling the generation/cutoff of the spin-injection current. The control signal bBj is inputted to the gate of the P-channel MIS transistor PB, and the control signal Aj is inputted to the gate of the N-channel MIS transistor NA.

The bit line BL(R) extends in the column direction of the memory cell array, and the bit line BL(R) is connected to the ferromagnetic body 12b through the contact plug 18b.

The bit line BL(R) is arranged near the ferromagnetic body 12b which is of the free layer. In the tenth embodiment, the bit line BL(R) is arranged above the ferromagnetic body 12b. Both the spin-injection current and the assist current are passed through the bit line BL(R). The spin-injection current generates spin-injection magnetization reversal in the writing, and the assist current generates the assist magnetic field in the magnetization easy axis direction of the free layer.

One end of the bit line BL(R) is connected to the P-channel MIS transistor PA and the N-channel MIS transistor NB which are of the driver/sinker for controlling the generation/cutoff of the spin-injection current. The control signal bAj is inputted to the gate of the P-channel MIS transistor PA, and the control signal Bj is inputted to the gate of the N-channel MIS transistor NB.

Further, one end of the bit line BL(R) is connected to the P-channel MIS transistor PC and the N-channel MIS transistor ND which are of the driver/sinker for controlling the generation/cutoff of the assist current generating the assist magnetic field. The control signal bCj is inputted to the gate of the P-channel MIS transistor PC, and the control signal Dj is inputted to the gate of the N-channel MIS transistor ND.

The other end of the bit line BL(R) is connected to the P-channel MIS transistor PD and the N-channel MIS transistor NC which are of the driver/sinker for controlling the generation/cutoff of the assist current generating the assist magnetic field. The control signal bDj is inputted to the gate of the P-channel MIS transistor PD, and the control signal Cj is inputted to the gate of the N-channel MIS transistor NC.

Further, the other end of the bit line BL(R) is connected to the ground point Vss through the N-channel MIS transistor NE. The control signal Ei is inputted to the gate of the N-channel MIS transistor NE.

According to the spin-injection FET of the tenth embodiment, in the writing, the driver/sinker supplies the spin-injection current necessary to the magnetization reversal (switching). At the same time, the driver/sinker supplies the assist current which generates the assist magnetic field in the magnetization easy axis direction of the free layer to suppress the thermal disturbance.

Accordingly, the spin-injection FET, in which the thermal stability is excellent, the fluctuation in characteristics of the element is eliminated, and the element breakage problem is solved, can be provided.

In the tenth embodiment, the materials, the dimensions, and the like of the spin-injection FET are similar to those of the first embodiment, so that the descriptions will be neglected.

In the tenth embodiment, the spin-injection FET is the tunnel barrier type FET having the tunnel barrier layers 11a and 11b. However, it is also possible to neglect one of or both the tunnel barrier layers 11a and 11b.

For example, it is possible that both the tunnel barrier layers 11a and 11b in the spin-injection FET of FIG. 38 are neglected to form the Schottky barrier type spin-injection FET shown in FIG. 39.

When the spin-injection FET of the tenth embodiment is applied to the re-configurable logic circuit, the sense amplifier S/A and the N-channel MIS transistors NE and NF can be neglected in FIGS. 38 and 39.

(11) Eleventh Embodiment

In the first to tenth embodiments, a part of the spin-injection current path and a part of the assist current path overlap each other. On the other hand, an eleventh embodiment proposes a structure in which the spin-injection current path and the assist current path are completely separated from each other.

Figure 40:
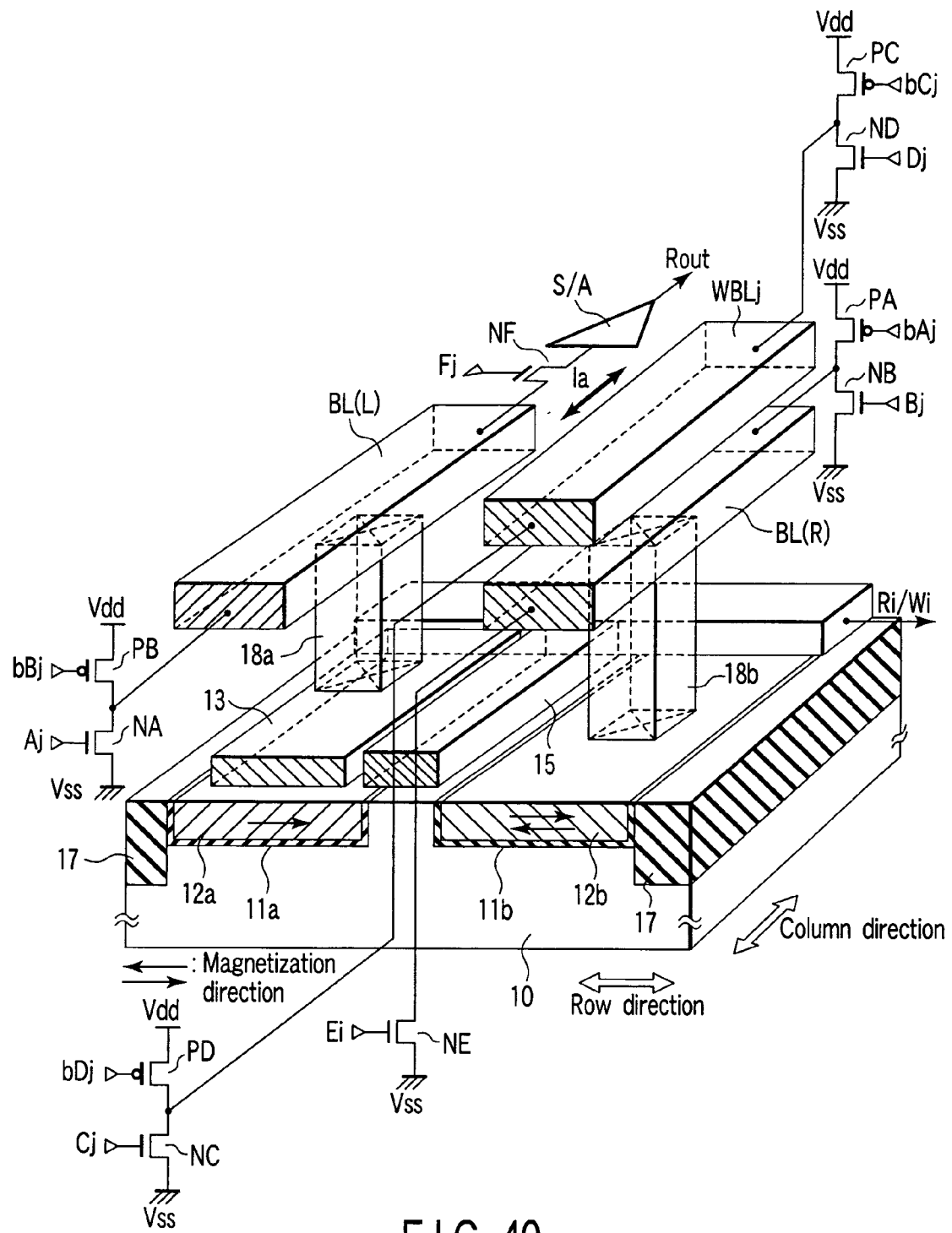
FIG. 40 is a view showing a spin-injection FET according to an eleventh embodiment.

FIG. 40 shows a structure of a spin-injection FET according to the eleventh embodiment.

The element separation insulating layer 17 having, e.g. the STI structure is formed in the semiconductor substrate 10. The spin-injection FET is formed in the area surrounded by the element separation insulating layer 17.

The spin-injection FET includes the ferromagnetic bodies 12a and 12b, the tunnel barrier layers 11a and 11b, the gate electrode 15, and the anti-ferromagnetic body 13. The ferromagnetic bodies 12a and 12b are of the source/drain electrodes embedded in the recesses in the semiconductor substrate 10. The tunnel barrier layers 11a and 11b are located between the semiconductor substrate 10 and the ferromagnetic bodies 12a and 12b respectively. The gate electrode 15 is arranged on the channel between the ferromagnetic bodies 12a and 12b through the gate insulating layer. The anti-ferromagnetic body 13 is located on the ferromagnetic body 12a.

The magnetization easy axis directions of the ferromagnetic bodies 12a and 12b are set in the row direction. The ferromagnetic body 12a becomes the pinned layer whose magnetization direction is fixed by the anti-ferromagnetic body 13, and the ferromagnetic body 12b becomes the free layer whose magnetization direction is changed by the spin-injection current.

The memory cell array is formed by arranging the plural spin-injection FETs in a collective manner.

The gate electrode 15 of the spin-injection FET functions as the word line extending in the row direction of the memory cell array. The control signal Ri/Wi for selecting the ith row is supplied to the word line in the readout/writing.

The bit line BL(L) extends in the column direction of the memory cell array, and the bit line BL(L) is connected to the anti-ferromagnetic body 13 through the contact plug 18a.

One end of the bit line BL(L) is connected to the sense amplifier S/A through the N-channel MIS transistor NF which is of the column selection switch for selecting the jth column. The control signal Fj for selecting the jth column is inputted to the gate of the N-channel MIS transistor NF.

The other end of the bit line BL(L) is connected to the P-channel MIS transistor PB and the N-channel MIS transistor NA which are of the driver/sinker for controlling the generation/cutoff of the spin-injection current. The control signal bBj is inputted to the gate of the P-channel MIS transistor PB, and the control signal Aj is inputted to the gate of the N-channel MIS transistor NA.

The bit line BL(R) extends in the column direction of the memory cell array, and the bit line BL(R) is connected to the ferromagnetic body 12b through the contact plug 18b.

One end of the bit line BL(R) is connected to the P-channel MIS transistor PA and the N-channel MIS transistor NB which are of the driver/sinker for controlling the generation/cutoff of the spin-injection current. The control signal bAj is inputted to the gate of the P-channel MIS transistor PA, and the control signal Bj is inputted to the gate of the N-channel MIS transistor NB.

The other end of the bit line BL(R) is connected to the ground point Vss through the N-channel MIS transistor NE. The control signal Ei is inputted to the gate of the N-channel MIS transistor NE.

A writing bit line WBLj is arranged above the bit line BL(R), and the assist current Ia is passed through the writing bit line WBLj.

Similarly to the bit line BL(R), the writing bit line WBLj extends in the column direction of the memory cell array.

One end of the writing bit line WBLj is connected to the P-channel MIS transistor PC and the N-channel MIS transistor ND which are of the driver/sinker for controlling the generation/cutoff of the assist current Ia generating the assist magnetic field. The control signal bCj is inputted to the gate of the P-channel MIS transistor PC, and the control signal Dj is inputted to the gate of the N-channel MIS transistor ND.

The other end of the writing bit line WBLj is connected to the P-channel MIS transistor PD and the N-channel MIS transistor NC which are of the driver/sinker for controlling the generation/cutoff of the assist current Ia generating the assist magnetic field. The control signal bDj is inputted to the gate of the P-channel MIS transistor PD, and the control signal Cj is inputted to the gate of the N-channel MIS transistor NC.

According to the spin-injection FET of the eleventh embodiment, in the writing, the driver/sinker supplies the spin-injection current necessary to the magnetization reversal (switching). At the same time, the driver/sinker supplies the assist current which generates the assist magnetic field in the magnetization easy axis direction of the free layer to suppress the thermal disturbance.

Accordingly, the spin-injection FET, in which the thermal stability is excellent, the fluctuation in characteristics of the element is eliminated, and the element breakage problem is solved, can be provided.

The spin-injection FET of FIG. 40 corresponds to the case in which the writing bit line WBLj is newly provided in the spin-injection FET of FIG. 9.

Figure 41:
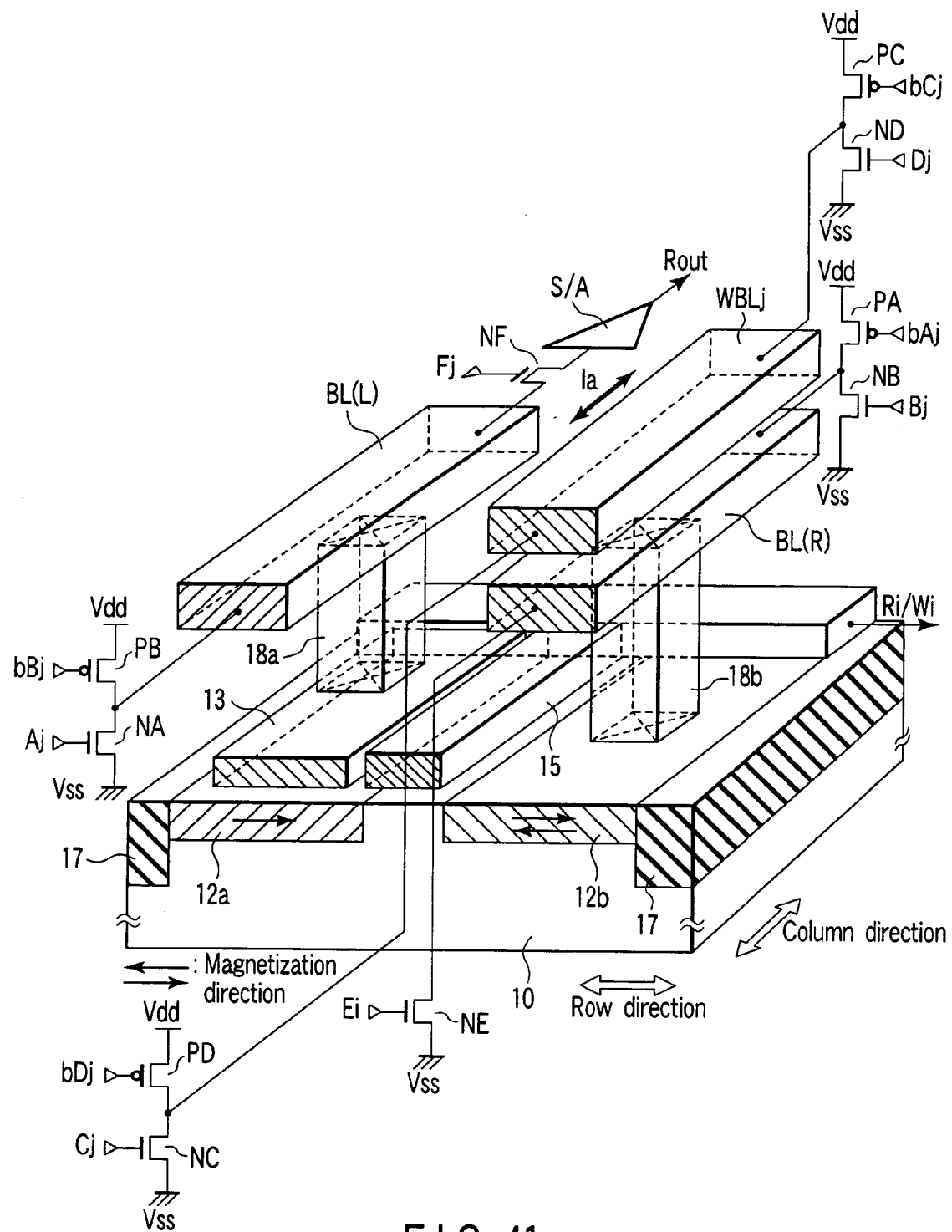
FIG. 41 is a view showing the spin-injection FET according to the eleventh embodiment.

Similarly the spin-injection FET of FIG. 41 is the Schottky barrier type spin-injection FET, and the spin-injection FET of FIG. 41 corresponds to the case in which the writing bit line WBLj is newly provided in the spin-injection FET of FIG. 10.

Figure 42:
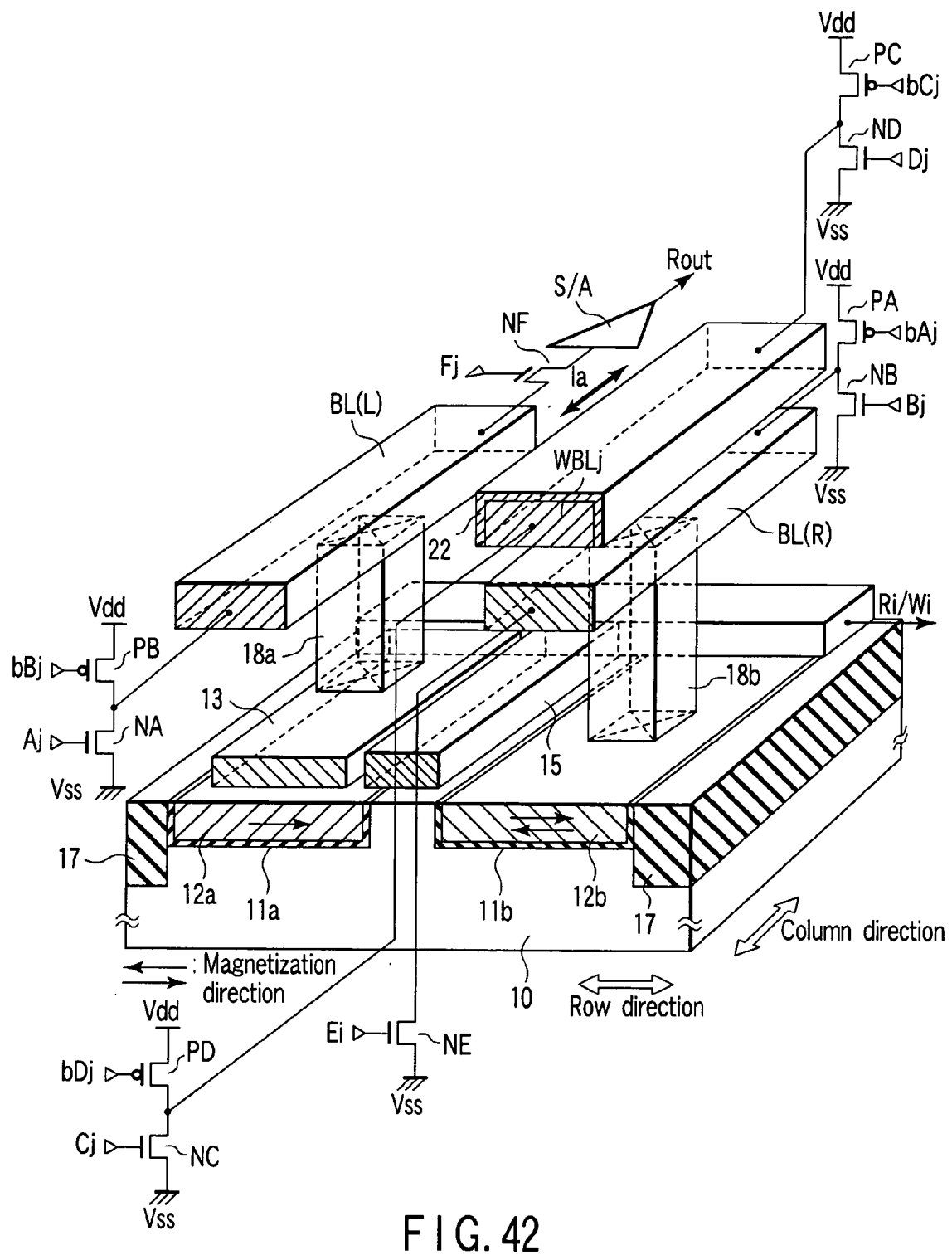
FIG. 42 is a view showing the spin-injection FET according to the eleventh embodiment.
Figure 43:
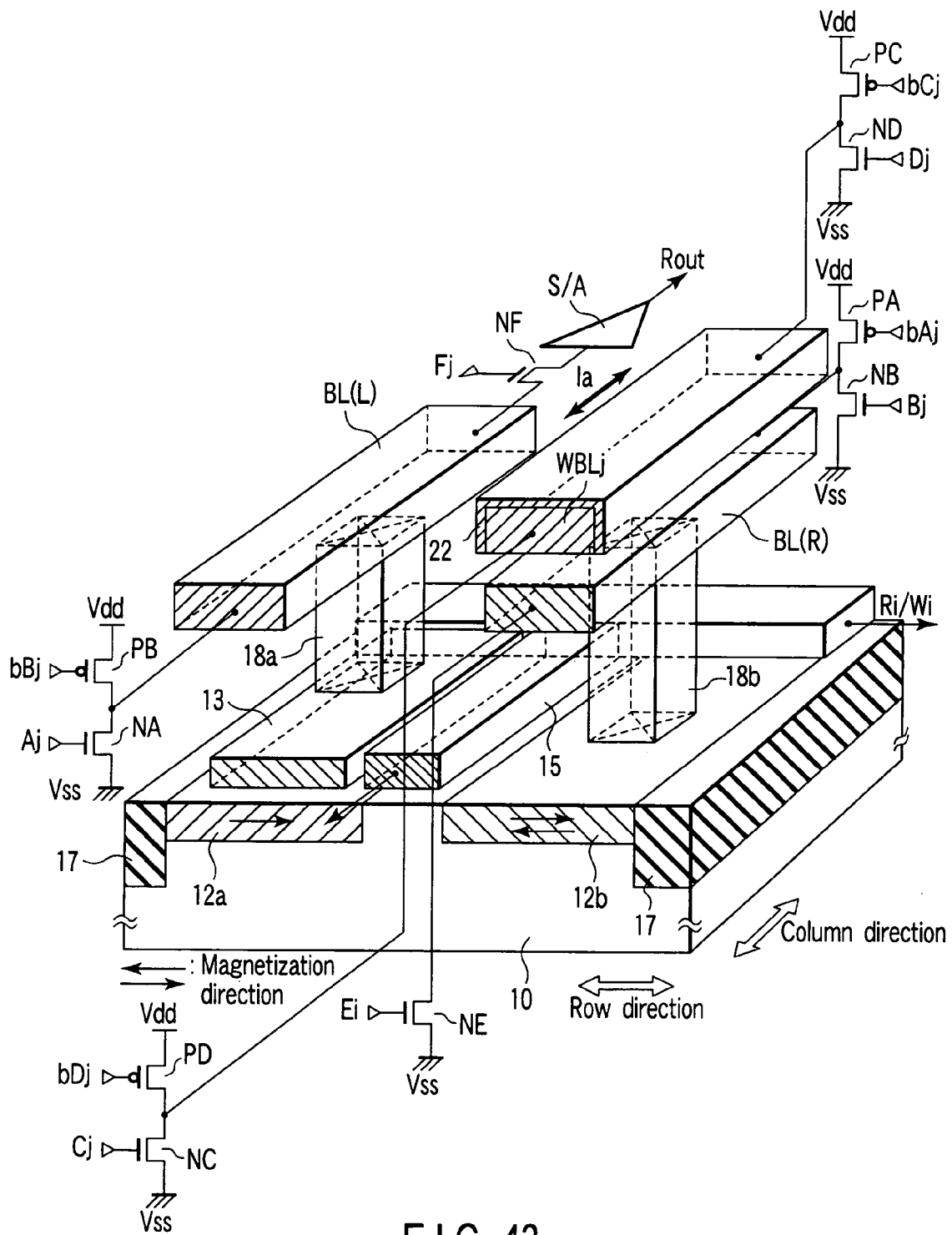
FIG. 43 is a view showing the spin-injection FET according to the eleventh embodiment.

The spin-injection FET of FIG. 42 is the case in which the yoke wiring technology is applied to the writing bit line WBLj of FIG. 40. The spin-injection FET of FIG. 43 is the case in which the yoke wiring technology is applied to the writing bit line WBLj of FIG. 41. In FIGS. 42 and 43, the numeral 22 designates the soft magnetic material (yoke material) with which the writing bit line WBLj is covered.

Figure 44:
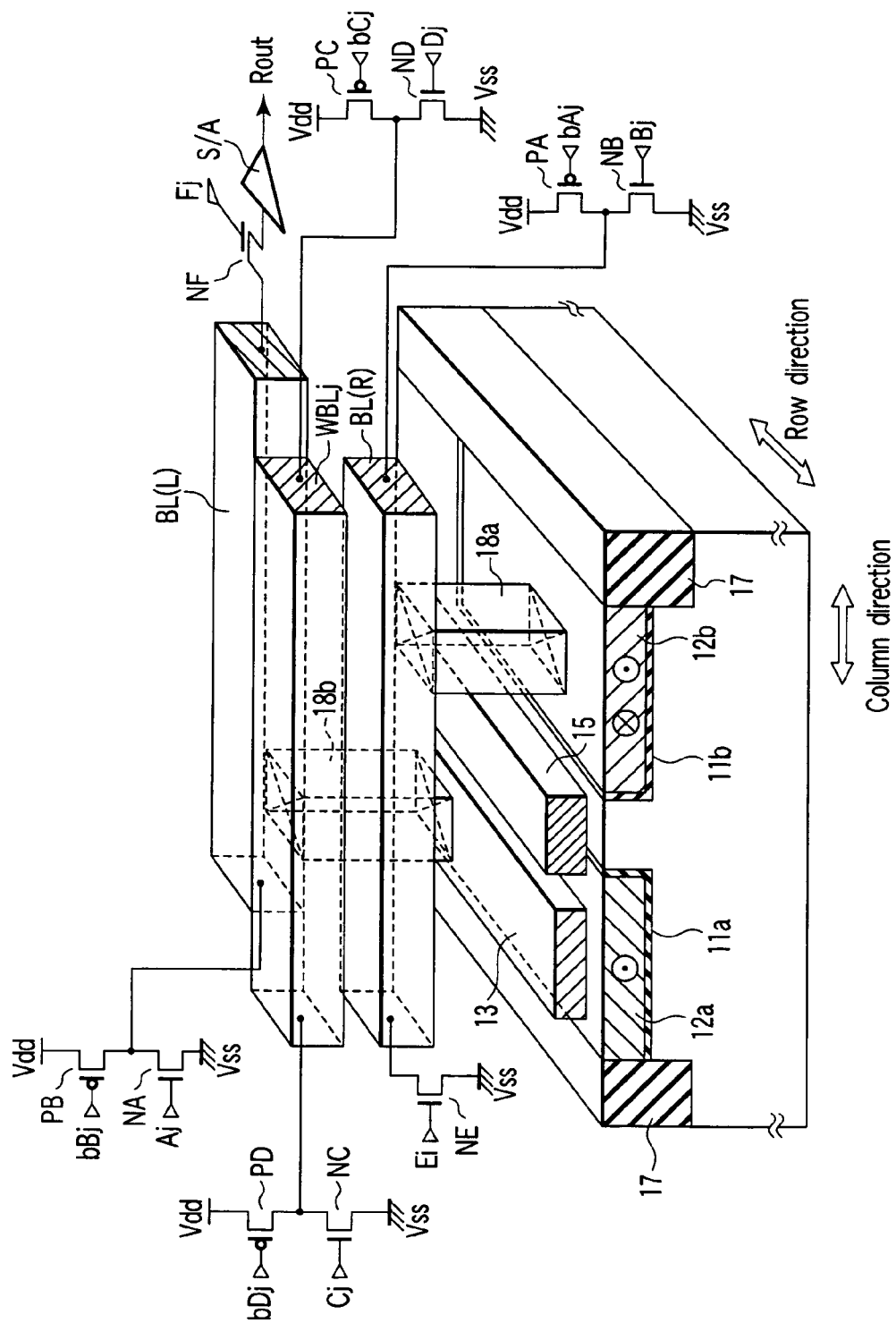
FIG. 44 is a view showing the spin-injection FET according to the eleventh embodiment.

The spin-injection FET of FIG. 44 corresponds to the case in which the writing bit line WBLj is newly provided in the Schottky barrier type spin-injection FET of FIG. 38.

Figure 45:
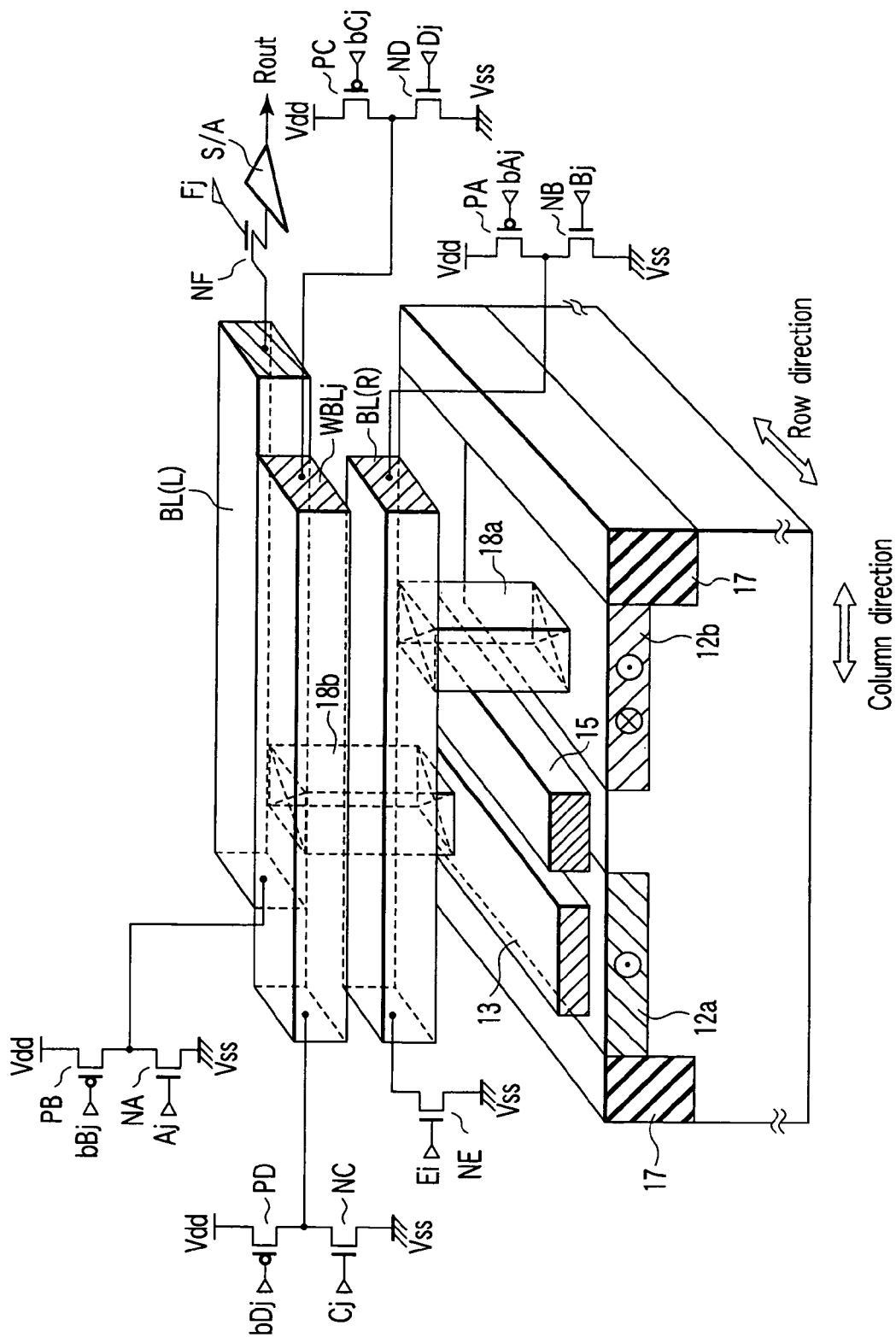
FIG. 45 is a view showing the spin-injection FET according to the eleventh embodiment.

Similarly the spin-injection FET of FIG. 45 is the Schottky barrier type spin-injection FET, and the spin-injection FET of FIG. 45 corresponds to the case in which the writing bit line WBLj is newly provided in the spin-injection FET of FIG. 39.

Figure 46:
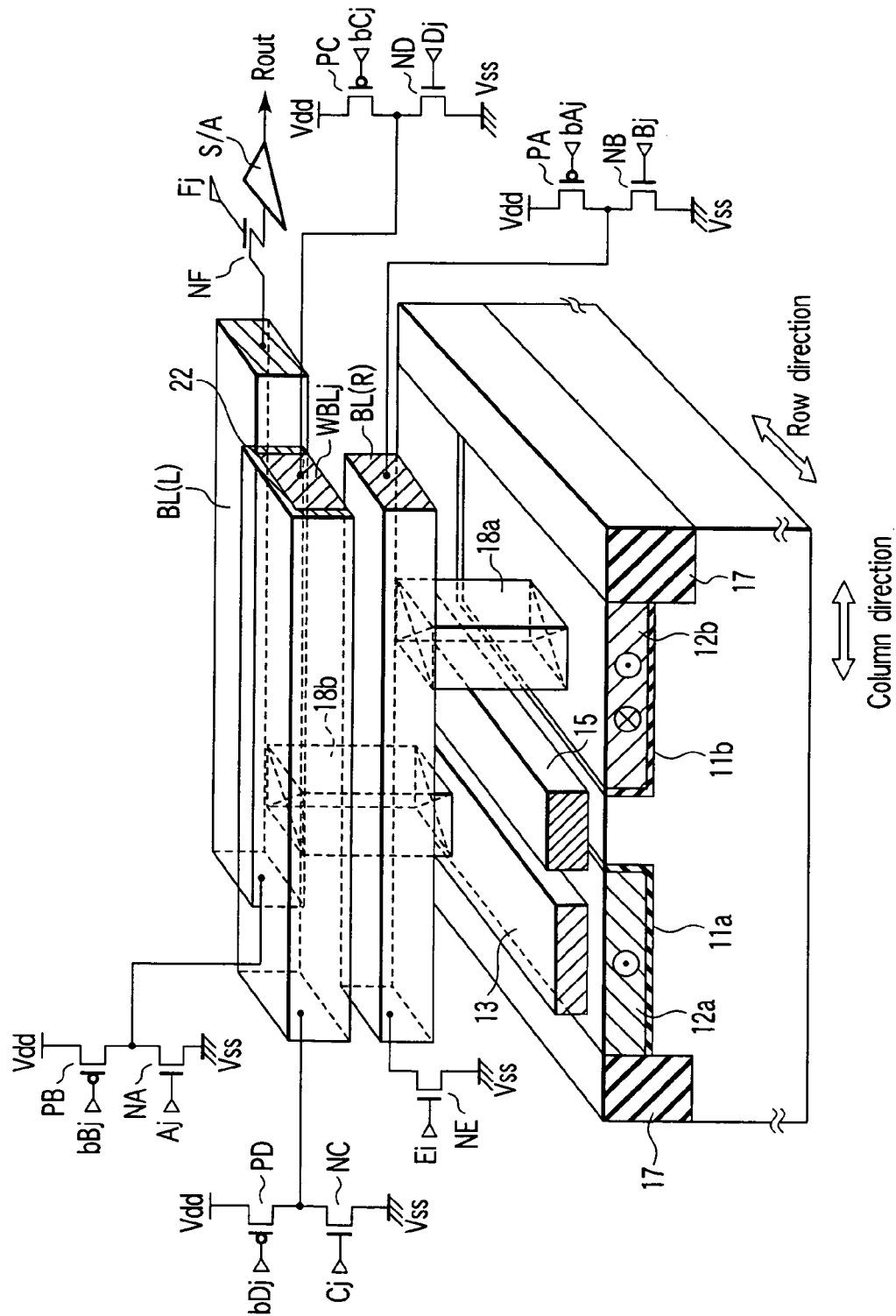
FIG. 46 is a view showing the spin-injection FET according to the eleventh embodiment.
Figure 47:
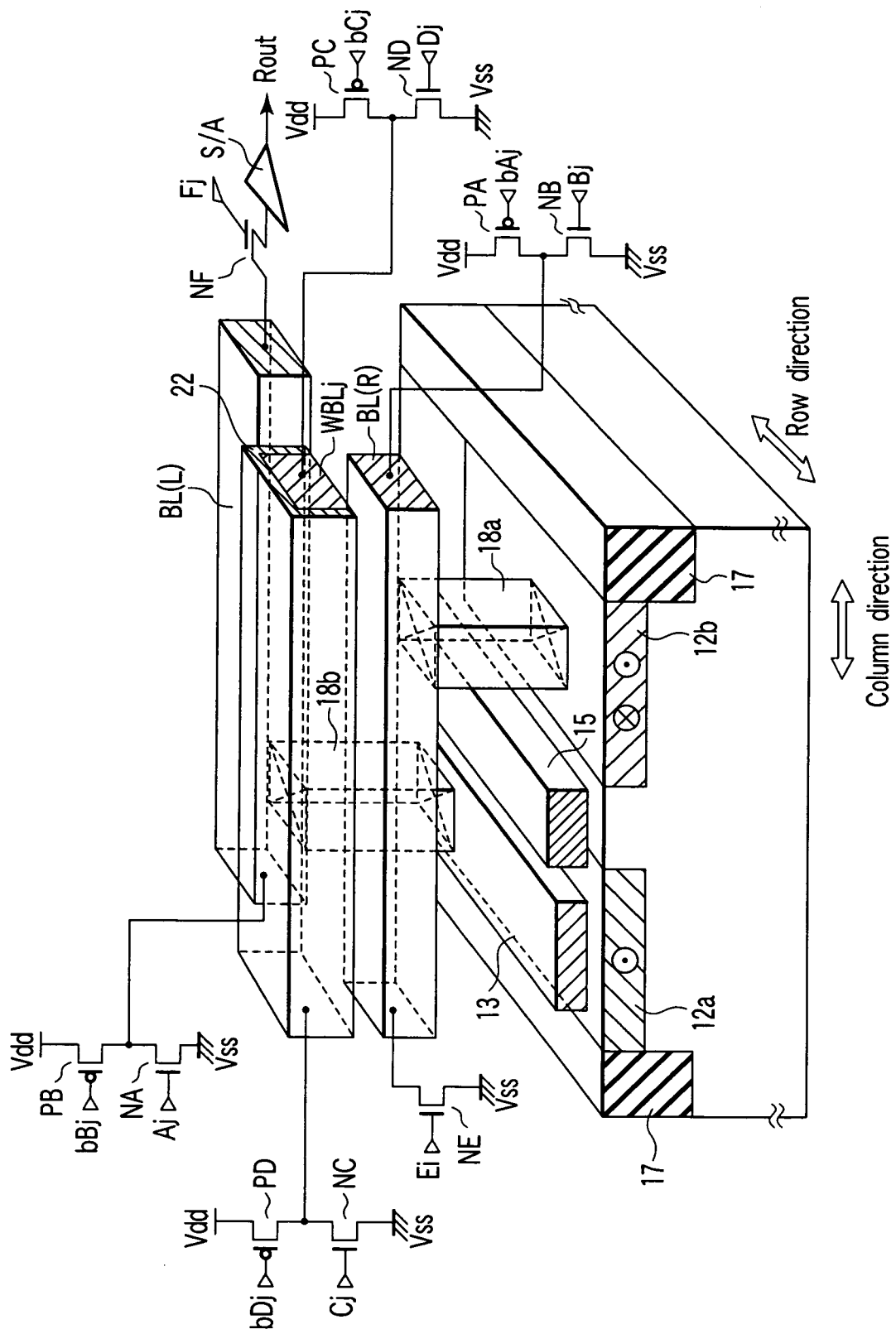
FIG. 47 is a view showing the spin-injection FET according to the eleventh embodiment.

The spin-injection FET of FIG. 46 is the case in which the yoke wiring technology is applied to the writing bit line WBLj of FIG. 44. The spin-injection FET of FIG. 47 is the case in which the yoke wiring technology is applied to the writing bit line WBLj of FIG. 45. In FIGS. 46 and 47, the numeral 22 designates the soft magnetic material (yoke material) with which the writing bit line WBLj is covered.

In the eleventh embodiment, the materials, the dimensions, and the like of the spin-injection FET are similar to those of the first to tenth embodiments, so that the descriptions will be neglected.

When the spin-injection FET of the eleventh embodiment is applied to the re-configurable logic circuit, the sense amplifier S/A and the N-channel MIS transistors NE and NF can be neglected.

(12) Twelfth Embodiment

A twelfth embodiment is one of the modifications of the sixth embodiment.

Figure 48:
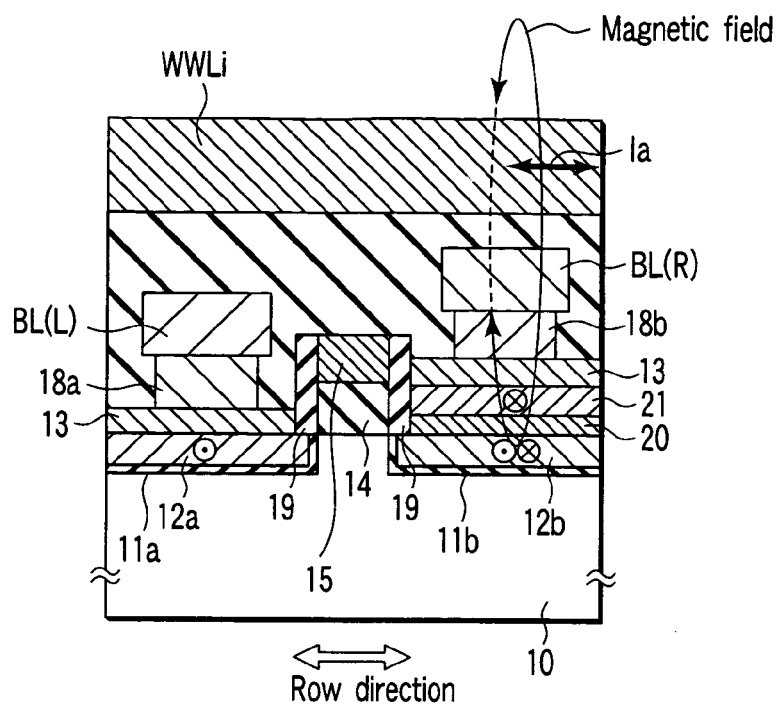
FIG. 48 is a view showing a spin-injection FET according to a twelfth embodiment.
Figure 51:
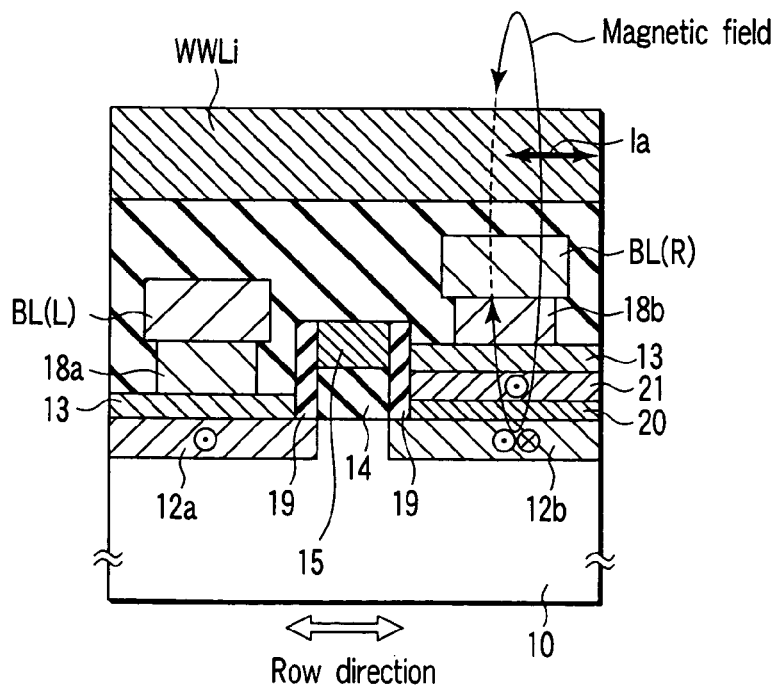
FIG. 51 is a view showing the spin-injection FET according to the twelfth embodiment.

In the twelfth embodiment, as shown in FIGS. 48 and 51, similarly to the sixth embodiment, the pinned layer is also formed on the ferromagnetic body 12b which is of the free layer.

That is, the non-magnetic body 20 is formed on the ferromagnetic body 12b, and the ferromagnetic body 21 is formed on the non-magnetic body 20. The ferromagnetic body 21 is the pinned layer whose magnetization direction is fixed. The anti-ferromagnetic body 13 is formed on the ferromagnetic body 21.

Figure 49:
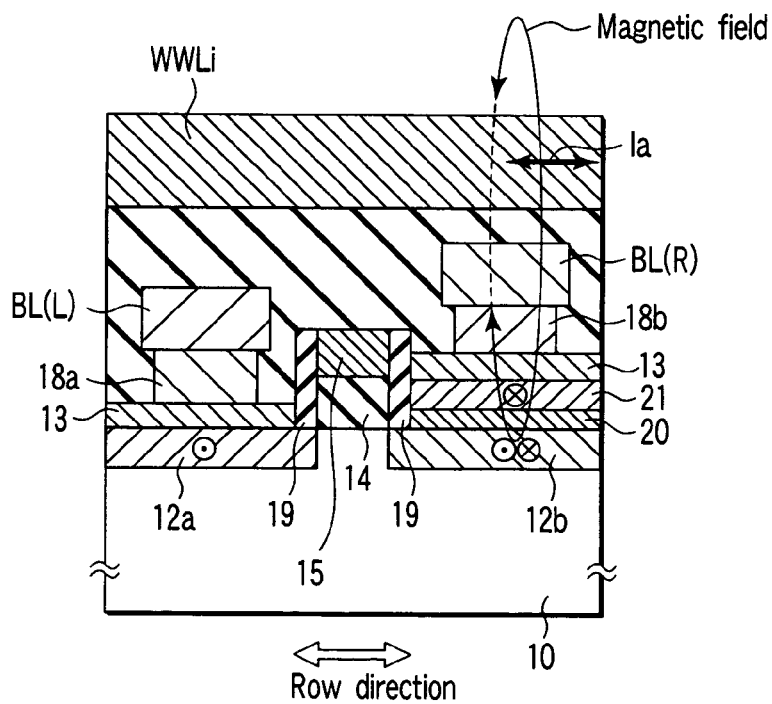
FIG. 49 is a view showing the spin-injection FET according to the twelfth embodiment.

At this point, in the spin-injection FETs of FIGS. 48 and 49, the magnetization direction of the ferromagnetic body 12a arranged on one side of the ferromagnetic body 12b which is of the free layer and the magnetization direction of the ferromagnetic body 21 arranged on the other side of the ferromagnetic body 12b are mutually directed to the opposite directions.

Figure 50:
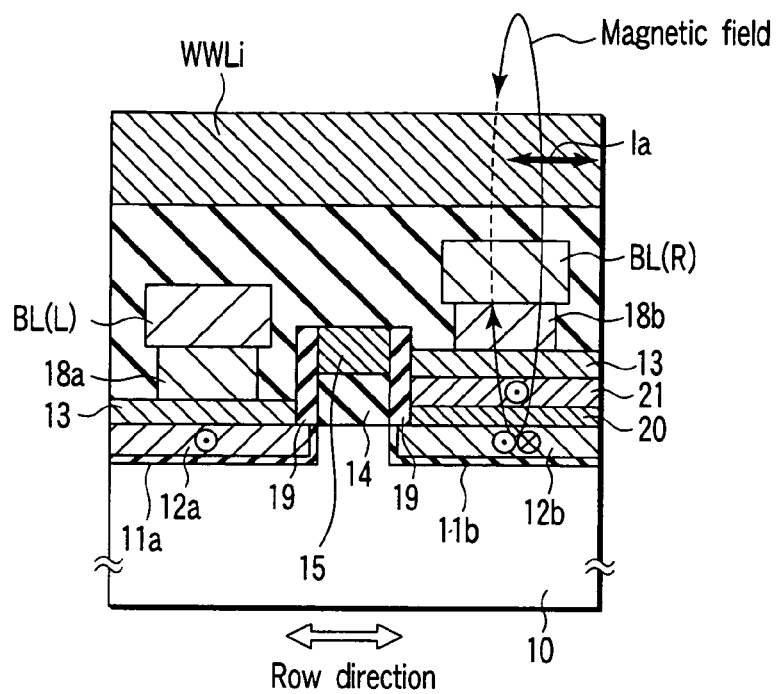
FIG. 50 is a view showing the spin-injection FET according to the twelfth embodiment.

In the spin-injection FETs of FIGS. 50 and 51, the magnetization direction of the ferromagnetic body 12a arranged on one side of the ferromagnetic body 12b which is of the free layer and the magnetization direction of the ferromagnetic body 21 arranged on the other side of the ferromagnetic body 12b are directed to the same direction.

One of the ferromagnetic bodies 12a and 21 or both the ferromagnetic bodies 12a and 21 may be formed in the SAF structure.

In the spin-injection FET of the twelfth embodiment, the spin-injection current path and the assist current path are completely separated from each other.

The magnetization easy axis directions of the ferromagnetic bodies 12a, 12b, and 21 are set in the direction perpendicular to the paper plane, i.e. in the column direction. The bit lines BL(L) and BL(R) extend in the column direction, and a writing word line WWLi extends in the row direction.

The spin-injection current is passed through the spin-injection FET channel located between the bit lines BL(L) and BL(R). On the other hand, the assist current for generating the assist magnetic field (current magnetic field) is passed through the writing word line WWLi.

The spin-injection FETs of FIGS. 52 to 55 are the case in which the yoke wiring technology is applied to the spin-injection FET of FIG. 51. That is, the soft magnetic material (yoke material) 22 is formed on the side face and the upper surface of the writing word line WWLi. Other structures are similar to the spin-injection FETs of FIGS. 48 to 51.

According to the yoke wiring technology, the assist current for generating the assist magnetic field can be set at a small value, specifically at values not more than 0.5 mA.

(13) Summary

As described above, according to the spin-injection FETs of the first to twelfth embodiments, the thermal stability is excellent and the element breakage problem can be solved.

In the case where the free layer includes Ni—Co, Ni—Fe, Co—Fe, or Co—Fe—Ni, at least one metal selected from the group of Au, Zr, Hf, Rh, Pt, Ir, Al, and Ga or the alloy including at least one metal is used as the non-magnetic material, which result in the spin-injection current reduction and the assist current reduction.

The application of the spin-injection FET of the embodiments to the advanced-technology devices such as the re-configurable logic circuit and the magnetic random access memory can solve the problems such as the decrease in current density during the magnetization reversal, the tunnel barrier layer breakage, and the thermal disturbance. Therefore, the spin-injection FET of the embodiments is very effective in the practical use of the advanced-technology devices.

In order to stabilize the magnetization state of the pinned layer during the magnetization reversal, it is preferable to enlarge a volume of the pinned layer as much as possible.

4. Writing Method

Then, a method of writing data in the spin-injection FET according to the embodiments of the invention (magnetization reversal process) will be described.

Figure 56:
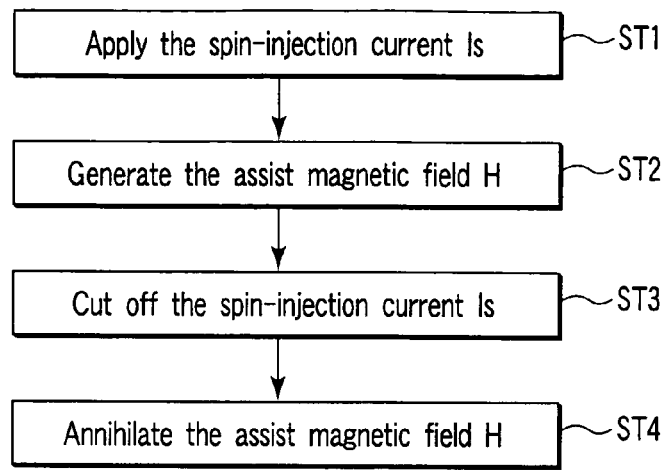
FIG. 56 is a view showing a magnetization reversal process.
Figure 57:
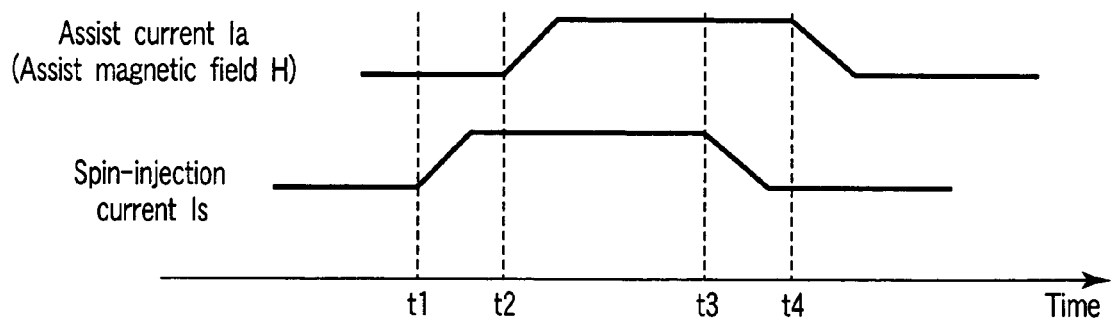
FIG. 57 is a view showing waveforms of the spin-injection current and the assist current.

FIG. 56 shows a flowchart of a magnetization reversal process according to the embodiments of the invention. FIG. 57 shows signal waveforms of the spin-injection current and the assist magnetic field (assist current) for realizing the process of FIG. 56.

First the spin-injection current Is having the direction according to a value of writing data is provided to the magnetoresistive element (STEP ST1, time t1). The electrons spin-polarized by the spin-injection current Is are generated, and the spin torque acts on the magnetic free layer by the spin-polarized electrons to start the magnetization reversal.

When the spin-injection current Is is passed through the magnetoresistive element, since the temperature of the magnetoresistive element rises gradually (see FIG. 8), after a predetermined time elapses since the spin-injection current Ia is passes, the assist current Ia is passed through the writing word line WWL to generate a assist magnetic field H (STEP ST2, time t2).

The assist magnetic field H is generated in the magnetization easy axis direction of the magnetoresistive element, which suppresses the electron spin thermal disturbance in the magnetic free layer caused by the temperature rise of the magnetoresistive element.

Timing at which the assist current Ia is passed through the word line WWL to generate the assist magnetic field H may be set at the same timing of the passage of the spin-injection current Ia or earlier than the timing of the passage of the spin-injection current Ia.

Then, the spin-injection current Is is cut off (STEP ST3, time t3).

As can be seen from FIG. 8, the magnetoresistive element has the high temperature enough to generate the electron spin thermal disturbance until tens nanoseconds elapse since the spin-injection current Is is cut off.

Therefore, until a predetermined period elapses, e.g. until tens nanoseconds elapse, the assist current Ia is continuously provided even after the spin-injection current Is is cut off.

After the temperature of the magnetoresistive element sufficiently falls down, the assist current Ia is stopped to cut off the assist magnetic field H (STEP ST4, time t4).

Thus, the magnetization reversal process according to the embodiments of the invention, since the assist current is cut off after the spin-injection current is cut off with respect to the current cut-off timing, the electron spin thermal disturbance in the magnetic free layer caused by the temperature rise of the magnetoresistive element can effectively be prevented.

5. Production Method

Then, some examples of a method of producing the spin-injection FET according to the embodiments of the invention will be described.

(1) First Example

Figure 58:
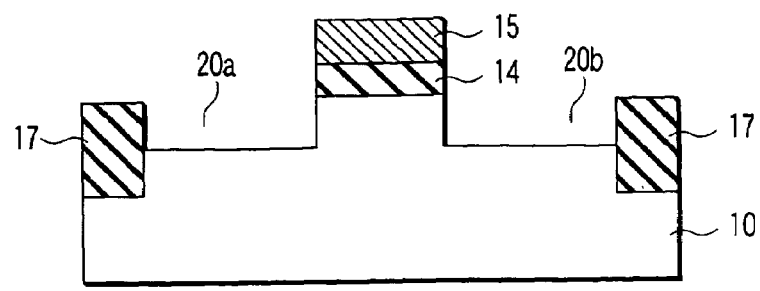
FIG. 58 is a view showing a first example of a producing method.
Figure 59:
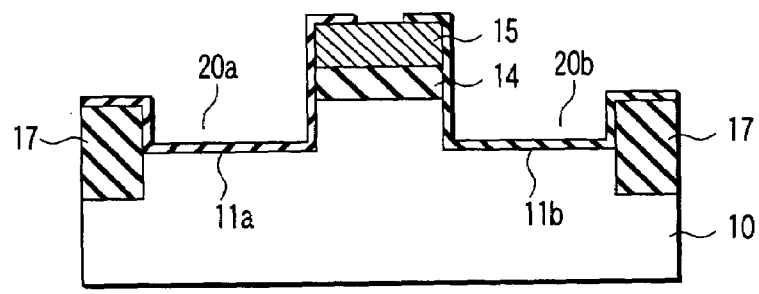
FIG. 59 is a view showing the first example of the producing method.
Figure 60:
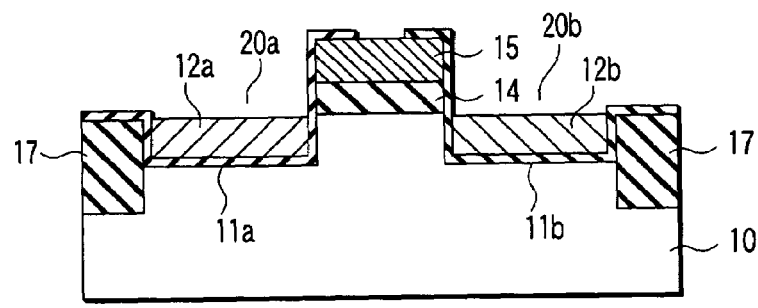
FIG. 60 is a view showing the first example of the producing method.

FIGS. 58 to 60 show a first example of the method of producing the spin-injection FET according to the embodiments of the invention.

As shown in FIG. 58, by utilizing the method such as CVD (Chemical Vapor Deposition), PEP (Photo Engraving Process), RIE (Reactive Ion Etching), the element separation insulating layer 17 having the STI structure is formed in the semiconductor substrate (for example, silicon substrate) 10, and the insulating layer and the conductive layer are formed on the semiconductor substrate 10. Then, a resist pattern is formed.

The insulating layer and the conductive layer are etched by, e.g., RIE to form the gate insulating layer 14 and the gate electrode 15 using the resist pattern as a mask, and the semiconductor substrate 10 is etched to form the recesses 20a and 20b. Then, the resist pattern is removed.

As shown in FIG. 59, the tunnel barrier layers 11a and 11b are formed by, e.g., a spattering method or a plasma oxidation method. At least the inner surfaces of the recesses 20a and 20b, the side faces of the gate insulating layer 14, and the side faces of the gate electrode 15, which are formed in the semiconductor substrate 10, are covered with the tunnel barrier layers 11a and 11b.

As shown in FIG. 60, the ferromagnetic bodies 12a and 12b are formed in the recesses 20a and 20b with a strongly directional sputtering apparatus.

At this point, the ferromagnetic bodies 12a and 12b can simultaneously be formed, or the ferromagnetic bodies 12a and 12b can separately be formed.

When the ferromagnetic bodies 12a and 12b are separately formed, one of the recess 20a on the tunnel barrier layer 11a and the recess 20b on the tunnel barrier layer 11b is covered with a photoresist, and the other recess is filled with the ferromagnetic body. Then, the photoresist is removed, and the other recess is covered with the photoresist and one of the recess 20a on the tunnel barrier layer 11a and the recess 20b on the tunnel barrier layer 11b is filled with the ferromagnetic body.

Thus, the tunnel barrier type spin-injection FET in which the source/drain is formed by the ferromagnetic body can easily be produced by the above producing method.

(2) Second Example

Figure 61:
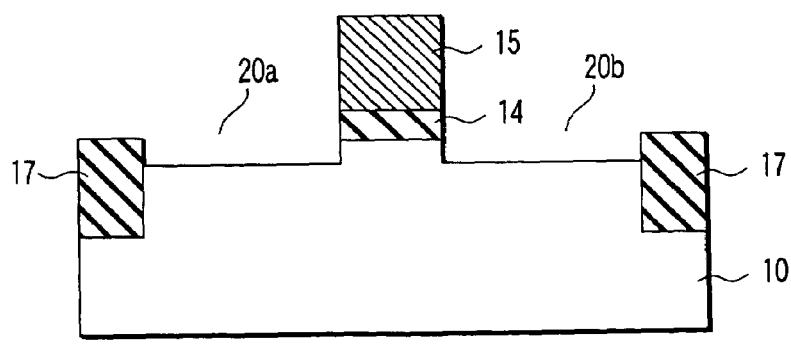
FIG. 61 is a view showing a second example of the producing method.
Figure 62:
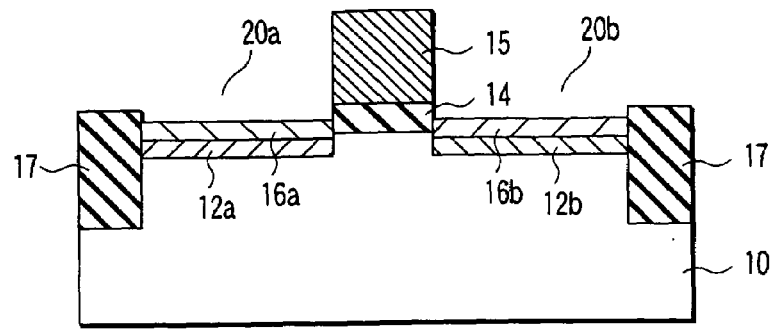
FIG. 62 is a view showing the second example of the producing method.

FIGS. 61 and 62 show a second example of the method of producing the spin-injection FET according to the embodiments of the invention.

$Si_3N_4$ is formed on the semiconductor substrate 10 by a vapor phase growth method using silane gas and ammonia gas, and the photoresist with which the element area is covered is formed by PEP. While $Si_3N_4$ is etched to form the mask made of $Si_3N_4$ by, e.g., RIE using the photoresist as the mask, the semiconductor substrate 10 is etched to form the groove in the semiconductor substrate 10. Then, the photoresist is removed.

As shown in FIG. 61, the groove formed in the semiconductor substrate 10 is filled with $SiO_2$ to form the element separation insulating layer 17 having the STI structure.

The mask made of $Si_3N_4$ is removed with phosphoric acid, oxides on the surface of the semiconductor substrate 10 is removed with hydrofluoric acid, and then the insulating layer made of $SiO_2$ is formed on the semiconductor substrate 10 by a thermal oxidation method. Then, the polysilicon layer including a conductive impurity is formed on the insulating layer by the vapor phase growth method.

The resist patter is produced by PEP, and the polysilicon layer and the insulating layer are etched by, e.g., RIE using the resist pattern as the mask. As a result, the gate insulating layer 14 and the gate electrode 15 are formed on the semiconductor substrate 10.

The semiconductor substrate 10 is etched to form the recesses 20a and 20b in the semiconductor substrate 10 by, e.g., RIE using the resist patter as the mask. Then, the resist pattern is removed.

As shown in FIG. 62, the recess 20b which becomes the drain is covered with the photoresist, and the ferromagnetic body 12a is formed in the recess 20a which becomes the source. For example, the ferromagnetic body 12a is formed by $(Co_{70}Fe_{30})_{80}B_{20}/Ru(0.95)/Co_{70}Fe_{30}/PtMn/Ta$. Further, the conductive polysilicon 16a is formed on the ferromagnetic body 12a. Then, the photoresist is removed.

The recess 20a which becomes the source is covered with the photoresist, and the ferromagnetic body 12b is formed in the recess 20b which becomes the drain. For example, the ferromagnetic body 12a is formed by $(Co_{70}Fe_{30})_{80}B_{20}/Cu(5)/Co_{70}Fe_{30}/PtMn/Ta$. Further, the conductive polysilicon 16b is formed on the ferromagnetic body 12b. Then, the photoresist is removed.

According to the above production method, the Schottky barrier type spin-injection FET in which the source/drain is formed by the ferromagnetic body can easily be produced by the above producing method.

(3) Third Example

Figure 64:
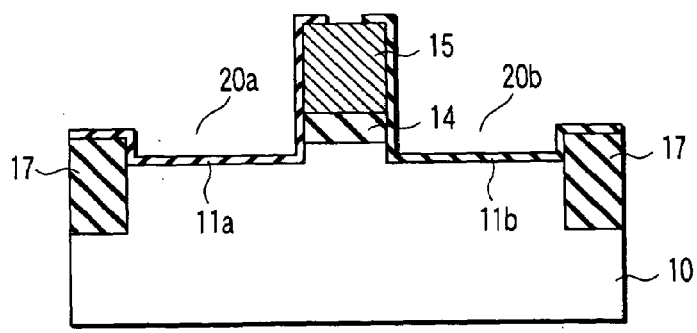
FIG. 64 is a view showing a third example of the producing method.
Figure 65:
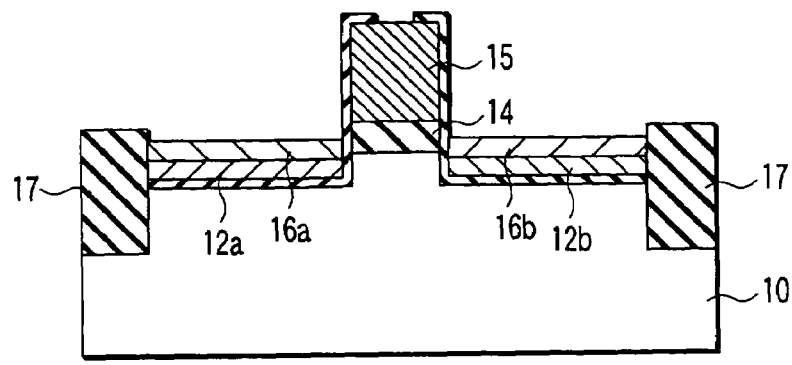
FIG. 65 is a view showing the third example of the producing method.

FIGS. 64 and 65 show a third example of the method of producing the spin-injection FET according to the embodiments of the invention.

$Si_3N_4$ is formed on the semiconductor substrate 10 by the vapor phase growth method using silane gas and ammonia gas, and the photoresist with which the element area is covered is formed by PEP. While $Si_3N_4$ is etched to form the mask made of $Si_3N_4$ by, e.g., RIE using the photoresist as the mask, the semiconductor substrate 10 is etched to form the groove in the semiconductor substrate 10. Then, the photoresist is removed.

As shown in FIG. 64, the groove formed in the semiconductor substrate 10 is filled with $SiO_2$ to form the element separation insulating layer 17 having the STI structure.

The mask made of $Si_3N_4$ is removed with phosphoric acid, oxides on the surface of the semiconductor substrate 10 is removed with hydrofluoric acid, and then the insulating layer made of $SiO_2$ is formed on the semiconductor substrate 10 by a thermal oxidation method. Then, the polysilicon layer including a conductive impurity is formed on the insulating layer by the vapor phase growth method.

The resist patter is produced by PEP, and the polysilicon layer and the insulating layer are etched by, e.g., RIE using the resist pattern as the mask. As a result, the gate insulating layer 14 and the gate electrode 15 are formed on the semiconductor substrate 10.

After that, the semiconductor substrate 10 is etched to form the recesses 20a and 20b in the semiconductor substrate 10 by, e.g., RIE using the resist patter as the mask. Then, the resist pattern is removed.

Then, the tunnel barrier layers 11a and 11b are formed by the sputtering method. At least the recesses 20a and 20b formed in the semiconductor substrate 10 are covered with the tunnel barrier layers 11a and 11b. For example, the tunnel barrier layers 11a and 11b are made of MgO.

As shown in FIG. 65, the recess 20b which becomes the drain is covered with the photoresist, and the ferromagnetic body 12a is formed in the recess 20a which becomes the source. For example, the ferromagnetic body 12a is formed by $(Co_{70}Fe_{30})_{80}B_{20}$/Ru(0.95)/$Co_{70}Fe_{30}$/PtMn/Ta. Further, the conductive polysilicon 16a is formed on the ferromagnetic body 12a. Then, the photoresist is removed.

The recess 20a which becomes the source is covered with the photoresist, and the ferromagnetic body 12b is formed in the recess 20b which becomes the drain. For example, the ferromagnetic body 12a is formed by $(Co_{70}Fe_{30})_{80}B_{20}$/Au (5)/$Co_{70}Fe_{30}$/PtMn/Ta. Further, the conductive polysilicon 16b is formed on the ferromagnetic body 12b. Then, the photoresist is removed.

Thus, the tunnel barrier type spin-injection FET in which the source/drain is formed by the ferromagnetic body can easily be produced by the above producing method.

(2) Second Example

FIGS. 61 and 62 show a second example of the method of producing the spin-injection FET according to the embodiments of the invention.

$Si_3N_4$ is formed on the semiconductor substrate 10 by a vapor phase growth method using silane gas and ammonia gas, and the photoresist with which the element area is covered is formed by PEP. While $Si_3N_4$ is etched to form the mask made of $Si_3N_4$ by, e.g., RIE using the photoresist as the mask, the semiconductor substrate 10 is etched to form the groove in the semiconductor substrate 10. Then, the photoresist is removed.

As shown in FIG. 61, the groove formed in the semiconductor substrate 10 is filled with $SiO_2$ to form the element separation insulating layer 17 having the STI structure.

The mask made of $Si_3N_4$ is removed with phosphoric acid, oxides on the surface of the semiconductor substrate 10 is removed with hydrofluoric acid, and then the insulating layer made of $SiO_2$ is formed on the semiconductor substrate 10 by a thermal oxidation method. Then, the polysilicon layer including a conductive impurity is formed on the insulating layer by the vapor phase growth method.

The resist patter is produced by PEP, and the polysilicon layer and the insulating layer are etched by, e.g., RIE using the resist pattern as the mask. As a result, the gate insulating layer 14 and the gate electrode 15 are formed on the semiconductor substrate 10.

The semiconductor substrate 10 is etched to form the recesses 20a and 20b in the semiconductor substrate 10 by, e.g., RIE using the resist patter as the mask. Then, the resist pattern is removed.

As shown in FIG. 62, the recess 20b which becomes the drain is covered with the photoresist, and the ferromagnetic body 12a is formed in the recess 20a which becomes the source. For example, the ferromagnetic body 12a is formed by $(Co_{70}Fe_{30})_{80}B_{20}$/Ru(0.95)/$Co_{70}Fe_{30}$/PtMn/Ta. Further, the conductive polysilicon 16a is formed on the ferromagnetic body 12a. Then, the photoresist is removed.

The recess 20a which becomes the source is covered with the photoresist, and the ferromagnetic body 12b is formed in the recess 20b which becomes the drain. For example, the ferromagnetic body 12a is formed by $(Co_{70}Fe_{30})_{80}B_{20}$/Cu (5)/$Co_{70}Fe_{30}$/PtMn/Ta. Further, the conductive polysilicon 16b is formed on the ferromagnetic body 12b. Then, the photoresist is removed.

According to the above production method, the Schottky barrier type spin-injection FET in which the source/drain is formed by the ferromagnetic body can easily be produced by the above producing method.

(3) Third Example

FIGS. 64 and 65 show a third example of the method of producing the spin-injection FET according to the embodiments of the invention.

$Si_3N_4$ is formed on the semiconductor substrate 10 by the vapor phase growth method using silane gas and ammonia gas, and the photoresist with which the element area is covered is formed by PEP. While $Si_3N_4$ is etched to form the mask made of $Si_3N_4$ by, e.g., RIE using the photoresist as the mask, the semiconductor substrate 10 is etched to form the groove in the semiconductor substrate 10. Then, the photoresist is removed.

As shown in FIG. 64, the groove formed in the semiconductor substrate 10 is filled with $SiO_2$ to form the element separation insulating layer 17 having the STI structure.

The mask made of $Si_3N_4$ is removed with phosphoric acid, oxides on the surface of the semiconductor substrate 10 is removed with hydrofluoric acid, and then the insulating layer made of $SiO_2$ is formed on the semiconductor substrate 10 by a thermal oxidation method. Then, the polysilicon layer including a conductive impurity is formed on the insulating layer by the vapor phase growth method.

The resist pattern is produced by PEP, and the polysilicon layer and the insulating layer are etched by, e.g., RIE using the resist pattern as the mask. As a result, the gate insulating layer 14 and the gate electrode 15 are formed on the semiconductor substrate 10.

After that, the semiconductor substrate 10 is etched to form the recesses 20a and 20b in the semiconductor substrate 10 by, e.g., RIE using the resist patter as the mask. Then, the resist pattern is removed.

Then, the tunnel barrier layers 11a and 11b are formed by the sputtering method. At least the recesses 20a and 20b formed in the semiconductor substrate 10 are covered with the tunnel barrier layers 11a and 11b. For example, the tunnel barrier layers 11a and 11b are made of MgO.

As shown in FIG. 65, the recess 20b which becomes the drain is covered with the photoresist, and the ferromagnetic body 12a is formed in the recess 20a which becomes the source. For example, the ferromagnetic body 12a is formed by $(Co_{70}Fe_{30})_{80}B_{20}$/Ru(0.95)/$Co_{70}Fe_{30}$/PtMn/Ta. Further, the conductive polysilicon 16a is formed on the ferromagnetic body 12a. Then, the photoresist is removed.

The recess 20a which becomes the source is covered with the photoresist, and the ferromagnetic body 12b is formed in the recess 20b which becomes the drain. For example, the ferromagnetic body 12a is formed by $(Co_{70}Fe_{30})_{80}B_{20}$/Au (5)/$Co_{70}Fe_{30}$/PtMn/Ta. Further, the conductive polysilicon 16b is formed on the ferromagnetic body 12b. Then, the photoresist is removed.

Thus, the tunnel barrier type spin-injection FET in which the source/drain is formed by the ferromagnetic body can easily be produced by the above producing method.

6. Application Examples

Application examples of the spin-injection FET according to the embodiments of the invention will be described.

Two examples, i.e., the case in which the spin-injection FET according to the embodiments of the invention is applied to the re-configurable logic circuit and the case in which the spin-injection FET according to the embodiments of the invention is applied to the magnetic random access memory will be described below.

(1) Application to Re-configurable Logic Circuit

The re-configurable logic circuit should mean a circuit in which one of plural pieces of logic can selectively be realized based on program data by one logic circuit.

Herein, the program data should mean data or control data which is stored in a non-volatile memory such as FeRAM and MRAM in the same chip or the other chips.

In the conventional logic circuit, a kind of the logic (AND, NAND, OR, NOR, Ex-OR, and the like) is determined by connection relation among the plural MIS transistors. Therefore, when the logic is changed, it is necessary that the connection relation among the plural MIS transistors is changed by redesign.

Accordingly, the re-configurable logic circuit in which one of the plural pieces of logic can selectively be realized by one logic circuit is desired.

The re-configurable logic circuit can be realized by the use of the spin-injection FET according to the embodiments of the invention.

When AND and OR can be realized in actually forming the re-configurable logic circuit by the spin-injection FET, other pieces of logic can be realized by the combination of AND and OR. Thereafter, the re-configurable logic circuit which can selectively realize AND and OR will be described below.

A. First Example

FIG. 67 shows a first example of the re-configurable logic circuit.

In the first example, the two spin-injection FETs according to the embodiment of the invention are connected in series between power supply terminals Vdd and Vss.

A spin-injection FET SP is the P-type, and an input signal A is inputted to the gate. In the spin-injection FET SP, the magnetization states (parallel/anti-parallel) of the magnetoresistive elements are rewritable by the writing technique according to the embodiment of the invention.

In conductance Gm of the spin-injection FET SP, the materials, the dimensions, and the like are determined such that a ratio of a value in the parallel state and a value in the anti-parallel state becomes, e.g., "100:1".

The ratio of the conductance Gm in the parallel state and the conductance Gm in the anti-parallel state may be the reverse relation, i.e., "1:100".

A spin-injection FET SN is the N-type, and an input signal B is inputted to the gate. In the spin-injection FET SN, the magnetization states of the magnetoresistive elements are fixed in the parallel state in the first example. The conductance Gm of the spin-injection FET SN is set at "10" when the ratio of the conductance Gm has the above relation in the spin-injection FET SP.

In the two spin-injection FETs SP and SN, for example, a common floating gate can be provided. In this case, because (A+B)/2 can be generated as voltage Vfg of the common floating gate, in forming the stable logic, it is preferable that the common floating gate is provided.

A signal V1 at a connection point between the spin-injection FETs SP and SN becomes an output signal Vout when the signal V1 passes through an inverter.

In the re-configurable logic circuit of FIG. 67, assuming that the magnetization states of the magnetoresistive elements in the spin-injection FET SP are set in the parallel state or the anti-parallel state and the conductance Gm is set at "100" (conductance Gm of spin-injection FET SN is set at "10"), as shown in Table 1, the output signal Vout becomes AND (Y=A·B) of the input signals A and B.

TABLE 1

| SP: Parallel state (Anti-parallel state) | | | | | | |
| Gm = 100 → AND gate Y = A · B | | | | | | |
|---|---|---|---|---|---|---|
| A | B | Vfg | SP | SN | V1 | Y(=Vout) |
| 0 | 0 | 0 | On | Off | 1 | 0 |
| 0 | 1 | ½ | On | On | 1 | 0 |
| 1 | 0 | ½ | On | On | 1 | 0 |
| 1 | 1 | 1 | Off | On | 0 | 1 |

Where, in Table 1, the logic value of "1" corresponds to "H (high)" and the logic value of "0" corresponds to "L (low)". The logic value of "½" corresponds to an intermediate voltage between "H" and "L".

Namely, when both the input signals A and B are "1", the common floating gate voltage Vfg becomes "1". At this point, the spin-injection FET SP is turned off and the spin-injection FET SN is turned on, so that V1 becomes "0" and the output signal Vout becomes "1".

When both the input signals A and B are "0", the common floating gate voltage Vfg becomes "0". At this point, the spin-injection FET SP is turned on and the spin-injection FET SN is turned off, so that V1 becomes "1" and the output signal Vout becomes "0".

Furthermore, when one of the input signals A and B is "1" and the other is "0", the common floating gate voltage Vfg becomes "½". At this point, both the spin-injection FETs SP and SN are turned on.

However, the conductance Gm of the spin-injection FET SP is set at "100" and the conductance Gm of the spin-injection FET SN is set at "10", so that the ratio of the currents passed through the spin-injection FETs SP and SN becomes "100:10"="10:1".

Accordingly, because ability to pull up V1 to Vdd (="1") surpasses ability to pull down V1 to Vss (="0"), V1 becomes "1" and the output signal Vout becomes "0".

In the re-configurable logic circuit of FIG. 67, assuming that the magnetization states of the magnetoresistive elements in the spin-injection FET SP are set in the parallel state or the anti-parallel state and the conductance Gm is "1" (conductance Gm of spin-injection FET SN is "10"), as shown in Table 2, the output signal Vout becomes OR (Y=A+B) of the input signals A and B.

TABLE 2

| | | | SP: Anti-parallel state (Parallel state) Gm = 1 → OR gate Y = A + B | | | |
|---|---|---|---|---|---|---|
| A | B | Vfg | SP | SN | V1 | Y(=Vout) |
| 0 | 0 | 0 | On | Off | 1 | 0 |
| 0 | 1 | ½ | On | On | 0 | 1 |
| 1 | 0 | ½ | On | On | 0 | 1 |
| 1 | 1 | 1 | Off | On | 0 | 1 |

Where, in Table 2, the logic value of "1" corresponds to "H (high)" and the logic value of "0" corresponds to "L (low)". The logic value of "½" corresponds to the intermediate voltage between "H" and Namely, when both the input signals A and B are "1", the common floating gate voltage Vfg becomes "1". At this point, the spin-injection FET SP is turned off and the spin-injection FET SN is turned on, so that V1 becomes "0" and the output signal Vout becomes "1".

When both the input signals A and B are "0", the common floating gate voltage Vfg becomes "0". At this point, the spin-injection FET SP is turned on and the spin-injection FET SN is turned off, so that V1 becomes "1" and the output signal Vout becomes "0".

When one of the input signals A and B is "1" and the other is "0", the common floating gate voltage Vfg becomes "½". At this point, both the spin-injection FETs SP and SN are turned on.

However, the conductance Gm of the spin-injection FET SP is set at "1" and the conductance Gm of the spin-injection FET SN is set at "10", so that the ratio of the currents passed through the spin-injection FETs SP and SN becomes "1:10".

Accordingly, because the ability to pull down V1 to Vss (="0") surpasses the ability to pull up V1 to Vdd (="1"), V1 becomes "0" and the output signal Vout becomes "1".

Thus, according to the re-configurable logic circuit to which the spin-injection FET according to the embodiments of the invention is applied, the magnetization state (parallel/anti-parallel) of the spin-injection FET SP is rewritten to change the conductance Gm based on the program data, which allows one of the plural pieces of logic to be selectively realized by one logic circuit with no redesign.

In the re-configurable logic circuit of the first example, the N-channel spin-injection FET SN is fixed in the parallel state and the conductance Gm is fixed at "10".

Herein, for the spin-injection FET SN, the conductance Gm is fixed at "10". Therefore, for example, the normal N-channel MIS transistor SN may be used as shown in FIG. 68, or the N-channel spin-injection FET SN which is in the anti-parallel state may be used as shown in FIG. 69.

Figure 69:
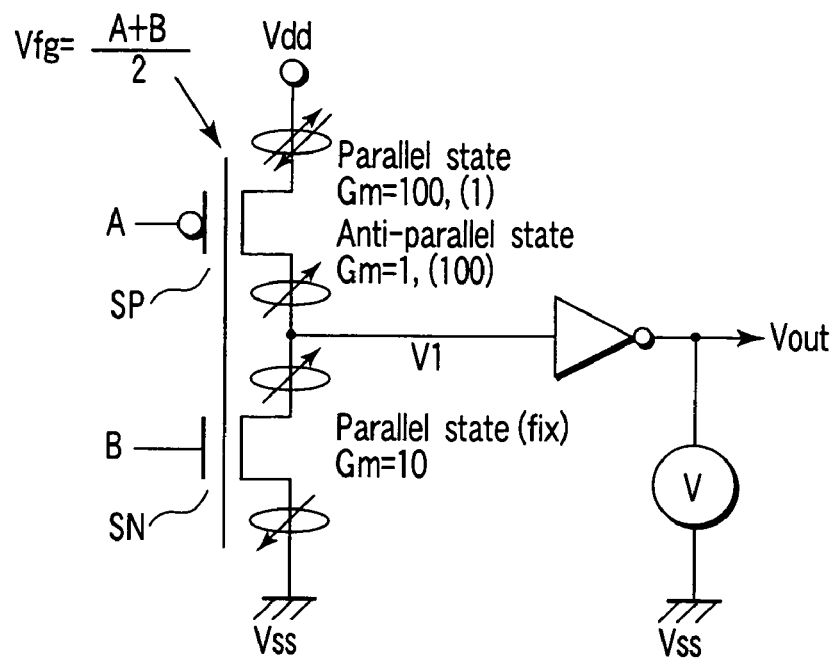
FIG. 69 is a view showing the first example of the re-configurable logic circuit.
Figure 70:
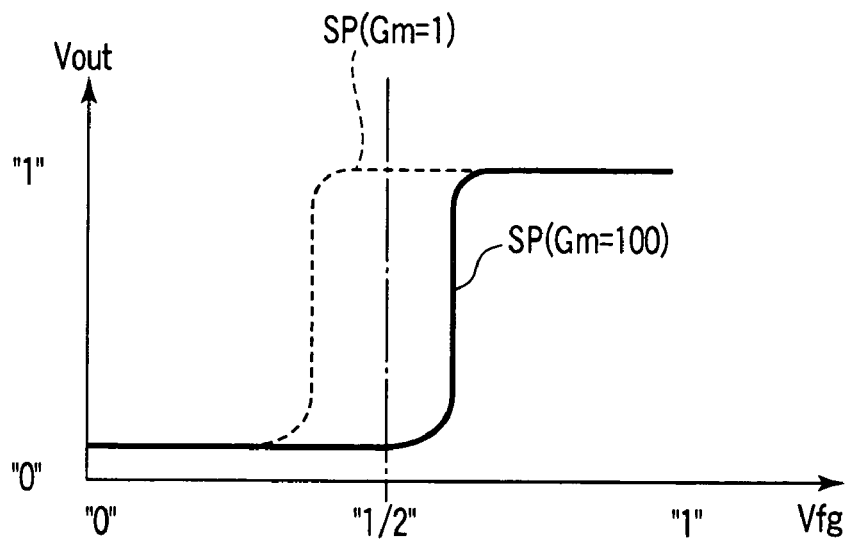
FIG. 70 is a view showing a relationship between a floating gate voltage Vfg and an output signal Vout.

FIG. 70 shows a relationship between the common floating gate voltage Vfg and the output voltage Vout in the re-configurable logic circuits of FIGS. 67 to 69.

The re-configurable logic circuits of FIGS. 67 to 69 have the feature in that the output voltage Vout is changed according to the magnetization state (parallel/anti-parallel) of the spin-injection FET SP when the common floating gate voltage Vfg is "½".

The re-configurable logic circuits of FIGS. 67 to 69 require the driver/sinker which changes the magnetization state (parallel/anti-parallel) of the P-channel spin-injection FET SP based on the program data.

FIG. 71 shows an example of the driver/sinker which changes the magnetization state of the spin-injection FETs SP FIGS. 67 to 69.

The input signal A is inputted to the gate of the P-channel spin-injection FET SP and the input signal B is inputted to gate of the N-channel spin-injection FET SN. Only one floating gate FG is provided for the two spin-injection FETs SP and SN, and the floating gate FG is shared between the spin-injection FETs SP and SN.

The drains of the spin-injection FETs SP and SN are connected to the inverter through a switch SW22. The output signal Vout is obtained from the inverter.

The drains of the spin-injection FETs SP and SN are also connected through a switch SW12 to the P-channel MIS transistor PB and the N-channel MIS transistor NA which are of the driver/sinker for controlling the generation/cutoff of the spin-injection current. The control signal bBj is inputted to the gate of the P-channel MIS transistor PB and the control signal Aj is inputted to the gate of the N-channel MIS transistor NA.

The sources of the spin-injection FET SP is connected to the power supply terminal Vdd through a switch SW21.

The source of the spin-injection FET SP is also connected through a switch SW11 to the P-channel MIS transistor PA and the N-channel MIS transistor NB which are of the driver/sinker for controlling the generation/cutoff of the spin-injection current. The control signal bAj is inputted to the gate of the P-channel MIS transistor PA and the control signal Bj is inputted to the gate of the N-channel MIS transistor NB.

The source of the spin-injection FET SP is also connected through the switch SW11 to the P-channel MIS transistor PC and the N-channel MIS transistor ND which are of the driver/sinker for controlling the generation/cutoff of the assist current generating the assist magnetic field. The control signal bCj is inputted to the gate of the P-channel MIS transistor PC and the control signal Dj is inputted to the gate of the N-channel MIS transistor ND.

The source of the spin-injection FET SP is also connected through the switch SW11 to the P-channel MIS transistor PD and the N-channel MIS transistor NC which are of the driver/sinker for controlling the generation/cutoff of the assist current generating the assist magnetic field. The control signal bDj is inputted to the gate of the P-channel MIS transistor PD and the control signal Cj is inputted to the gate of the N-channel MIS transistor NC.

The source of the spin-injection FET SN is connected to the ground point Vss.

In such a re-configurable logic circuit of the first example, the kind of the logic is determined based on the program data in shipping on the manufacturer side or in programming for the setting on the user side after the shipping.

In this case, a control signal CNT is set at "H", and the switches (for example, N-channel MIS transistor) SW11 and SW12 are turned on and the switches (for example, P-channel MIS transistor) SW21 and SW22 are turned off.

Then, on the basis of the control signals Aj, Bj, Cj, Dj, bAj, bBj, bCj, and bDj, the spin-injection current is passed through the spin-injection FET SP and the assist magnetic field is generated by the assist current, which allows the writing to be performed to the spin-injection FET SP to determine the state (parallel/anti-parallel).

During the normal action, the control signal CNT is set at "L", the switches SW 11 and SW 12 are turned off, and the switches SW21 and SW22 are turned on. Therefore, the spin-injection FETs SP and SN are connected between the power supply terminals Vdd and Vss, and the output signal Vout is obtained.

Then, an example of a device structure of the re-configurable logic circuit will be described.

Figure 72:
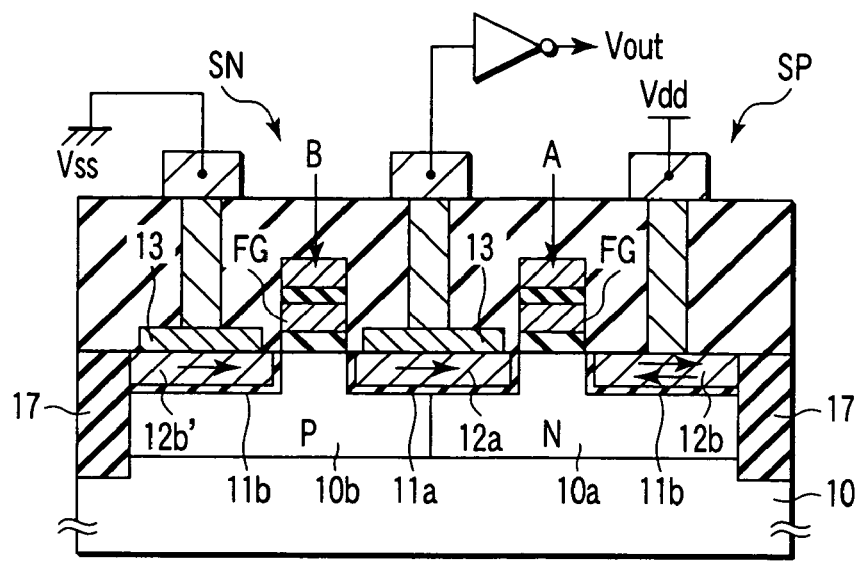
FIG. 72 is a view showing an example of a device structure.

FIG. 72 is a sectional view taken along line LXXII—LXXII of FIG. 72, and FIG. 72 shows an example of the device structures of the re-configurable logic circuits of FIGS. 67 to 69.

The device has the features in that the floating gate FG of the two spin-injection FETs SP and SN are electrically connected and the drains of the two spin-injection FETs SP and SN are formed by one ferromagnetic body 12a.

The element separation insulating layer 17 having, e.g., the STI structure is formed in the semiconductor substrate 10. An N-type well area 10a and a P-type well area 10b are formed in the element area surrounded by the element separation insulating layer 17.

The ferromagnetic body 12a is formed in the recess portion provided in a boundary between the N-type well area 10a and the P-type well area 10b. The ferromagnetic body 12a is the pinned layer whose magnetization direction is fixed. The ferromagnetic body 12a becomes the drains of the spin-injection FETs SP and SN.

The anti-ferromagnetic body 13 is formed on the ferromagnetic body 12a. The tunnel barrier layer 11a is formed between the semiconductor substrate 10 and the ferromagnetic body 12a.

The ferromagnetic body 12b is formed in the recess portion provided in the N-type well area 10a. The ferromagnetic body 12b is the free layer whose magnetization direction is changed. The ferromagnetic body 12b becomes the source of the spin-injection FET SP. A ferromagnetic body 12b' whose magnetization direction is fixed is formed in the recess portion provided in the P-type well area 10b. The ferromagnetic body 12b' becomes the source of the spin-injection FET SN.

The anti-ferromagnetic body 13 is formed on the ferromagnetic body 12b'. The tunnel barrier layers 11b are formed between the semiconductor substrate 10 and the ferromagnetic bodies 12b and 12b' respectively.

The floating gate FG is formed on the channel between the ferromagnetic bodies 12a and 12b through the gate insulating layer. The gate is formed on the floating gate FG through the insulating layer made of, e.g., ONO (oxide/nitride/oxide), and the input signal A is supplied to the gate.

The floating gate FG is formed on the channel between the ferromagnetic bodies 12a and 12b' through the gate insulating layer. The gate is formed on the floating gate FG through the insulating layer made of, e.g., ONO, and the input signal B is supplied to the gate.

As described above, according to the first example, the re-configurable logic circuit having the excellent thermal stability can be realized by applying the spin-injection FET according to the embodiments of the invention to the re-configurable logic circuit.

B. Second Embodiment

Figure 73:
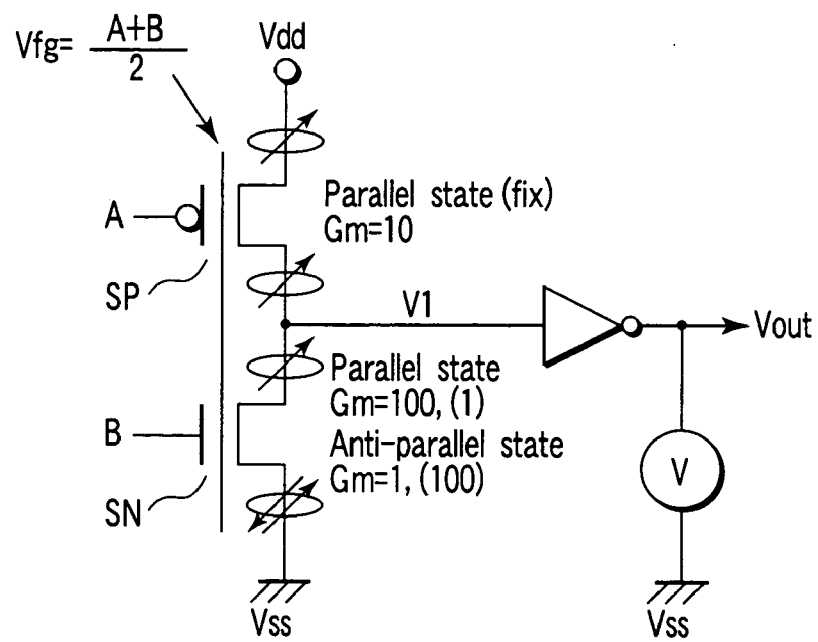
FIG. 73 is a view showing a second example of the re-configurable logic circuit.

FIG. 73 shows a second example of the re-configurable logic circuit.

In the second example, the two spin-injection FETs according to the embodiment of the invention are connected in series between power supply terminals Vdd and Vss.

The spin-injection FET SP is the P-type, and the input signal A is inputted to the gate. In the spin-injection FET SP, the magnetization states of the magnetoresistive elements are fixed in the parallel state in the second example. The conductance Gm of the spin-injection FET SP is set at "10" when the ratio of the conductance Gm of the spin-injection FET SN has the relationship described below.

The spin-injection FET SN is the N-type, and the input signal B is inputted to the gate. In the spin-injection FET SN, the magnetization states (parallel/anti-parallel) of the magnetoresistive elements are rewritable by the writing technique according to the embodiment of the invention.

In the conductance Gm of the spin-injection FET SN, the materials, the dimensions, and the like are determined such that the ratio of the value in the parallel state and the value in the anti-parallel state becomes, e.g., "100:1".

The ratio of the conductance Gm in the parallel state and the conductance Gm in the anti-parallel state may be the reverse relation, i.e., "1:100".

In the two spin-injection FETs SP and SN, as with the first example, for example, the common floating gate can be provided. In this case, because (A+B)/2 can be generated as the voltage Vfg of the common floating gate, in forming the stable logic, it is preferable that the common floating gate is provided.

The signal V1 at the connection point between the spin-injection FETs SP and SN becomes the output signal Vout when the signal V1 passes through the inverter.

In the re-configurable logic circuit of FIG. 73, assuming that the magnetization states of the magnetoresistive elements in the spin-injection FET SN are set in the parallel state or the anti-parallel state and the conductance Gm is set at "100" (conductance Gm of spin-injection FET SN is set at "10"), as shown in Table 3, the output signal Vout becomes OR (Y=A+B) of the input signals A and B.

TABLE 3

| SP: Parallel state (Anti-parallel state) Gm = 100 → OR gate Y = A + B | | | | | | |
|---|---|---|---|---|---|---|
| A | B | Vfg | SP | SN | V1 | Y(=Vout) |
| 0 | 0 | 0 | On | Off | 1 | 0 |
| 0 | 1 | ½ | On | On | 1 | 1 |
| 1 | 0 | ½ | On | On | 1 | 1 |
| 1 | 1 | 1 | Off | On | 0 | 1 |

Where, in Table 3, the logic value of "1" corresponds to "H (high)" and the logic value of "0" corresponds to "L (low)". The logic value of "½" corresponds to the intermediate voltage between "H" and "L".

Namely, when both the input signals A and B are "1", the common floating gate voltage Vfg becomes "1". At this point, the spin-injection FET SP is turned off and the spin-injection FET SN is turned on, so that V1 becomes "0" and the output signal Vout becomes "1".

When both the input signals A and B are "0", the common floating gate voltage Vfg becomes "0". At this point, the spin-injection FET SP is turned on and the spin-injection FET SN is turned off, so that V1 becomes "1" and the output signal Vout becomes "0".

When one of the input signals A and B is "1" and the other is "0", the common floating gate voltage Vfg becomes "½". At this point, both the spin-injection FETs SP and SN are turned on.

However, the conductance Gm of the spin-injection FET SP is set at "10" and the conductance Gm of the spin-injection FET SN is set at "100", so that the ratio of the currents passed through the spin-injection FETs SP and SN becomes "10:100"="1:10".

Accordingly, because the ability to pull down V1 to Vss (="0") surpasses the ability to pull up V1 to Vdd (="1"), V1 becomes "0" and the output signal Vout becomes "1".

In the re-configurable logic circuit of FIG. 73, assuming that the magnetization states of the magnetoresistive elements in the spin-injection FET SN are set in the parallel state or the anti-parallel state and the conductance Gm is "1" (conductance Gm of spin-injection FET SP is "10"), as shown in Table 4, the output signal Vout becomes AND (Y=A·B) of the input signals A and B.

TABLE 4

| SP: Anti-parallel state (Parallel state) Gm = 1 → AND gate Y = A · B | | | | | | |
|---|---|---|---|---|---|---|
| A | B | Vfg | SP | SN | V1 | Y(=Vout) |
| 0 | 0 | 0 | On | Off | 1 | 0 |
| 0 | 1 | ½ | On | On | 1 | 0 |
| 1 | 0 | ½ | On | On | 1 | 0 |
| 1 | 1 | 1 | Off | On | 0 | 1 |

Where, in Table 4, the logic value of "1" corresponds to "H (high)" and the logic value of "0" corresponds to "L (low)". The logic value of "½" corresponds to the intermediate voltage between "H" and When both the input signals A and B are "1", the common floating gate voltage Vfg becomes "1". At this point, the spin-injection FET SP is turned off and the spin-injection FET SN is turned on, so that V1 becomes "0" and the output signal Vout becomes "1".

When both the input signals A and B are "0", the common floating gate voltage Vfg becomes "0". At this point, the spin-injection FET SP is turned on and the spin-injection FET SN is turned off, so that V1 becomes "1" and the output signal Vout becomes "0".

When one of the input signals A and B is "1" and the other is "0", the common floating gate voltage Vfg becomes "½". At this point, both the spin-injection FETs SP and SN are turned on.

However, the conductance Gm of the spin-injection FET SP is set at "10" and the conductance Gm of the spin-injection FET SN is set at "1", so that the ratio of the currents passed through the spin-injection FETs SP and SN becomes "10:1".

Accordingly, because the ability to pull up V1 to Vdd (="1") surpasses the ability to pull down V1 to Vss (="0"), V1 becomes "1" and the output signal Vout becomes "0".

Thus, according to the re-configurable logic circuit to which the spin-injection FET according to the embodiments of the invention is applied, the magnetization state (parallel/anti-parallel) of the spin-injection FET SN is rewritten to change the conductance Gm based on the program data, which allows one of the plural pieces of logic to be selectively realized by one logic circuit with no redesign.

In the re-configurable logic circuit of the second example, the N-channel spin-injection FET SP is fixed in the parallel state and the conductance Gm is fixed at "10".

Herein, for the spin-injection FET SP, the conductance Gm is fixed at "10". Therefore, for example, the normal P-channel MIS transistor SP may be used as shown in FIG. 74, or the P-channel spin-injection FET SP which is in the anti-parallel state may be used as shown in FIG. 75.

Figure 74:
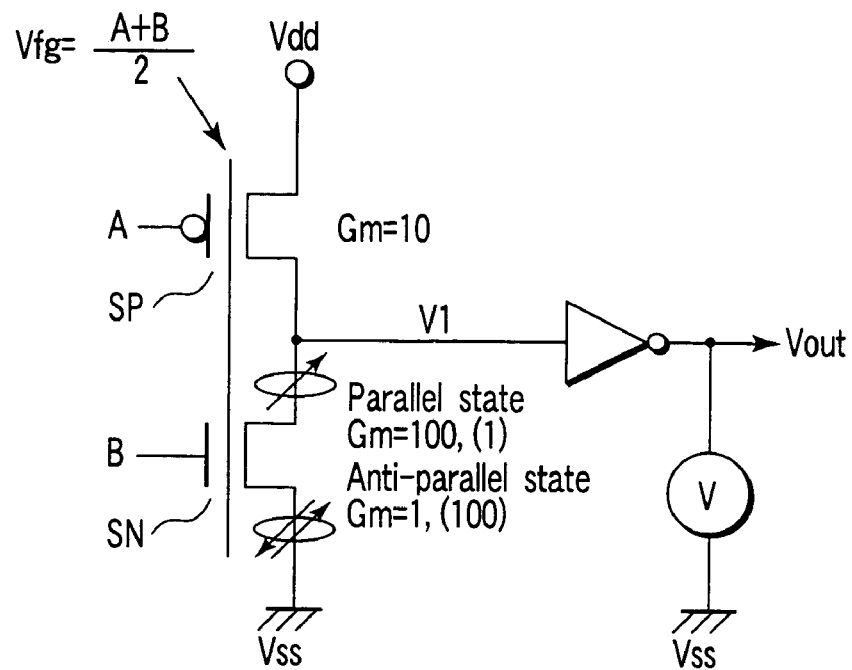
FIG. 74 is a view showing the second example of the re-configurable logic circuit.
Figure 75:
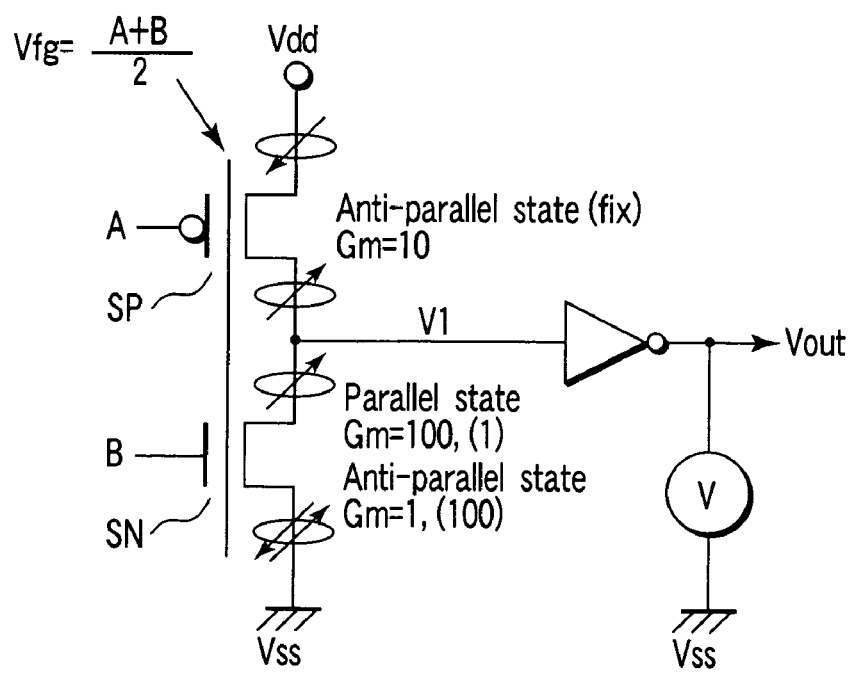
FIG. 75 is a view showing the second example of the re-configurable logic circuit.
Figure 76:
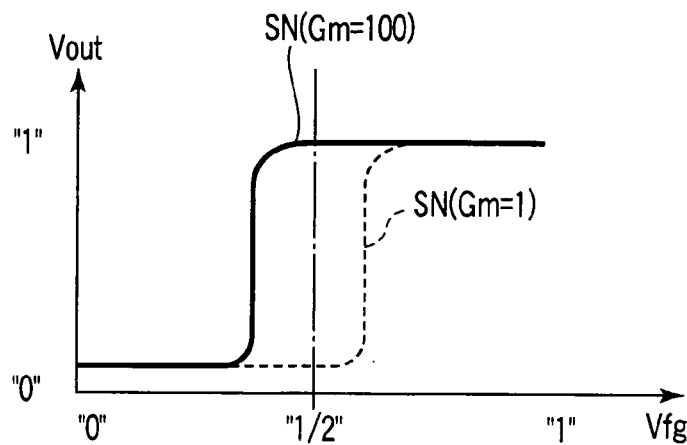
FIG. 76 is a view showing a relationship between the floating gate voltage Vfg and the output signal Vout.

FIG. 76 shows a relationship between the common floating gate voltage Vfg and the output voltage Vout in the re-configurable logic circuits of FIGS. 73 to 75.

The re-configurable logic circuits of FIGS. 73 to 75 have the feature in that the output voltage Vout is changed according to the magnetization state (parallel/anti-parallel) of the spin-injection FET SN when the common floating gate voltage Vfg is "½".

The re-configurable logic circuits of FIGS. 73 to 75 require the driver/sinker which changes the magnetization state (parallel/anti-parallel) of the N-channel spin-injection FET SN based on the program data.

Figure 77:
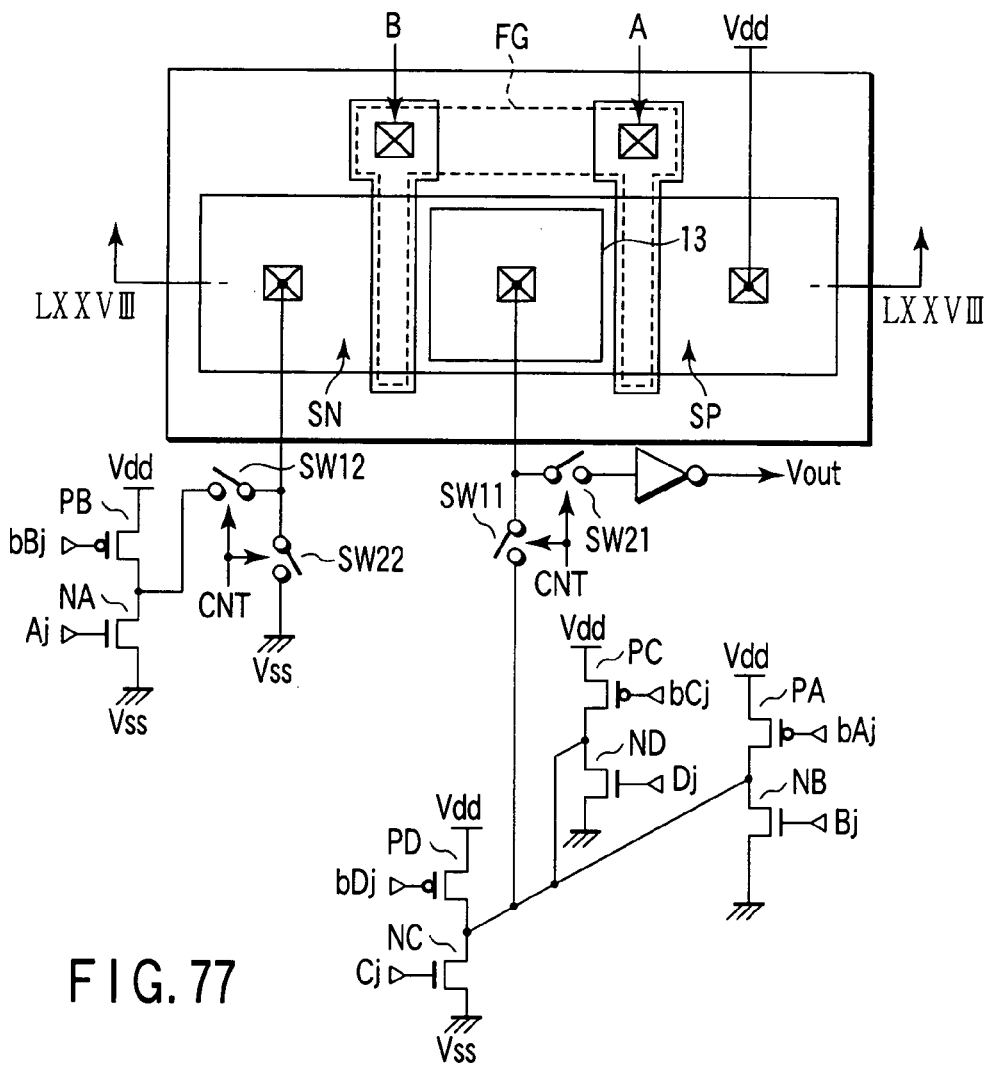
FIG. 77 is a view showing an example of the driver/sinker.

FIG. 77 shows an example of the driver/sinker which changes the magnetization state of the spin-injection FETs SN FIGS. 73 to 75.

The input signal A is inputted to the gate of the P-channel spin-injection FET SP and the input signal B is inputted to gate of the N-channel spin-injection FET SN. Only one floating gate FG is provided for the two spin-injection FETs SP and SN, and the floating gate FG is shared between the spin-injection FETs SP and SN.

The sources of the spin-injection FET SP is connected to the power supply terminal Vdd.

The drains of the spin-injection FETs SP and SN are connected through the switch SW11 to the P-channel MIS transistor PA and the N-channel MIS transistor NB which are of the driver/sinker for controlling the generation/cutoff of the spin-injection current. The control signal bAj is inputted to the gate of the P-channel MIS transistor PA and the control signal Bj is inputted to the gate of the N-channel MIS transistor NB.

The drains of the spin-injection FETs SP and SN are also connected through the switch SW11 to the P-channel MIS transistor PC and the N-channel MIS transistor ND which are of the driver/sinker for controlling the generation/cutoff of the assist current generating the assist magnetic field. The control signal bCj is inputted to the gate of the P-channel MIS transistor PC and the control signal Dj is inputted to the gate of the N-channel MIS transistor ND.

The drains of the spin-injection FETs SP and SN are also connected through the switch SW11 to the P-channel MIS transistor PD and the N-channel MIS transistor NC which are of the driver/sinker for controlling the generation/cutoff of the assist current generating the assist magnetic field. The control signal bDj is inputted to the gate of the P-channel MIS transistor PD and the control signal Cj is inputted to the gate of the N-channel MIS transistor NC.

The drains of the spin-injection FETs SP and SN are connected to the inverter through the switch SW21. The output signal Vout is obtained from the inverter.

The source of the spin-injection FET SN is connected through the switch SW12 to the P-channel MIS transistor PB and the N-channel MIS transistor NA which are of the driver/sinker for controlling the generation/cutoff of the spin-injection current. The control signal bBj is inputted to the gate of the P-channel MIS transistor PB and the control signal Aj is inputted to the gate of the N-channel MIS transistor NA.

The source of the spin-injection FET SN is connected to the ground point Vss through the switch SW22.

In such a re-configurable logic circuit of the second example, the kind of the logic is determined based on the program data in shipping on the manufacturer side or in programming for the setting on the user side after the shipping.

In this case, the control signal CNT is set at "H", and the switches (for example, N-channel MIS transistor) SW11 and SW12 are turned on and the switches (for example, P-channel MIS transistor) SW21 and SW22 are turned off.

Then, on the basis of the control signals Aj, Bj, Cj, Dj, bAj, bBj, bCj, and bDj, the spin-injection current is passed through the spin-injection FET SN and the assist magnetic field is generated by the assist current, which allows the writing to be performed to the spin-injection FET SN to determine the state (parallel/anti-parallel).

During the normal action, the control signal CNT is set at "L", the switches SW 11 and SW 12 are turned off, and the switches SW21 and SW22 are turned on so that the spin-injection FETs SP and SN can be connected between the power supply terminals Vdd and Vss, and the output signal Vout is obtained.

Then, an example of the device structure of the re-configurable logic circuit will be described.

FIG. 78 is a sectional view taken along line LXXIII—LXXIII of FIG. 77, and FIG. 78 shows an example of the device structures of the re-configurable logic circuits of FIGS. 73 to 75.

The device has the features in that the floating gate FG of the two spin-injection FETs SP and SN are electrically connected and the drains of the two spin-injection FETs SP and SN are formed by one ferromagnetic body 12a.

The element separation insulating layer 17 having, e.g., the STI structure is formed in the semiconductor substrate 10. The N-type well area 10a and the P-type well area 10b are formed in the element area surrounded by the element separation insulating layer 17.

The ferromagnetic body 12a is formed in the recess portion provided in the boundary between the N-type well area 10a and the P-type well area 10b. The ferromagnetic body 12a is the pinned layer whose magnetization direction is fixed. The ferromagnetic body 12a becomes the drains of the spin-injection FETs SP and SN.

The anti-ferromagnetic body 13 is formed on the ferromagnetic body 12a. The tunnel barrier layer 11a is formed between the semiconductor substrate 10 and the ferromagnetic body 12a.

The ferromagnetic body 12b' is formed in the recess portion provided in the N-type well area 10a. The magnetization direction is fixed in the ferromagnetic body 12b'. The ferromagnetic body 12b becomes the source of the spin-injection FET SP.

A ferromagnetic body 12b whose magnetization direction is changed is formed in the recess portion provided in the P-type well area 10b. The ferromagnetic body 12b becomes the source of the spin-injection FET SN.

The anti-ferromagnetic body 13 is formed on the ferromagnetic body 12b'. The tunnel barrier layers 11b are formed between the semiconductor substrate 10 and the ferromagnetic bodies 12b and 12b' respectively.

The floating gate FG is formed on the channel between the ferromagnetic bodies 12a and 12b' through the gate insulating layer. The gate is formed on the floating gate FG through the insulating layer made of, e.g., ONO (oxide/nitride/oxide), and the input signal A is supplied to the gate.

The floating gate FG is formed on the channel between the ferromagnetic bodies 12a and 12b through the gate insulating layer. The gate is formed on the floating gate FG through the insulating layer made of, e.g., ONO, and the input signal B is supplied to the gate.

As described above, according to the second example, the re-configurable logic circuit having the excellent thermal stability can be realized by applying the spin-injection FET according to the embodiments of the invention to the re-configurable logic circuit.

C. Other

The pair of the P-channel type spin-injection FET and the N-channel type spin-injection FET is used in the first and second examples. However, the invention is not limited to the type of conductivity of the transistor as long as the same logic is realized.

The spin-injection FET shown in FIG. 1 which is of the structure can also be applied to the re-configurable logic circuit.

(2) Application to Magnetic Random Access Memory

Examples of the case in which the spin-injection FET according to the embodiments of the invention is applied to the magnetic random access memory will be described below.

In the following descriptions, b* should mean an inversion signal in which the logic of * is inversed (*** is an arbitrary sign. i should mean the ith row in the plural rows, and j should mean the jth column in the plural columns.

A. First Example

A first example is one in which the path of the spin-injection current Is and the path of the assist current Ia overlap each other.

FIGS. 79 and 80 show the first example of the magnetic random access memory.

The memory cell array includes the plural spin-injection FETs which are arranged in an array shape. For example, one memory cell is formed by one spin-injection FET. One of the source and the drain of the spin-injection FET is connected to the bit line BL(L), and the other is connected to the bit line BL(R). The both bit lines BL(L) and BL(R) extend in the same direction. That is, in the first example, the bit lines BL(L) and BL(R) extend in the column direction.

One end of the bit line BL(L) is connected to a CMOS type driver/sinker DS1. The driver/sinker DS1 includes the P-channel MIS transistor PB and the N-channel MIS transistor NA which control the generation/cutoff of the spin-injection current Is. The P-channel MIS transistor PB and the N-channel MIS transistor NA are connected in series between the power supply terminals Vdd and Vss.

One end of the bit line BL(L) is also connected to the connection point between the MIS transistors PB and NA. The control signal bBj is inputted to the gate of the P-channel MIS transistor PB, and the control signal Aj is inputted to the gate of the N-channel MIS transistor NA.

The other end of the bit line BL(L) is connected to the sense amplifier S/A through the N-channel MIS transistor NF which is of the column selection switch. The sense amplifier S/A includes, e.g., a differential amplifier, and the sense amplifier S/A determines the value of data stored in the spin-injection FET based on a reference voltage REF.

An output signal of the sense amplifier S/A becomes readout data Rout of the selected spin-injection FET.

A control signal Fj is a column selection signal for selecting the column j, and the control signal Fj is inputted to the gate of the N-channel MIS transistor NF.

One end of the bit line BL(R) is connected to a CMOS type driver/sinker DS2. The driver/sinker DS2 includes the P-channel MIS transistor PA and the N-channel MIS transistor NB which control the generation/cutoff of the spin-injection current Is. The P-channel MIS transistor PA and the N-channel MIS transistor NB are connected in series between the power supply terminals Vdd and Vss.

One end of the bit line BL(R) is also connected to the connection point between the MIS transistors PA and NB. The control signal bAj is inputted to the gate of the P-channel MIS transistor PA, and the control signal Bj is inputted to the gate of the N-channel MIS transistor NB.

The driver/sinker DS2 also includes the P-channel MIS transistor PC and the N-channel MIS transistor ND which control the generation/cutoff of the assist current Ia. The P-channel MIS transistor PC and the N-channel MIS transistor ND are connected in series between the power supply terminals Vdd and Vss.

One end of the bit line BL(R) is also connected to the connection point between the MIS transistors PC and ND.

The control signal bCj is inputted to the gate of the P-channel MIS transistor PC, and the control signal Dj is inputted to the gate of the N-channel MIS transistor ND.

The other end of the bit line BL(R) is connected to a CMOS type driver/sinker DS3. The driver/sinker DS3 includes the P-channel MIS transistor PD and the N-channel MIS transistor NC which control the generation/cutoff of the assist current Ia. The P-channel MIS transistor PD and the N-channel MIS transistor NC are connected in series between the power supply terminals Vdd and Vss.

The other end of the bit line BL(R) is also connected to the connection point between the MIS transistors PD and NC. The control signal bDj is inputted to the gate of the P-channel MIS transistor PD, and the control signal Cj is inputted to the gate of the N-channel MIS transistor NC.

The driver/sinker DS3 also includes the N-channel MIS transistor NE which is turned on during the readout. The N-channel MIS transistor NE is connected between the bit line BL(R) and the power supply terminal Vss.

A control signal Ei is a row selection signal for selecting the row i, and the control signal Ei is inputted to the gate of the N-channel MIS transistor NE.

In such a magnetic random access memory of the first example, for example, in the case where the spin-injection FET which is of the memory cell is the N-channel type, the control signal Wi is set at "H", the control signals bBj and Aj are set at "L", and the control signals bAj and Bj are set at "H", which results in the passage of the spin-injection current Is from the driver/sinker DS1 toward the driver/sinker DS2.

On the other hand, the control signal Wi is set at "H", the control signals bBj and Aj are set at "H", and the control signals bAj and Bj are set at "L", which results in the passage of the spin-injection current Is from the driver/sinker DS2 toward the driver/sinker DS1.

At this point, the assist current Ia generating the assist magnetic field is passed through the bit line BL(R).

In the case of the passage of the spin-injection current Is from the driver/sinker DS1 toward the driver/sinker DS2, the control signals bCj and Dj become "H" and the control signals bDj and Cj become "L", which results in the passage of the assist current Ia from the driver/sinker DS3 toward the driver/sinker DS2.

In the case of the passage of the spin-injection current Is from the driver/sinker DS2 toward the driver/sinker DS1, the control signals bCj and Dj become "L" and the control signals bDj and Cj become "H", which results in the passage of the assist current Ia from the driver/sinker DS2 toward the driver/sinker DS3.

The case of FIG. 79 differs from the case of FIG. 80 in the direction of the spin-injection FET as the memory cell.

That is, in the case of FIG. 79, the row direction is a channel length direction of the spin-injection FET and the column direction is a channel width direction. On the other hand, in the case of FIG. 80, the column direction is the channel length direction of the spin-injection FET and the row direction is the channel width direction.

B. Second Example

A second example is one in which the path of the spin-injection current Is and the path of assist current Ia are completely separated from each other.

Figure 81:
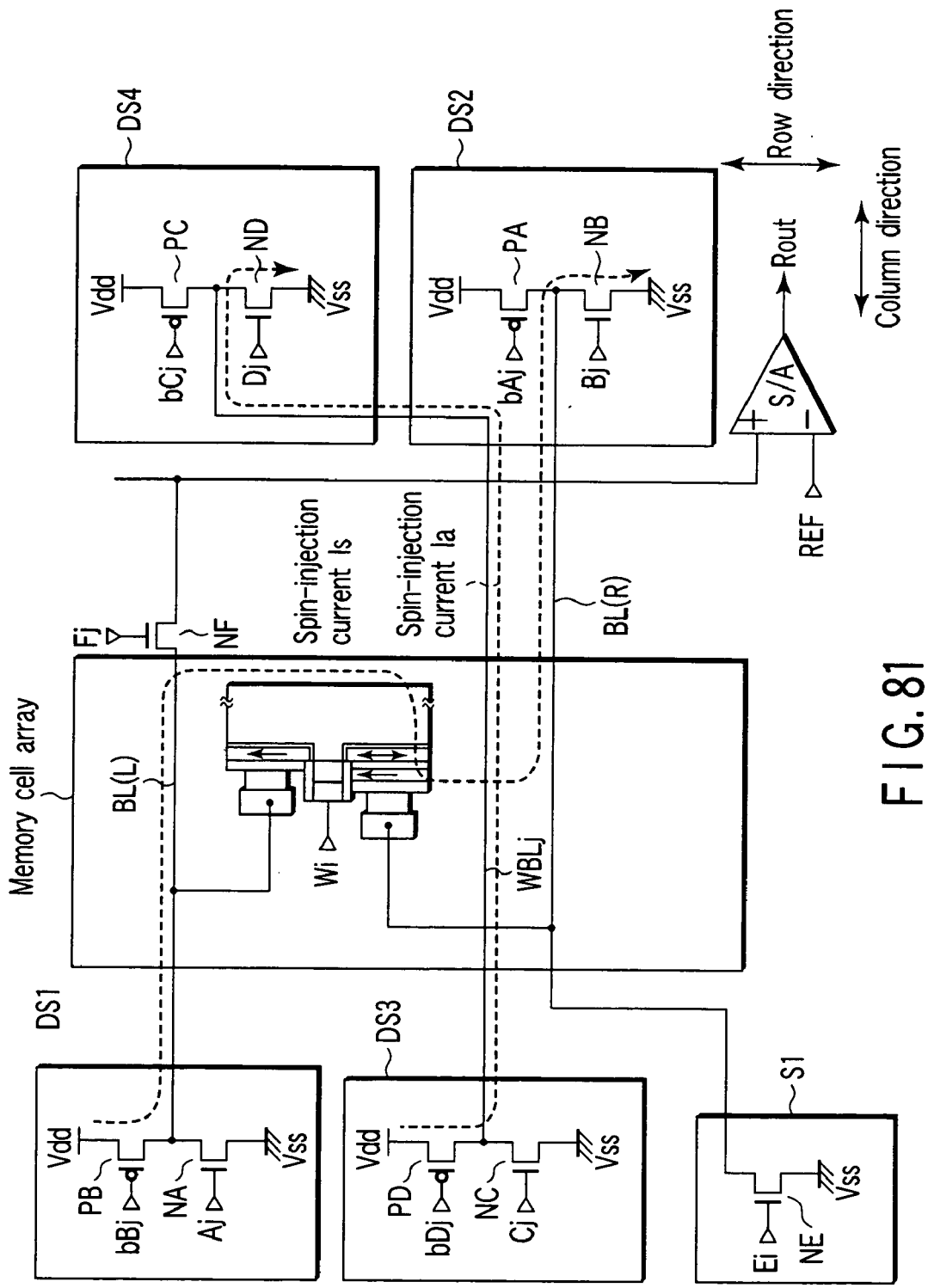
FIG. 81 is a view showing a second example of the magnetic random access memory.

FIGS. 81 and 82 show the second example of the magnetic random access memory.

The memory cell array includes the plural spin-injection FETs which are arranged in an array shape. For example, one memory cell is formed by one spin-injection FET.

One of the source and the drain of the spin-injection FET is connected to the bit line BL(L), and the other is connected to the bit line BL(R). The bit lines BL(L) and BL(R) extend in the same direction. That is, in the second example, the bit lines BL(L) and BL(R) extend in the column direction.

The writing bit line WBLj extends in the column direction in parallel with the bit line BL(R). Because the assist current Ia for generating the assist magnetic field is passed through the writing bit line WBLj, it is preferable that the writing bit line WBLj is provided near the free layer of the magnetoresistive element.

One end of the bit line BL(L) is connected to the CMOS type driver/sinker DS1. The driver/sinker DS1 includes the P-channel MIS transistor PB and the N-channel MIS transistor NA which control the generation/cutoff of the spin-injection current Is. The P-channel MIS transistor PB and the N-channel MIS transistor NA are connected in series between the power supply terminals Vdd and Vss.

One end of the bit line BL(L) is also connected to the connection point between the MIS transistors PB and NA. The control signal bBj is inputted to the gate of the P-channel MIS transistor PB, and the control signal Aj is inputted to the gate of the N-channel MIS transistor NA.

The other end of the bit line BL(L) is connected to the sense amplifier S/A through the N-channel MIS transistor NF which is of the column selection switch. The sense amplifier S/A includes, e.g., the differential amplifier, and the sense amplifier S/A determines the value of data stored in the spin-injection FET based on the reference voltage REF.

The output signal of the sense amplifier S/A becomes the readout data Rout of the selected spin-injection FET.

The control signal Fj is the column selection signal for selecting the column j, and the control signal Fj is inputted to the gate of the N-channel MIS transistor NF.

One end of the bit line BL(R) is connected to the CMOS type driver/sinker DS2. The driver/sinker DS2 includes the P-channel MIS transistor PA and the N-channel MIS transistor NB which control the generation/cutoff of the spin-injection current Is. The P-channel MIS transistor PA and the N-channel MIS transistor NB are connected in series between the power supply terminals Vdd and Vss.

One end of the bit line BL(R) is also connected to the connection point between the MIS transistors PA and NB. The control signal bAj is inputted to the gate of the P-channel MIS transistor PA, and the control signal Bj is inputted to the gate of the N-channel MIS transistor NB.

The other end of the bit line BL(R) is connected to a sinker S1. The sinker S1 includes the N-channel MIS transistor NE which is turned on during the readout. The N-channel MIS transistor NE is connected between the bit line BL(R) and the power supply terminal Vss.

The control signal Ei is the row selection signal for selecting the row i, and the control signal Ei is inputted to the gate of the N-channel MIS transistor NE.

One end of the writing bit line WBLj is connected to the CMOS type driver/sinker DS3. The driver/sinker DS3 includes the P-channel MIS transistor PD and the N-channel MIS transistor NC which control the generation/cutoff of the assist current Ia. The P-channel MIS transistor PD and the N-channel MIS transistor NC are connected in series between the power supply terminals Vdd and Vss.

One end of the writing bit line WBLj is also connected to the connection point between the MIS transistors PD and NC. The control signal bDj is inputted to the gate of the P-channel MIS transistor PD, and the control signal Cj is inputted to the gate of the N-channel MIS transistor NC.

The other end of the writing bit line WBLj is connected to a CMOS type driver/sinker DS4. The driver/sinker DS4 includes the P-channel MIS transistor PC and the N-channel MIS transistor ND which control the generation/cutoff of the assist current Ia. The P-channel MIS transistor PC and the N-channel MIS transistor ND are connected in series between the power supply terminals Vdd and Vss.

The other end of the writing bit line WBLj is also connected to the connection point between the MIS transistors PC and ND. The control signal bCj is inputted to the gate of the P-channel MIS transistor PC, and the control signal Dj is inputted to the gate of the N-channel MIS transistor ND.

In the magnetic random access memory of the second example, for example, in the case where the spin-injection FET which is of the memory cell is the N-channel type, the control signal Wi is set at "H", the control signals bBj and Aj are set at "L", and the control signals bAj and Bj are set at "H", which results in the passage of the spin-injection current Is from the driver/sinker DS1 toward the driver/sinker DS2.

On the other hand, the control signal Wi is set at "H", the control signals bBj and Aj are set at "H", and the control signals bAj and Bj are set at "L", which results in the passage of the spin-injection current Is from the driver/sinker DS2 toward the driver/sinker DS1.

At this point, the assist current Ia generating the assist magnetic field is passed through the writing bit line WBLj which is completely independent of the bit lines BL(L) and BL(R) through which the spin-injection current Is is passed.

In the case of the passage of the spin-injection current Is from the driver/sinker DS1 toward the driver/sinker DS2, the control signals bCj and Dj become "H" and the control signals bDj and Cj become "L", which results in the passage of the assist current Ia from the driver/sinker DS3 toward the driver/sinker DS4.

In the case of the passage of the spin-injection current Is from the driver/sinker DS2 toward the driver/sinker DS1, the control signals bCj and Dj become "L" and the control signals bDj and Cj become "H", which results in the passage of the assist current Ia from the driver/sinker DS4 toward the driver/sinker DS3.

The case of FIG. 81 differs from the case of FIG. 82 in the direction of the spin-injection FET as the memory cell.

That is, in the case of FIG. 81, the row direction is the channel length direction of the spin-injection FET and the column direction is the channel width direction. On the other hand, in the case of FIG. 82, the column direction is the channel length direction of the spin-injection FET and the row direction is the channel width direction.

C. Third Example

As with the second example, a third example is one in which the path of the spin-injection current Is and the path of assist current Ia are completely separated from each other. The third example differs from the second embodiment in the extending direction of the independent writing line though which the assist current is passed.

Figure 83:
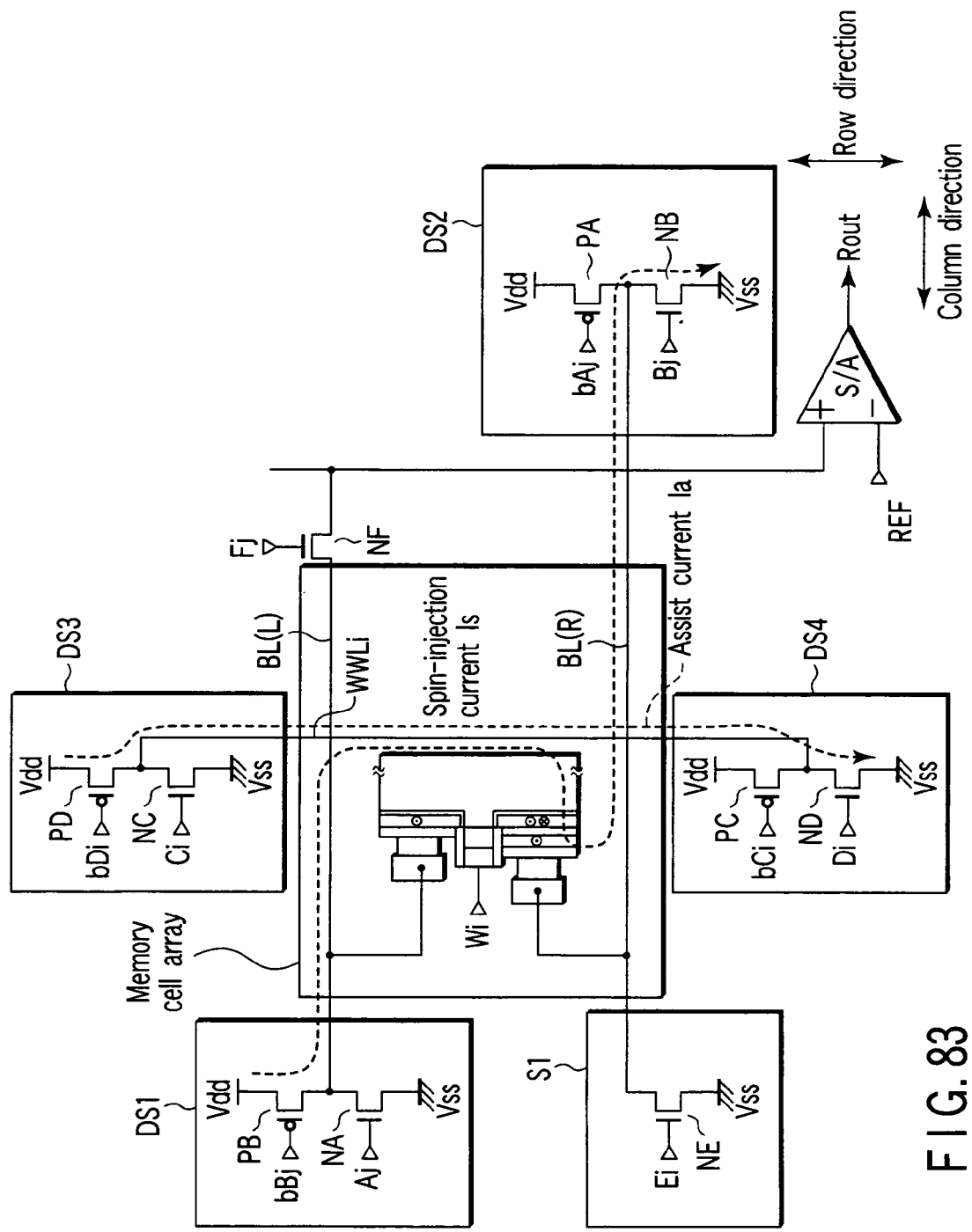
FIG. 83 is a view showing a third example of the magnetic random access memory.
Figure 84:
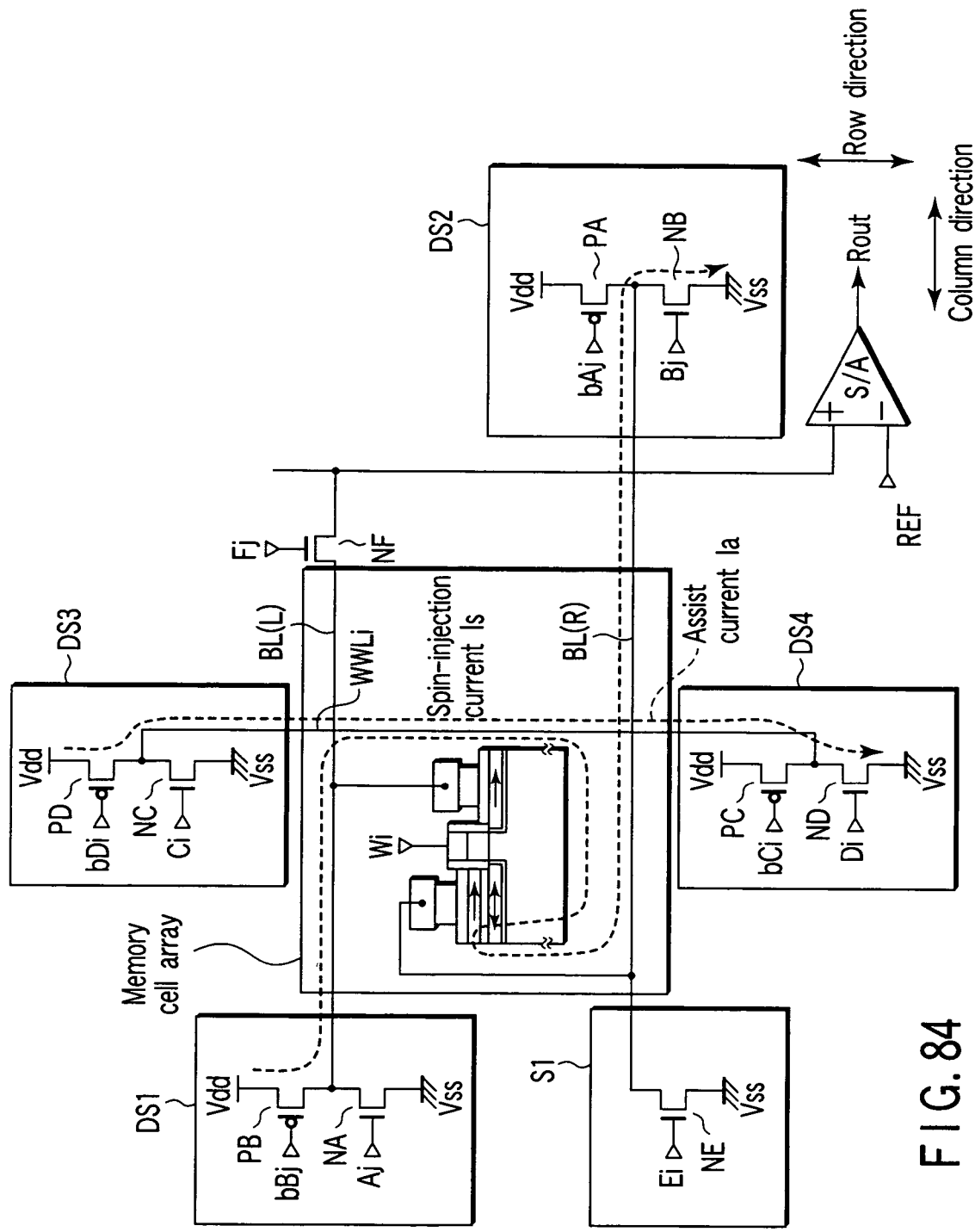
FIG. 84 is a view showing the third example of the magnetic random access memory.

FIGS. 83 and 84 show the third example of the magnetic random access memory.

The memory cell array includes the plural spin-injection FETs which are arranged in an array shape. For example, one memory cell is formed by one spin-injection FET.

One of the source and the drain of the spin-injection FET is connected to the bit line BL(L), and the other is connected to the bit line BL(R). Both of the bit lines BL(L) and BL(R) extend in the same direction. That is, in the third example, the bit lines BL(L) and BL(R) extend in the column direction.

The writing bit line WBLj extends in the row direction while intersecting the bit lines BL(L) and BL(R). Because the assist current Ia for generating the assist magnetic field is passed through the writing word line WWLi, it is preferable that the writing word line WWLi is provided near the free layer of the magnetoresistive element.

One end of the bit line BL(L) is connected to the CMOS type driver/sinker DS1. The driver/sinker DS1 includes the P-channel MIS transistor PB and the N-channel MIS transistor NA which are connected in series between the power supply terminals Vdd and Vss, and control the generation/cutoff of the spin-injection current Is. One end of the bit line BL(L) is also connected to the connection point between the MIS transistors PB and NA. The control signal bBj is inputted to the gate of the P-channel MIS transistor PB, and the control signal Aj is inputted to the gate of the N-channel MIS transistor NA.

The other end of the bit line BL(L) is connected to the sense amplifier S/A through the N-channel MIS transistor NF which is of the column selection switch. The sense amplifier S/A includes, e.g., the differential amplifier, and the sense amplifier S/A determines the value of data stored in the spin-injection FET based on the reference voltage REF.

The output signal of the sense amplifier S/A becomes the readout data Rout of the selected spin-injection FET.

The control signal Fj is the column selection signal for selecting the column j, and the control signal Fj is inputted to the gate of the N-channel MIS transistor NF.

One end of the bit line BL(R) is connected to the CMOS type driver/sinker DS2. The driver/sinker DS2 includes the P-channel MIS transistor PA and the N-channel MIS transistor NB which control the generation/cutoff of the spin-injection current Is. The P-channel MIS transistor PA and the N-channel MIS transistor NB are connected in series between the power supply terminals Vdd and Vss.

One end of the bit line BL(R) is also connected to the connection point between the MIS transistors PA and NB. The control signal bAj is inputted to the gate of the P-channel MIS transistor PA, and the control signal Bj is inputted to the gate of the N-channel MIS transistor NB.

The other end of the bit line BL(R) is connected to the sinker S1. The sinker S1 includes the N-channel MIS transistor NE which is turned on during the readout. The N-channel MIS transistor NE is connected between the bit line BL(R) and the power supply terminal Vss.

The control signal Ei is the row selection signal for selecting the row i, and the control signal Ei is inputted to the gate of the N-channel MIS transistor NE.

One end of the writing bit line WBLj is connected to the CMOS type driver/sinker DS3. The driver/sinker DS3 includes the P-channel MIS transistor PD and the N-channel MIS transistor NC which control the generation/cutoff of the assist current Ia. The P-channel MIS transistor PD and the N-channel MIS transistor NC are connected in series between the power supply terminals Vdd and Vss.

One end of the writing bit line WBLj is also connected to the connection point between the MIS transistors PD and NC. The control signal bDj is inputted to the gate of the P-channel MIS transistor PD, and the control signal Cj is inputted to the gate of the N-channel MIS transistor NC.

The other end of the writing bit line WBLj is connected to the CMOS type driver/sinker DS4. The driver/sinker DS4 includes the P-channel MIS transistor PC and the N-channel MIS transistor ND which control the generation/cutoff of the assist current Ia. The P-channel MIS transistor PC and the N-channel MIS transistor ND are connected in series between the power supply terminals Vdd and Vss.

The other end of the writing bit line WBLj is also connected to the connection point between the MIS transistors PC and ND. The control signal bCj is inputted to the gate of the P-channel MIS transistor PC, and the control signal Dj is inputted to the gate of the N-channel MIS transistor ND.

In the magnetic random access memory of the third example, for example, in the case where the spin-injection FET which is of the memory cell is the N-channel type, the control signal Wi is set at "H", the control signals bBj and Aj are set at "L", and the control signals bAj and Bj are set at "H", which results in the passage of the spin-injection current Is from the driver/sinker DS1 toward the driver/sinker DS2.

On the other hand, the control signal Wi is set at "H", the control signals bBj and Aj are set at "H", and the control signals bAj and Bj are set at "L", which results in the passage of the spin-injection current Is from the driver/sinker DS2 toward the driver/sinker DS1.

At this point, the assist current Ia generating the assist magnetic field is passed through the writing bit line WBLj which is completely independent of the bit lines BL(L) and BL(R) through which the spin-injection current Is is passed.

In the case of the passage of the spin-injection current Is from the driver/sinker DS1 toward the driver/sinker DS2, the control signals bCj and Dj become "H" and the control signals bDj and Cj become "L", which results in the passage of the assist current Ia from the driver/sinker DS3 toward the driver/sinker DS4.

In the case of the passage of the spin-injection current Is from the driver/sinker DS2 toward the driver/sinker DS1, the control signals bCj and Dj become "L" and the control signals bDj and Cj become "H", which results in the passage of the assist current Ia from the driver/sinker DS4 toward the driver/sinker DS3.

The case of FIG. 83 differs from the case of FIG. 84 in the direction of the spin-injection FET as the memory cell.

That is, in the case of FIG. 83, the row direction is the channel length direction of the spin-injection FET and the column direction is the channel width direction. On the other hand, in the case of FIG. 84, the column direction is the channel length direction of the spin-injection FET and the row direction is the channel width direction.

7. Signal Timing Waveform

A signal waveform in writing the program data in the spin-injection FET according to the embodiment of the invention will be described below.

Figure 85:
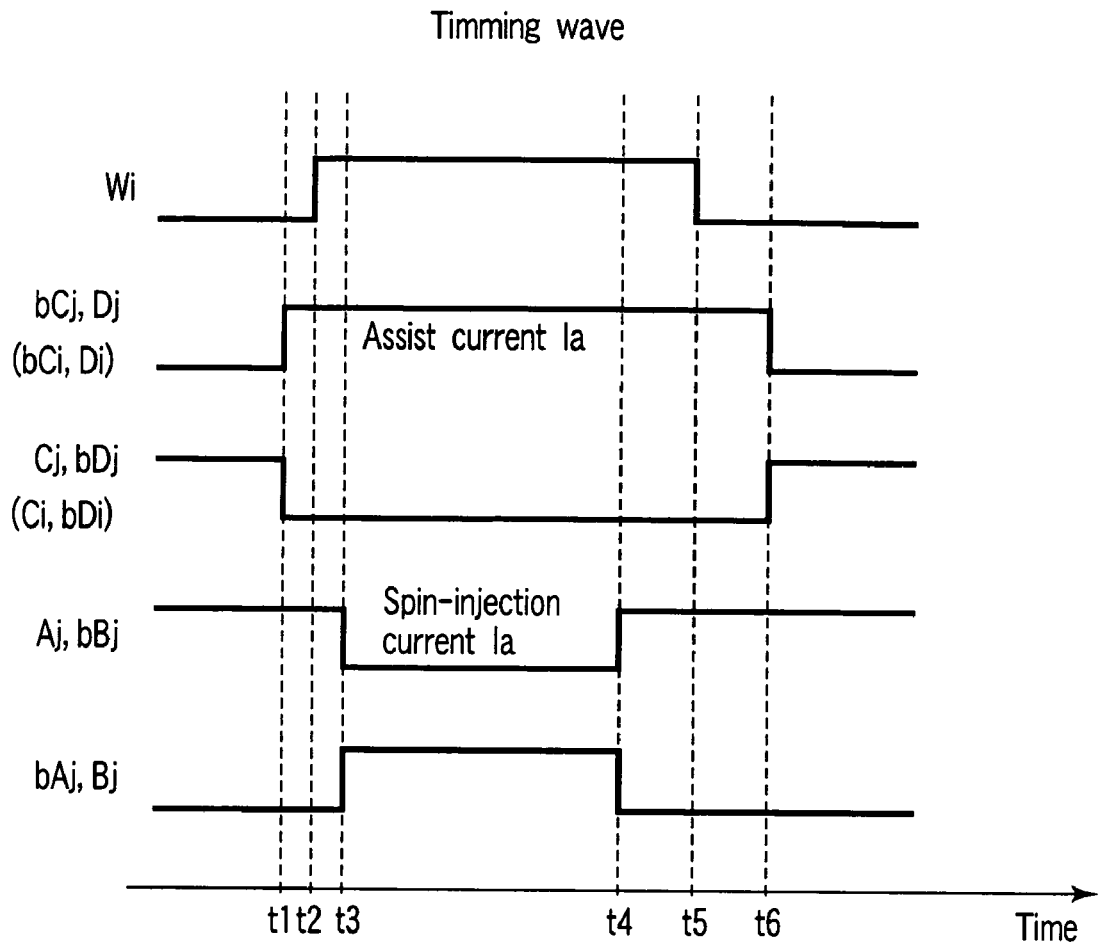
FIG. 85 is a view showing a signal waveform in writing.

FIG. 85 shows a signal waveform in the writing.

The signal timing waveform shown in FIG. 85 is one in which the assist magnetic field is generated before the spin-injection current Is is generated and the assist magnetic field is generated for a predetermined period even after the spin-injection current Is is cut off.

First, at a time t1, the control signals bCj and Dj are set at "H" and the control signals Cl and bDj are set at "L", which results in the passage of the assist current Ia. Thereby, the assist magnetic field is imparted to the free layer of the magnetoresistive element.

After that, at a time t2, the control signal Wi is set at "H" in the case of the N-channel type spin-injection FET, the control signal Wi is set at "L" in the case of the P-channel type spin-injection FET, and the spin-injection FET is turned on.

Then, at a time t3, the control signals bAj and Bj are set at "H" and the control signals Aj and bBj are set at "L", which results in the passage of the spin-injection current Is. Therefore, the writing (magnetization reversal) is performed to the free layer of the magnetoresistive element.

At a time t4, the control signals bAj and Bj are set at "L", the control signals Aj and bBj are set at "H", and the spin-injection current Is is cut off.

At a time t5, the control signal Wi is set at "L" in the case of the N-channel type spin-injection FET, the control signal Wi is set at "H" in the case of the P-channel type spin-injection FET, and the spin-injection FET is turned off.

At a time t6 when the predetermined period elapses from the time t4 at which the spin-injection current Is is cut off, e.g., at the time t6 when tens nanoseconds elapse from the time t4, the control signals bCj and Dj are set at "L", the control signals Cj and bDj are set at "H", the assist current Ia is cut off, and the assist magnetic field is eliminated.

In the signal timing waveform of the embodiments, the assist current Ia is provided to generate the assist magnetic field prior to the passage of the spin-injection current Is. However, as described above, the assist magnetic field may be generated at the same time of the passage of the spin-injection current Is or after the passage of the spin-injection current Is.

8. Decoder

A decoder which generates the control signals Aj, Bj, Cj, Dj, bAJ, bBj, bCj, and bDj and the control signals Ci, Di, bCi, and bDi will be described below.

In writing the data in the spin-injection FET, the decoder controls the driver/sinker to determine the directions of the spin-injection current Is and the assist current Ia according to the value of the program data. The decoder also controls the driver/sinker to determine the timing of the supply/cutoff of the spin-injection current Is and the assist current Ia.

Figure 86:
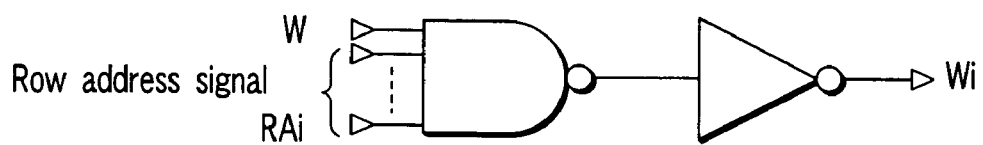
FIG. 86 is a view showing an example of a decoder generating Wi.

FIG. 86 shows an example of the decoder which generates the control signal Wi.

In this case, the decoder is one which used for the N-channel type spin-injection FET. The decoder includes an AND gate circuit. The control signal Wi becomes "H" when an active signal W and a row address signal RAi are all set in "H".

Figure 87:
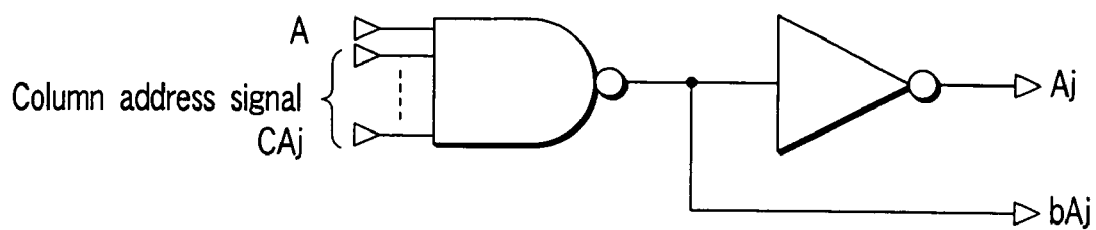
FIG. 87 is a view showing an example of the decoder generating Aj and bAj.

FIG. 87 shows an example of the decoder which generates the control signals Aj and bAj.

In this case, the decoder includes the AND gate circuit. The control signal Aj becomes "H" and the control signal bAj becomes "L", when an active signal A and a column address signal CAj are all set in "H".

Figure 88:
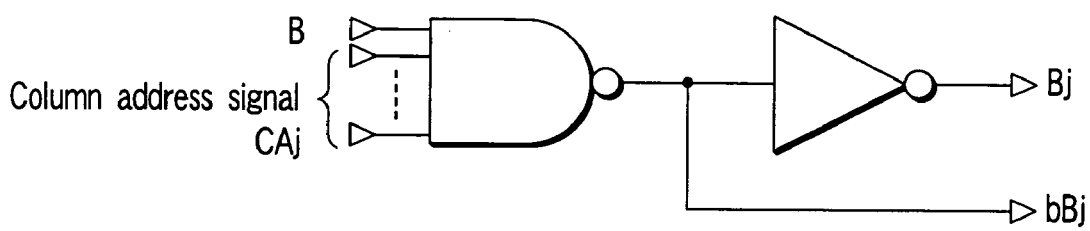
FIG. 88 is a view showing an example of the decoder generating Bj and bBj.

FIG. 88 shows an example of the decoder which generates the control signals Bj and bBj.

In this case, the decoder includes the AND gate circuit. The control signal Bj becomes "H" and the control signal bBj becomes "L", when an active signal B and the column address signal CAj are all set in "H".

Figure 89:
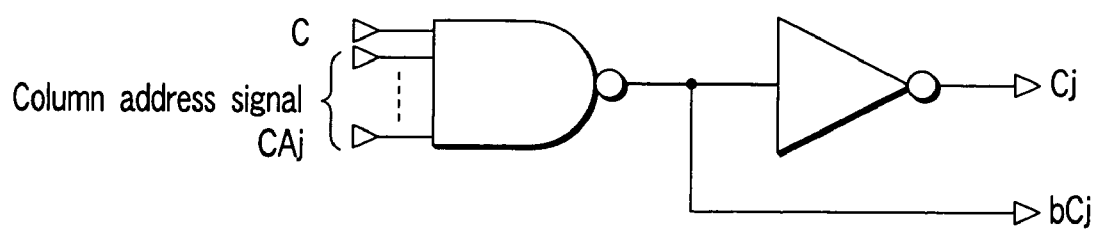
FIG. 89 is a view showing an example of the decoder generating Cj and bCj.

FIG. 89 shows an example of the decoder which generates the control signals Cj and bCj.

The decoder of FIG. 89 is applied to the spin-injection FET, in which the bit line though which the assist current is passed extends in the column direction.

The decoder includes the AND gate circuit. The control signal Cj becomes "H" and the control signal bCj becomes "L", when an active signal C and the column address signal CAj are all set in "H".

Figure 90:
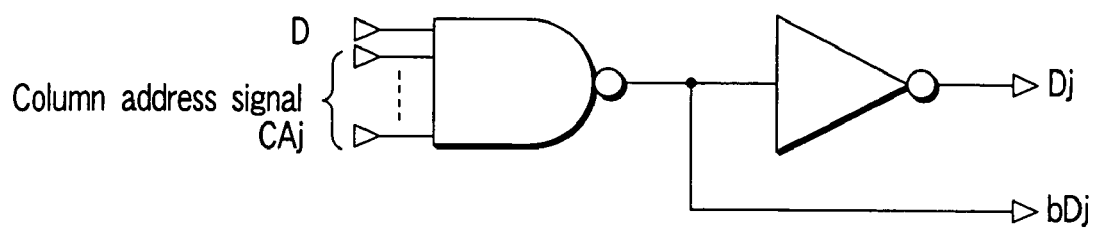
FIG. 90 is a view showing an example of the decoder generating Dj and bDj.

FIG. 90 shows an example of the decoder which generates the control signals Dj and bDj.

The decoder of FIG. 90 is applied to the spin-injection FET, in which the bit line though which the assist current is passed extends in the column direction.

The decoder includes the AND gate circuit. The control signal Dj becomes "H" and the control signal bDj becomes "L", when an active signal D and the column address signal CAj are all set in "H".

Figure 91:
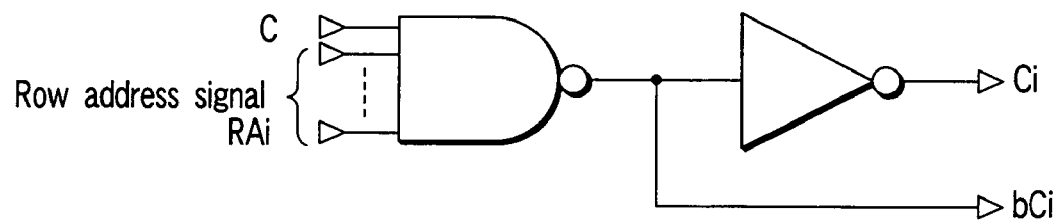
FIG. 91 is a view showing an example of the decoder generating Ci and bCi.

FIG. 91 shows an example of the decoder which generates the control signals Ci and bCi.

The decoder of FIG. 91 is applied to the spin-injection FET, in which the bit line though which the assist current is passed extends in the row direction.

The decoder includes the AND gate circuit. The control signal Ci becomes "H" and the control signal bCi becomes "L", when the active signal C and a row address signal RAi are all set in "H".

Figure 92:
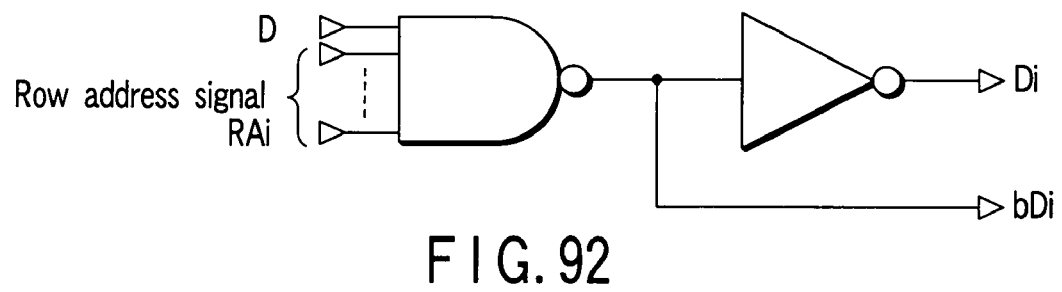
FIG. 92 is a view showing an example of the decoder generating Di and bDi.
Figure 93:
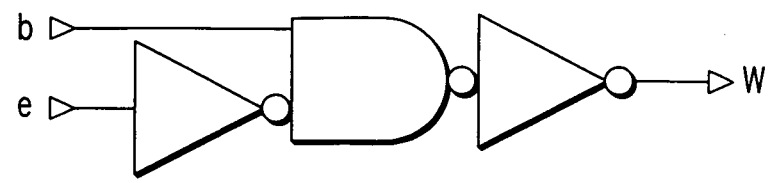
FIG. 93 is a view showing an example of a logic circuit generating W.
Figure 94:
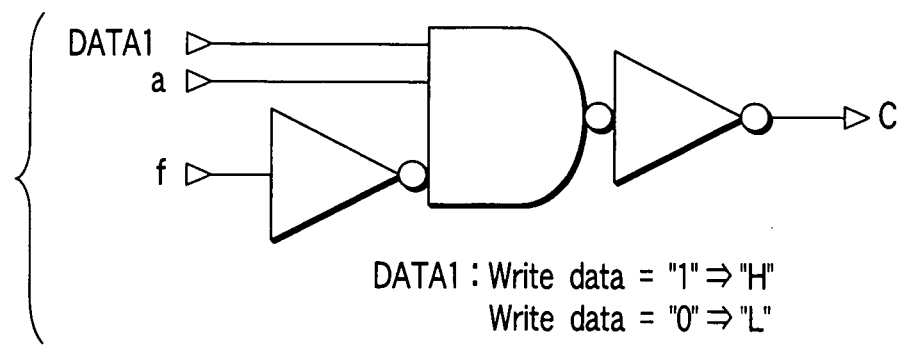
FIG. 94 is a view showing an example of the logic circuit generating C.
Figure 95:
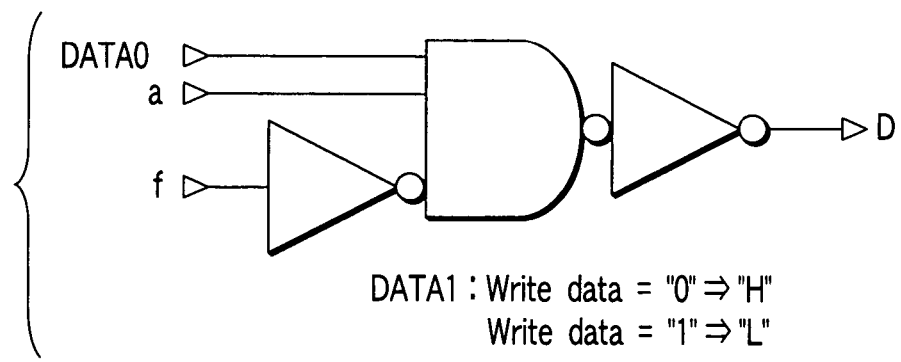
FIG. 95 is a view showing an example of the logic circuit generating D.
Figure 96:
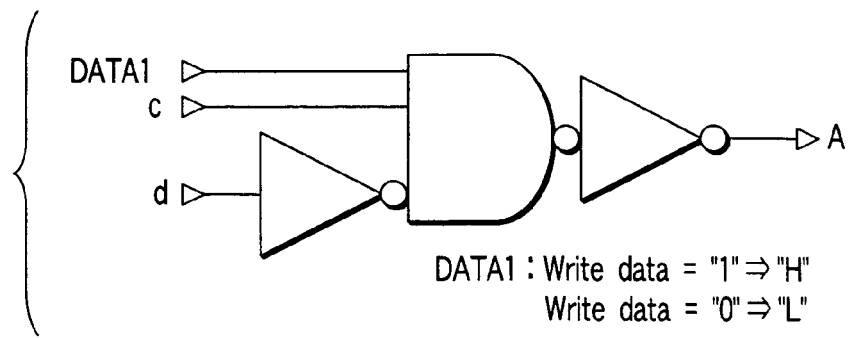
FIG. 96 is a view showing an example of the logic circuit generating A.
Figure 97:
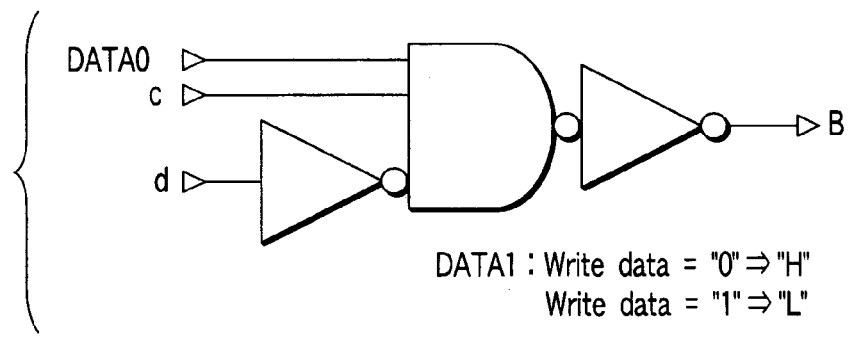
FIG. 97 is a view showing an example of the logic circuit generating B.

FIG. 92 shows an example of the decoder which generates the control signals Di and bDi.

The decoder of FIG. 92 is applied to the spin-injection FET, in which the bit line though which the assist current is passed extends in the row direction.

The decoder includes the AND gate circuit. The control signal Di becomes "H" and the control signal bDi becomes "L", when the active signal D and the row address signal RAi are all set in "H".

FIGS. 93 to 97 show examples of the decoders which generate the active signals W, A, B, C, and D.

The timing at which the active signals W, A, B, C, and D become "H" or "L" is determined by the value of program data DATA0 or DATA1.

In FIGS. 94 to 97, DATA1 is the signal which becomes "H" when the writing data is "1" and DATA0 is the signal which becomes "H" when the writing data is "0".

Figure 98:
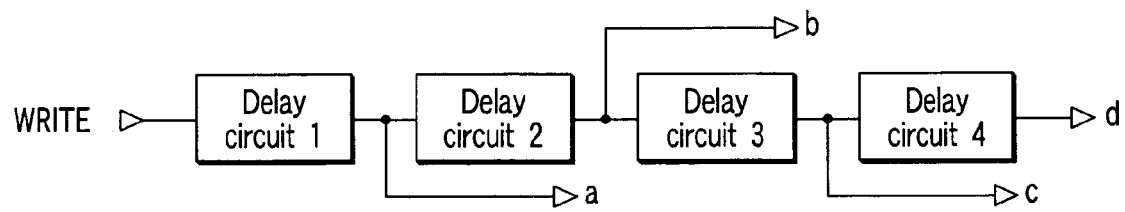
FIG. 98 is a view showing an example of a delay circuit.
Figure 99:
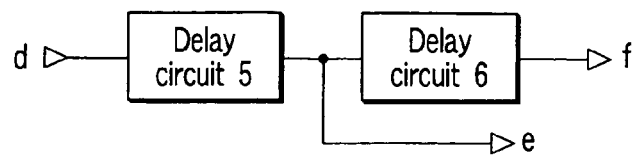
FIG. 99 is a view showing an example of the delay circuit.

FIGS. 98 and 99 show delay circuits 1 to 6 which generate control signals a, b, c, d, e, and f based on a write signal WRITE.

Figure 100:
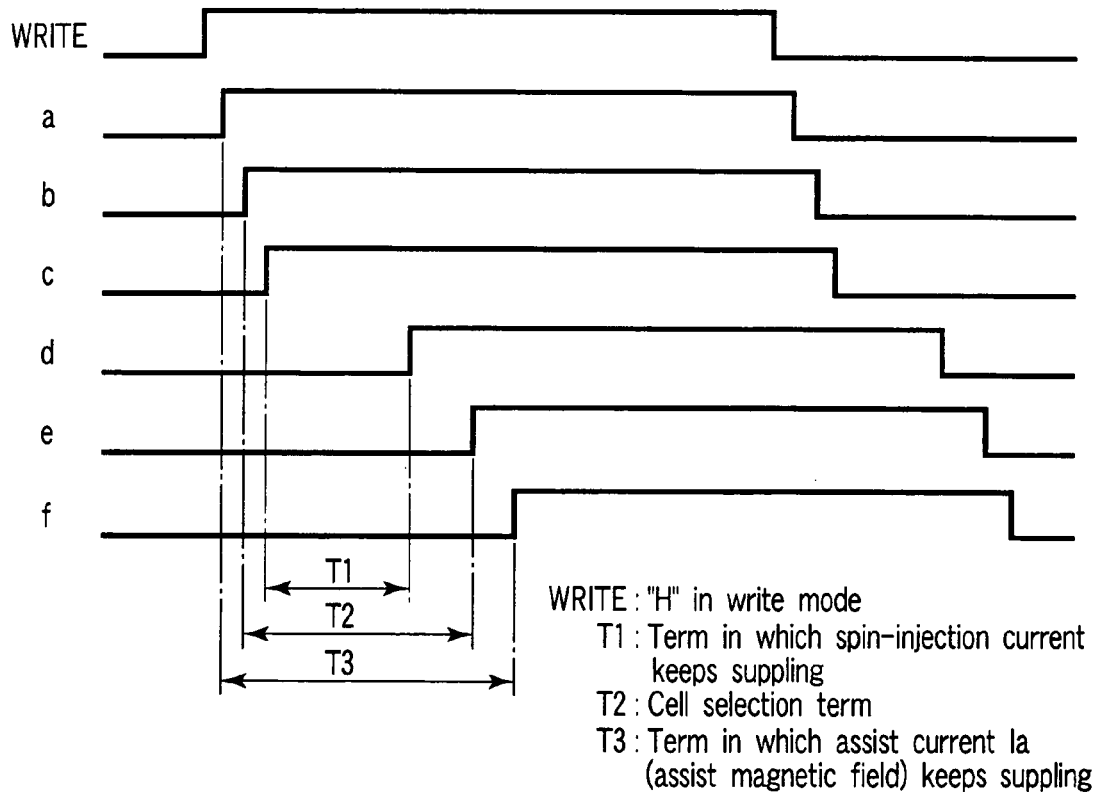
FIG. 100 is a view showing the signal waveform in writing.

When the delay circuits 1 to 6 are used, the waveforms of the control signals a, b, c, d, e, and f are shown in FIG. 100.

In this case, a cell selection period becomes T2, a supply period of the assist current Ia (assist magnetic field) becomes T3, and a supply period of the spin-injection current Is becomes T1 (T3>T2>T>1).

In the embodiments, the timing of the passage of the assist current Ia is set before the passage of the spin-injection current Is. However, the timing of the passage of the assist current Ia may be set at the same time of the passage of the spin-injection current Is or after the passage of the spin-injection current Is.

FIGS. 101 and 102 show examples of the delay circuits 1 to 6.

The example of FIG. 101 is an inverter type in which the delay circuit is formed by the plural inverters connected in series. The delay time can be controlled by the number of inverters. The example of FIG. 102 is an RC type in which the delay circuit is formed by a resistor R and a capacitance C. The delay time can be controlled by a resistance value of the resistor R and a capacitance value of the capacitance C.

9. Other Modifications

Other modifications of the spin-injection FET according to the embodiments of the invention will be described below.

The materials such as Fe—Mn, Pt—Mn, Pt—Cr—Mn, Ni—Mn, Ir—Mn, NiO, and $Fe_2O_3$ can be used as the anti-ferromagnetic body which fixes the magnetization direction of the pinned layer constituting the spin-injection FET.

When the pinned layer has the SAF structure, the plural ferromagnetic bodies constituting the pinned layer are made of the material having the uniaxial anisotropy. When the free layer has the SAF structure, the plural ferromagnetic bodies constituting the free layer are made of the material having the uniaxial anisotropy.

When the ferromagnetic body which becomes the free layer is formed by at least the structure having ferromagnetic layer/non-magnetic layer/ferromagnetic layer/anti-ferromagnetic layer to adopt the so-called double pin structure, the non-magnetic layer is made of at least one metal selected, for example, from the group of Cu, Ag, Au, Zr, Hf, Rh, Pt, Ir, and Al or the alloy including at least one metal thereof. At this point, the magnetization directions of the two pinned layers are mutually directed to the opposite directions.

In this case, the non-magnetic layer may be made of at least one metal selected from the group of Ru, Cr, Mn, V, and Ir or the alloy including at least one metal thereof. At this point, the magnetization directions of the two pinned layers are directed to the same direction.

The thickness of the ferromagnetic body constituting the pinned layer and free layer is set in the range of 0.1 nm to 100 nm. Preferably the thickness of the ferromagnetic body is not lower than 0.4 nm in order to ensure that the ferromagnetic body is not changed to the superparamagnetic body.

In order to perform the magnetization reversal with the spin-injection current as small as possible, the free layer constituting the spin-injection FET may be formed by plural columnar layers (ferromagnetic particles) which are separated from one another in the perpendicular direction (spin-injection current passing direction) by dielectric materials.

In this case, the plural columnar layers are made of Co, Fe, Ni, or the alloy thereof or at least one metal selected from the group of Co—Pt, Co—Fe—Pt, Fe—Pt, Co—Fe—Cr—Pt, and Co—Cr—Pt.

In the free layer constituting the spin-injection FET, physical properties such as the magnetic properties, the crystallinity, the mechanical properties, and the chemical properties may be adjusted by adding the non-magnetic elements such as Ag, Cu, Au, Al, Ru, Os, Re, Ta, B, C, O, N, Pd, Pt, Zr, Ir, W, Mo, and Nb into the ferromagnetic body.

10. Experimental Example

Experimental examples will be described below.

(1) First Experimental Example

A first experimental example is obtained from the spin-injection FET having the structure FIGS. 48 to 51.

A sample 1 corresponds to the Schottky barrier type spin-injection FET of FIGS. 49 and 51, and the sample 1 is produced by the second example of the above production method.

The pinned layer is made of $(Co_{70}Fe_{30})_{80}B_{20}$. The structure made of $Ru(0.95)/Co_{70}Fe_{30}/PtMn/Ta$ is coupled to the pinned layer, and the conductive polysilicon is formed on the structure. The free layer is made of $(Co_{70}Fe_{30})_{80}B_{20}$. The structure made of $Cu(5)/Co_{70}Fe_{30}/PtMn/Ta$ is coupled to the free layer, and the conductive polysilicon is formed on the structure.

In order to perform inspection of the sample 1, after the plural spin-injection FETs are formed, the spin-injection FETs are coated with the insulating layers, and further contact holes reaching the pinned layer and free layer are formed in the insulating layers, and aluminum wiring which is of a measuring electrode is formed in the contact hole.

A sample 2 corresponds to the tunnel barrier type spin-injection FET of FIGS. 48 and 50, and the sample 2 is produced by the third example of the above production method.

The pinned layer is made of $(Co_{70}Fe_{30})_{80}B_{20}$. The structure made of $Ru(0.95)/Co_{70}Fe_{30}/PtMn/Ta$ is coupled to the pinned layer, and the conductive polysilicon is formed on the structure. The free layer is made of $(Co_{70}Fe_{30})_{80}B_{20}$. The structure made of $Au(5)/Co_{70}Fe_{30}/PtMn/Ta$ is coupled to the free layer, and the conductive polysilicon is formed on the structure.

In order to perform the inspection of the sample 2, after the plural spin-injection FETs are formed, the spin-injection FETs are coated with the insulating layers, contact holes reaching the pinned layer and free layer are made in the insulating layers, and aluminum wiring which is of a measuring electrode is formed in the contact hole.

The writing word lines are formed on the samples 1 and 2 respectively.

When dependence of the plural spin-injection FETs on the magnetic field is measured for the samples 1 and 2, the good results are obtained in all the spin-injection FETs.

Figure 63:
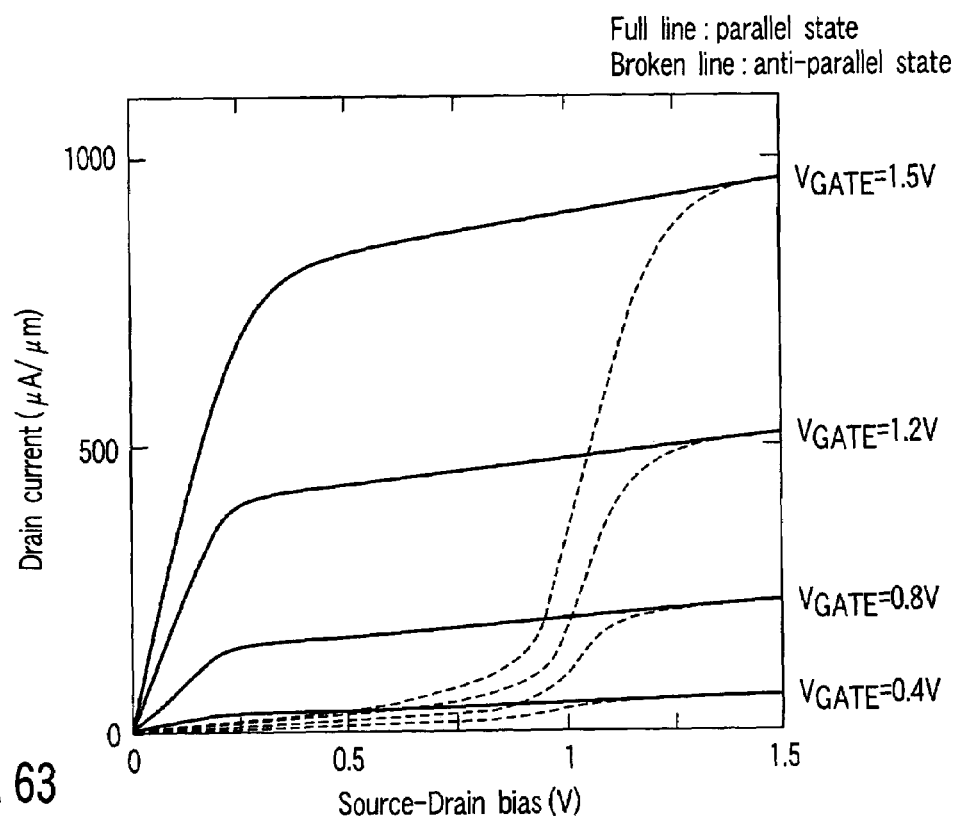
FIG. 63 is a view showing characteristics of a sample obtained by the second example of the producing method.
Figure 66:
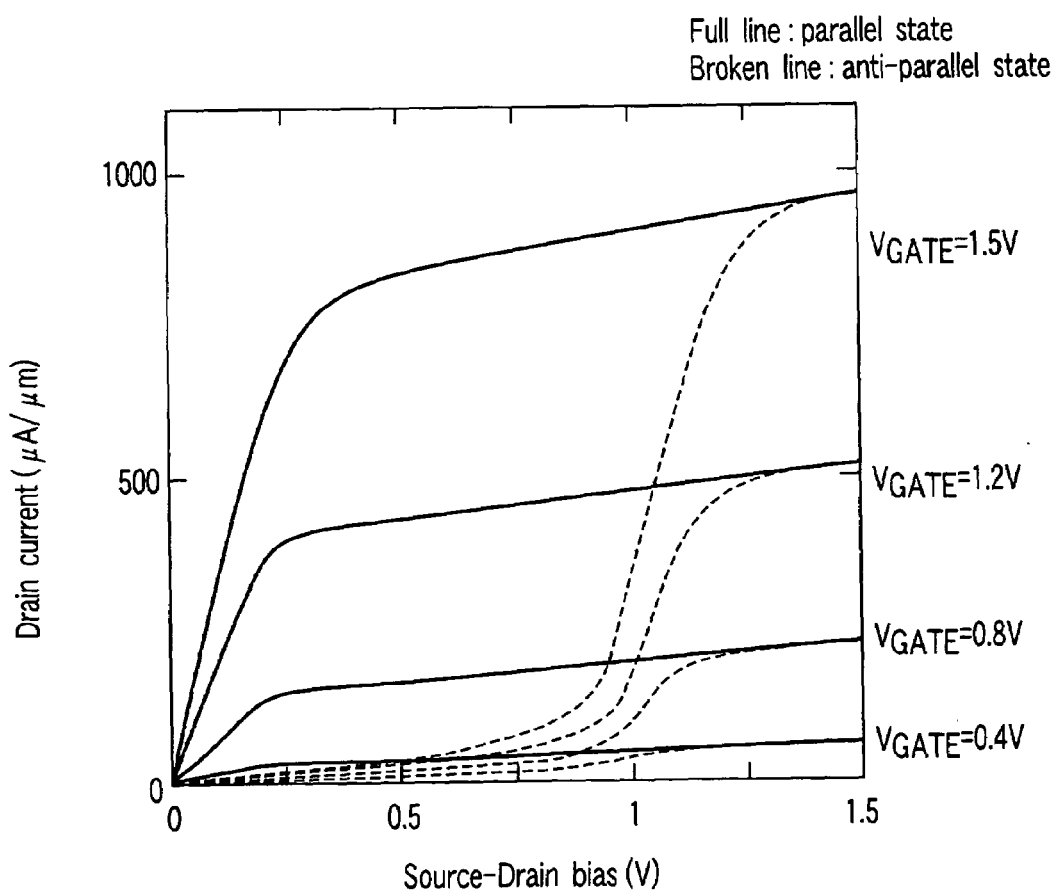
FIG. 66 is a view showing characteristics of a sample obtained by the third example of the producing method.

FIG. 63 shows the spin-injection FET characteristics concerning the sample 1, and FIG. 66 shows the spin-injection FET characteristics concerning the sample 2.

These characteristic views indicate dependence of the drain current of the spin-injection FET on the voltage between the source and the drain.

As can be seen from FIGS. 63 and 66, both in the samples 1 and 2, the drain current is changed with a sufficient margin according to the magnetization state (parallel/anti-parallel) of the spin-injection FET. The amplification action in which the drain current is increased as the gate voltage Vgate of the spin-injection FET is increased is also confirmed.

Thus, it is found that the spin-injection FET according to the embodiment of the invention can sufficiently be applied to the novel devices such as the re-configurable logic circuit and the magnetic random access memory.

FIG. 103 shows the thermal disturbance with respect to the sample 1, and FIG. 104 shows the thermal disturbance with respect to the sample 2.

When these results are obtained, in order to make clear the difference in effect the prior art (FIG. 7) and the invention, the same conditions as the prior art are substantially adopted.

That is, the gate voltage is set at constant (1.5V), and the writing is performed by passing the spin-injection current having the pulse width of 50 ns through the spin-injection FET. The assist current is set at 0.8 mA, and the delay time from the cutoff of the spin-injection current to the cutoff of the assist current is set at 20 ns.

When the source-drain pulse voltage is positive, the magnetization state of the spin-injection FET becomes the parallel. When the source-drain pulse voltage is negative, the magnetization state of the spin-injection FET becomes the anti-parallel. In both the cases, the fluctuation in spin-injection current necessary to the switching (magnetization reversal) is very small.

The drain current of the spin-injection FET is measured when the gate voltage $V_{gate}$ is set at 1.0V.

When the magnetization of the spin-injection FET is in the parallel state, the drain current becomes the large value of above 200 $\mu A/\mu m^2$. When the magnetization of the spin-injection FET is in the anti-parallel state, the drain current becomes the small value of below 50 $\mu A/\mu m^2$. In both the cases, the fluctuation in drain current, caused by the thermal disturbance in the writing, is very small.

Thus, according to the first experimental example, it is confirmed that the spin-injection FET according to the embodiments of the invention is very effective for the countermeasure against the thermal disturbance problem in the writing.

These results are independent of the timing of the assist magnetic field generation, i.e., the timing of the assist magnetic field generation is independent of the timing of the spin-injection current passage.

(2) Second Experimental Example

A second experimental example is obtained from the spin-injection FET having the structure FIGS. 52 to 55.

Figure 53:
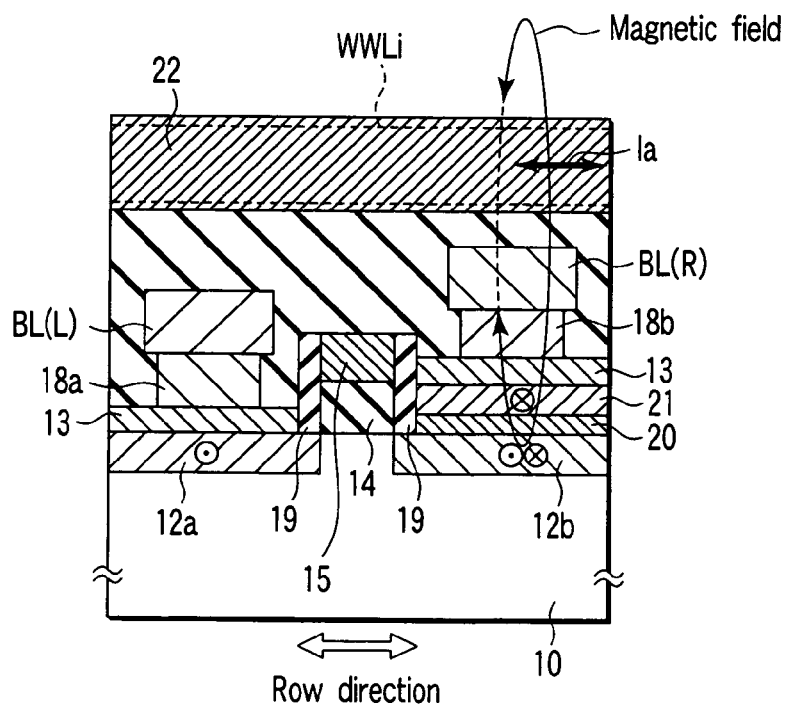
FIG. 53 is a view showing the spin-injection FET according to the twelfth embodiment.
Figure 55:
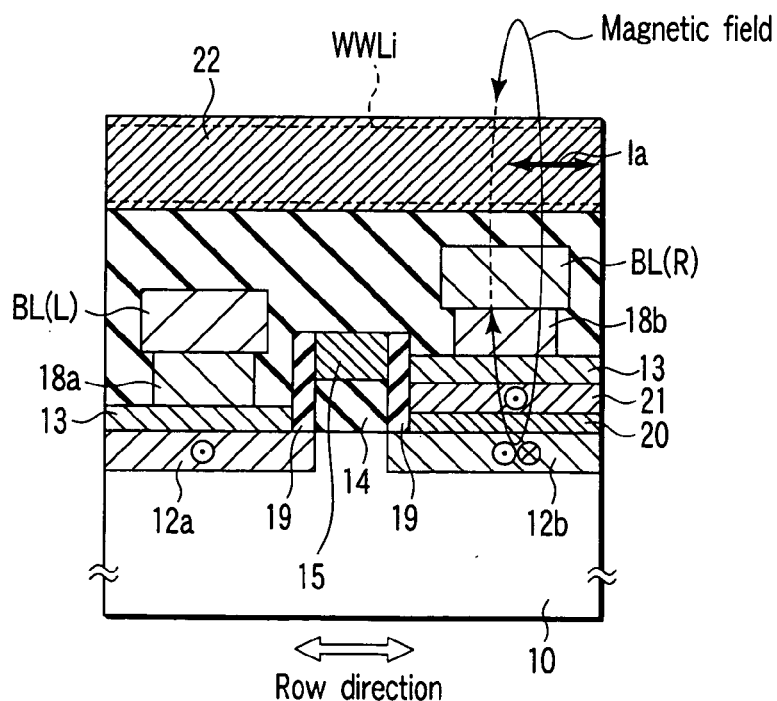
FIG. 55 is a view showing the spin-injection FET according to the twelfth embodiment.

A sample 1 corresponds to the Schottky barrier type spin-injection FET of FIGS. 53 and 55, and the sample 1 is produced by the second example of the above production method.

The pinned layer is made of $(Co_{70}Fe_{30})_{80}B_{20}$. The structure made of $Ru(0.95)/Co_{70}Fe_{30}/PtMn/Ta$ is coupled to the pinned layer, and the conductive polysilicon is formed on the structure. The free layer is made of $(Co_{70}Fe_{30})_{80}B_{20}$. The structure made of $Ru(5)/Co_{70}Fe_{30}/PtMn/Ta$ is coupled to the free layer, and the conductive polysilicon is formed on the structure.

In order to perform the inspection of the sample 1, after the plural spin-injection FETs are formed, the spin-injection FETs are coated with the insulating layers, contact holes reaching the pinned layer and free layer are made respectively in the insulating layers, and aluminum wiring which is of a measuring electrode is formed in the contact hole.

Figure 52:
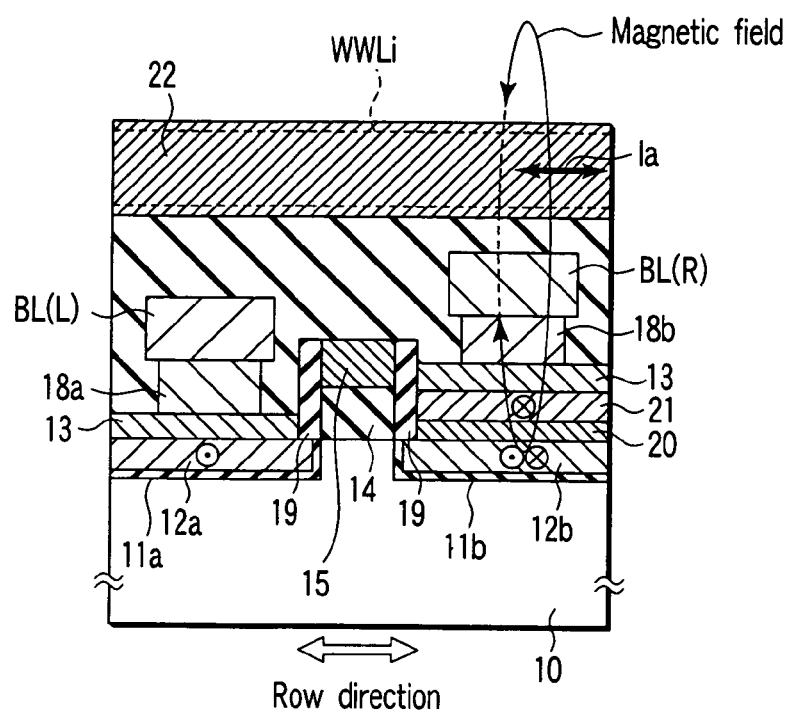
FIG. 52 is a view showing the spin-injection FET according to the twelfth embodiment.
Figure 54:
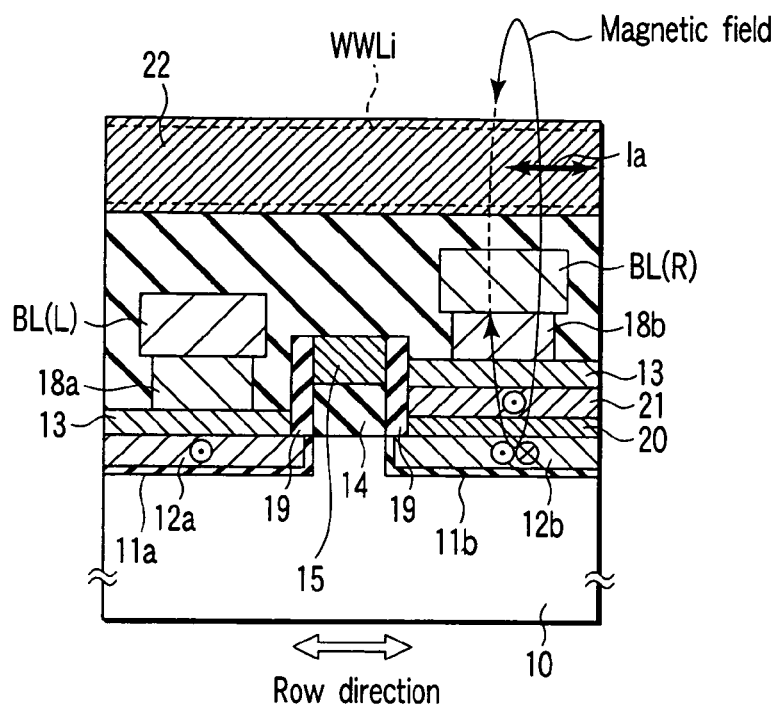
FIG. 54 is a view showing the spin-injection FET according to the twelfth embodiment.

A sample 2 corresponds to the tunnel barrier type spin-injection FET of FIGS. 52 and 54, and the sample 2 is produced by the third example of the above production method.

The pinned layer is made of $(Co_{70}Fe_{30})_{80}B_{20}$. The structure made of $Ru(0.95)/Co_{70}Fe_{30}/PtMn/Ta$ is coupled to the pinned layer, and the conductive polysilicon is formed on the structure. The free layer is made of $(Co_{70}Fe_{30})_{80}B_{20}$. The structure made of $Ru(5)/Co_{70}Fe_{30}/PtMn/Ta$ is coupled to the free layer, and the conductive polysilicon is formed on the structure.

In order to perform the inspection of the sample 2, after the plural spin-injection FETs are formed, the spin-injection FETs are coated with the insulating layers, contact holes reaching the pinned layer and free layer are made in the insulating layers, and aluminum wiring which is of a measuring electrode is formed in the contact hole.

The writing word lines are formed on the samples 1 and 2 respectively. The writing word line is coated with the soft magnetic material (yoke material).

When dependence of the plural spin-injection FETs on the magnetic field is measured for the samples 1 and 2, as shown in FIGS. 63 and 66, as with the first experimental example, the good results are obtained in all the spin-injection FETs.

FIG. 105 shows the thermal disturbance with respect to the sample 1, and FIG. 106 shows the thermal disturbance with respect to the sample 2.

When these results are obtained, in order to make clear the difference in effects between the prior art (FIG. 7) and the invention, the same conditions as the prior art are substantially adopted.

That is, the gate voltage is set at constant (1.5V), and the writing is performed by passing the spin-injection current having the pulse width of 50 ns through the spin-injection FET. The assist current is set at 0.4 mA, and the delay time from the cutoff of the spin-injection current to the cutoff of the assist current is set at 20 ns.

In the samples 1 and 2, since writing word line has the yoke wiring structure, the assist current is lower than that of the first experimental example.

When the source-drain pulse voltage is positive, the magnetization state of the spin-injection FET becomes in parallel. When the source-drain pulse voltage is negative, the magnetization state of the spin-injection FET becomes the anti-parallel. In both the cases, the fluctuation in spin-injection current necessary to the switching (magnetization reversal) is very small.

The drain current of the spin-injection FET is measured when the gate voltage $V_{gate}$ is set at 1.0V.

When the magnetization of the spin-injection FET is in the parallel state, the drain current becomes the large value of above 200 mA/μm$^2$. When the magnetization of the spin-injection FET is in the anti-parallel state, the drain current becomes the small value of below 50 mA/μm$^2$. In both the cases, the fluctuation in drain current, caused by the thermal disturbance in the writing, is very small.

Thus, according to the second experimental example, it is also confirmed that the spin-injection FET according to the embodiments of the invention is very effective for the countermeasure against the thermal disturbance problem in the writing.

These results are independent of the timing of the assist magnetic field generation, i.e., the timing of the assist magnetic field generation is independent of the timing of the spin-injection current passage.

11. Other

The embodiments of the invention can provide the spin-injection FET, in which the thermal stability is excellent and the element breakage problem is solved.

What is claimed is:

1. A spin-injection field effect transistor comprising:
   a first ferromagnetic body whose magnetization direction is fixed;
   a second ferromagnetic body whose magnetization direction is changed by spin-injection current;
   a channel which is located between the first and second ferromagnetic bodies;
   a gate insulating layer which is formed on the channel;
   a gate electrode which is formed on the gate insulating layer; and
   a first driver/sinker which controls a direction of the spin-injection current to determine the magnetization direction of the second ferromagnetic body, the spin-injection current being passed through the channel.

2. The spin-injection field effect transistor according to claim 1, further comprising:
   a conductive line through which assist current is passed, the assist current generating a magnetic field in a magnetization easy axis direction of the second ferromagnetic body; and
   a second driver/sinker which controls the direction of the assist current passed through the conductive line.

3. The spin-injection field effect transistor according to claim 2, wherein the passage of the assist current is continued at least for a period after the spin-injection current is cut off.

4. The spin-injection field effect transistor according to claim 2, wherein a path of the spin-injection current and a path of the assist current overlap each other.

5. The spin-injection field effect transistor according to claim 2, wherein a path of the spin-injection current and a path of the assist current are separated from each other.

6. The spin-injection field effect transistor according to claim 1, further comprising a tunnel barrier layer which is formed by at least one of a section between the first ferromagnetic body and the channel and a section between the second ferromagnetic body and the channel.

7. The spin-injection field effect transistor according to claim 6, wherein the tunnel barrier layer is made of an oxide or nitride of one element selected from a group of Si, Ge, Al, Ga, Mg, Ti, and Ta.

8. The spin-injection field effect transistor according to claim 1, wherein the first and second ferromagnetic bodies are formed in recesses of a semiconductor substrate and the channel is formed in a surface area of the semiconductor substrate.

9. The spin-injection field effect transistor according to claim 8, wherein the semiconductor substrate is made of one material selected from a group of an intrinsic semiconductor, a compound semiconductor, and a conductive semiconductor in which an impurity is doped in the intrinsic semiconductor or the compound semiconductor.

10. The spin-injection field effect transistor according to claim 1, wherein the first and second ferromagnetic bodies are formed in recesses in a semiconductor layer on an insulating layer and the channel is formed in a surface area of the semiconductor layer.

11. The spin-injection field effect transistor according to claim 1, wherein the first ferromagnetic body has an SAF structure including a first ferromagnetic layer, a non-magnetic layer, a second ferromagnetic layer and an anti-ferromagnetic interaction exists between the first and second ferromagnetic layers.

12. The spin-injection field effect transistor according to claim 1, wherein the second ferromagnetic body is formed by a first ferromagnetic layer, the first ferromagnetic layer is coupled to a structure formed by a non-magnetic layer, a second ferromagnetic layer and an anti-ferromagnetic layer, and the non-magnetic layer is made of at least one metal selected from a group of Cu, Ag, Au, Zr, Hf, Rh, Pt, Ir, and Al or an alloy including at least one metal thereof, and the magnetization direction of the first ferromagnetic body and the magnetization direction of the second ferromagnetic body are mutually directed in opposite directions.

13. The spin-injection field effect transistor according to claim 1, wherein the second ferromagnetic body is formed by a first ferromagnetic layer, the second ferromagnetic body is coupled to a structure formed by a non-magnetic layer, a second ferromagnetic layer and an anti-ferromagnetic layer, and the non-magnetic layer is made of at least one metal selected from a group of Ru, Cr, Mn, V, and Ir or an alloy including at least one metal thereof, and the magnetization direction of the first ferromagnetic body and the magnetization direction of the second ferromagnetic body are directed in the same direction.

14. The spin-injection field effect transistor according to claim 1, further comprising a soft magnetic material with which a surface of a conductive line is covered.

15. A spin-injection field effect transistor comprising:
   first and second source/drain diffusion layers;
   a first ferromagnetic body which is formed on the first source/drain diffusion layer, a magnetization direction of the first ferromagnetic body being fixed;
   a second ferromagnetic body which is formed on the second source/drain diffusion layer, the magnetization direction of the second ferromagnetic body being changed by spin-injection current;

a channel which is located between the first and second source/drain diffusion layers;

a gate electrode which is formed on the channel through a gate insulating layer; and a first driver/sinker which controls a direction of the spin-injection current to determine the magnetization direction of the second ferromagnetic body, the spin-injection current being passed through the channel.

16. The spin-injection field effect transistor according to claim 15, further comprising:

a conductive line through which assist current is passed, the assist current generating a magnetic field in a magnetization easy axis direction of the second ferromagnetic body; and a second driver/sinker which controls the direction of the assist current passed through the conductive line.

17. The spin-injection field effect transistor according to claim 16, wherein the passage of the assist current is continued at least for a period after the spin-injection current is cut off.

18. A magnetic random access memory comprising:

spin-injection field effect transistors arranged in a matrix shape, each having:

a first ferromagnetic body whose magnetization direction is fixed;

a second ferromagnetic body whose magnetization direction is changed by spin-injection current, data corresponding to the magnetization direction being stored in the second ferromagnetic body;

a channel which is located between the first and second ferromagnetic bodies;

a gate insulating layer which is formed on the channel;

a gate electrode which is formed on the gate insulating layer;

a first driver/sinker which controls a direction of the spin-injection current to determine the magnetization direction of the second ferromagnetic body, the spin-injection current being passed through the channel;

a conductive line through which assist current is passed, the assist current generating a magnetic field in a magnetization easy axis direction of the second ferromagnetic body; and a second driver/sinker which controls the direction of the assist current passed through the conductive line, wherein the data is read by utilizing magnetoresistive effect.

19. A re-configurable logic circuit comprising:

first and second transistors connected in series, the first transistor having:

a first ferromagnetic body whose magnetization direction is fixed;

a second ferromagnetic body whose magnetization direction is changed by spin-injection current;

a first channel which is located between the first and second ferromagnetic bodies;

a first gate insulating layer which is formed on the first channel;

a first gate electrode which is formed on the first gate insulating layer;

a first driver/sinker which controls a direction of the spin-injection current to determine the magnetization direction of the second ferromagnetic body, the spin-injection current being passed through the first channel;

a conductive line through which assist current is passed, the assist current generating a magnetic field in a magnetization easy axis direction of the second ferromagnetic body; and a second driver/sinker which controls the direction of the assist current passed through the conductive line, wherein logic is determined depending on a magnetization state of the first transistor.

20. The re-configurable logic circuit according to claim 19, wherein the second transistor is a MIS transistor.

21. The re-configurable logic circuit according to claim 19, wherein the second transistor is a spin-injection FET, the spin-injection FET comprising:

a third ferromagnetic body whose magnetization direction is fixed;

a fourth ferromagnetic body whose magnetization direction is changed by spin-injection current;

a second channel which is located between the third and fourth ferromagnetic bodies;

a second gate insulating layer which is formed on the second channel;

a second gate electrode which is formed on the second gate insulating layer; and a third driver/sinker which controls an orientation of the spin-injection current to determine the magnetization direction of the fourth ferromagnetic body, the spin-injection current being passed through the second channel.

22. The re-configurable logic circuit according to claim 19, wherein the first and second transistors have a common floating gate.

* * * * *